United States Patent
Oguma et al.

(10) Patent No.: US 7,208,567 B2
(45) Date of Patent: Apr. 24, 2007

(54) POLYMER COMPOUND AND POLYMER LIGHT EMITTING DEVICE USING THE SAME

(75) Inventors: Jun Oguma, Abiko (JP); Takahiro Ueoka, Tsukuba (JP); Yoshiaki Tsubata, Tsukuba (JP); Makoto Kitano, Tsukuba (JP); Chizu Sekine, Tsukkuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 10/386,710

(22) Filed: Mar. 13, 2003

(65) Prior Publication Data

US 2004/0002576 A1 Jan. 1, 2004

(30) Foreign Application Priority Data

| Mar. 15, 2002 | (JP) | ............................. | 2002-071629 |
| Apr. 17, 2002 | (JP) | ............................. | 2002-114649 |
| Jun. 5, 2002  | (JP) | ............................. | 2002-164077 |

(51) Int. Cl.
   *C08G 75/24* (2006.01)
   *C08G 73/56* (2006.01)
   *C08G 65/34* (2006.01)

(52) U.S. Cl. .................. 528/373; 528/391; 528/397; 528/423; 528/425; 528/486; 428/690; 428/917

(58) Field of Classification Search ............... 528/373, 528/391, 397, 423, 425, 486; 428/690, 917
See application file for complete search history.

(56) References Cited

U.S. PATENT DOCUMENTS

| 4,925,589 | A | * | 5/1990  | Lorenz       |           |
| 5,876,864 | A |   | 3/1999  | Kim et al.   |           |
| 6,090,909 | A | * | 7/2000  | Kato et al. .................. | 528/353 |
| 6,110,646 | A | * | 8/2000  | Urano et al. ................ | 430/302 |
| 6,316,591 | B1 |  | 11/2001 | Kreuder et al. |         |

FOREIGN PATENT DOCUMENTS

| JP | 2002-284682 A | 10/2002 |
| JP | 1334956 | * | 8/2003 |
| JP | 1344788 | * | 9/2003 |
| JP | 1394188 | * | 3/2004 |
| WO | WO 98/21262 A1 | 5/1998 |
| WO | WO 02/26856 A1 | 4/2002 |

OTHER PUBLICATIONS

O. Shimomura et al., "S–Alkyldibenzothiophenium Salts as New Thermal Latent Cationic Intitiators", *Macromoleules*, pages 1–4, XP002245115.

V. Wirth et al., "Synthese und Eigenschaften von Oxydo–p–oligophenylenen", *Die Makromolekulare Chemie*, vol. 86, 1965, pp. 139–167, XP009012341.

H. Sirringhuas et al., "Dibenzothienobisbenzothiophene–a novel fused–ring oligomer with high field–effect mobility", *J. Mater. Chem.*, vol. 9, 1999, pp. 2095–2101, XP–002244281.

* cited by examiner

*Primary Examiner*—Duc Truong
(74) *Attorney, Agent, or Firm*—Sughrue Mion, PLLC

(57) ABSTRACT

Provided is a polymer compound having a polystyrene reduced number average molecular weight of $10^3$–$10^8$, and comprising a repeating unit represented by the below formula (1-1) or (1-2),

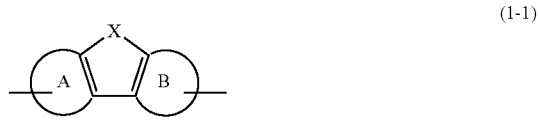

(1-1)

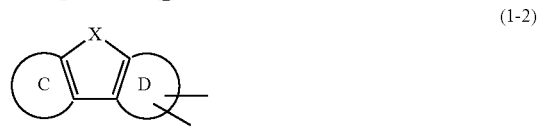

(1-2)

wherein Ring A, Ring B, Ring C, or Ring D each independently represent an aromatic ring, and X represents S or O. The compound is usable as a light-emitting material, a charge transporting material, etc.

57 Claims, No Drawings

POLYMER COMPOUND AND POLYMER LIGHT EMITTING DEVICE USING THE SAME

BACKGROUND OF THE INVENTION

1. Field of the Invention

The present invention relates to a polymer compound and a process for producing the same. Specifically, the invention relates to a polymer compound which is expectable as a material for a polymer light emitting device (hereinafter may be referred to as polymer LED), and a process for producing the same.

2. Description of the Related Art

Unlike low molecular weight it, a high molecular weight light-emitting material (herein, light-emitting material represents a material having fluorescence and phosphorescence) and a high molecular weight charge transporting material are soluble in a solvent, and are variously studied from the ability of the organic layer in a light-emitting device to be formed by the application method. As a polymer compound which can be used for electronic devices, such as polymer LED, as a light-emitting material or a charge transporting material, polyphenylene vinylene derivatives, poly fluorene derivatives, polyphenylene derivatives, polythiophene derivatives, etc. are known.

The object of the present invention is to provide a new polymer compound usable for a light-emitting material, a charge transporting material, etc., a process for producing thereof, and a polymer light-emitting device using said polymer compound.

SUMMARY OF THE INVENTION

As a result of extensive studies in order to solve the above problems, the present inventors found that a polymer compound having a polystyrene reduced number average molecular weight of $10^3$–$10^8$, and comprising a repeating unit represented by the below formula (1-1) or (1-2),

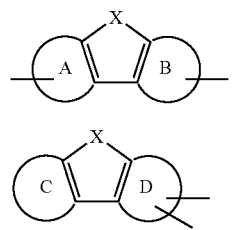

(1-1)

(1-2)

is usable as a light-emitting material, a charge transporting material, etc. and completed the present invention.

The polymer compound of the present invention comprises one or more kinds of repeating unit represented by the above formula (1-1) or (1-2).

In the above formula (1-1) or (1-2), Ring A, Ring B, Ring C, or Ring D each independently represent an aromatic ring. X represents S or O.

DETAILED DESCRIPTION OF THE INVENTION

As the aromatic ring, exemplified are: aromatic hydrocarbon rings such as a benzene ring, naphthalene ring, anthracene ring, tetracene ring, pentacene ring, pyrene ring, and phenanthrene ring, etc.; and heterocyclic aromatic rings such as a pyridine ring, bipyridine ring, phenanthroline ring, quinoline ring, isoquinoline ring, thiophene ring, furan ring, pyrrole ring, etc.

The repeating unit containing structure represented by the above formula (1-1) or (1-2), may have a substituent selected from the group consisting of an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imino group, amide group, imide group, monovalent heterocyclic group, carboxyl group, substituted carboxyl group, and cyano group. Moreover, when the substituent exists in plural, a plurality of them may be the same of different.

Here, the alkyl group may be any of linear, branched or cyclic, and usually has about 1 to 20 carbon atoms, preferably 3 to 20, and specific examples thereof include methyl group, ethyl group, propyl group, i-propyl group, butyl, i-butyl, t-butyl, pentyl group, hexyl group, cyclohexyl group, heptyl group, octyl group, 2-ethylhexyl group, nonyl group, decyl group, 3,7-dimethyloctyl group, lauryl group, trifluoromethyl group, pentafluoroethyl group, perfluorobutyl, perfluorohexyl group, perfluorooctyl group, etc. Pentyl group, hexyl group, octyl group, 2-ethylhexyl group, decyl group, 3,7-dimethyloctyl group is preferable.

The alkoxy group may be any of linear, branched or cyclic, and usually has about 1 to 20 carbon atoms, preferably 3 to 20. Specific examples thereof include methoxy group, ethoxy group, propyloxy group, i-propyloxy group, butoxy group, i-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group, trifluoromethoxy group, pentafluoroethoxy group, perfluorobutoxy group, perfluorohexyl group, perfluorooctyl group, methoxymethyloxy group, 2-methoxyethyloxy group, etc. Pentyloxy group, hexyloxy group, octyloxy group, 2-ethylhexyloxy group, decyloxy group, 3,7-dimethyloctyloxy group is preferable.

The alkylthio group may be any of linear, branched or cyclic, and usually has about 1 to 20 carbon atoms, preferably 3 to 20. Specific examples thereof include methylthio group, ethylthio group, propylthio group, i-propylthio group, butylthio group, i-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group, trifluoromethylthio group, etc. Pentylthio group, hexylthio group, octylthio group, 2-ethylhexylthio group, decylthio group, 3,7-dimethyloctylthio group is preferable.

The aryl group usually has about 6 to 60 carbon atoms, preferably 7 to 48. Specific examples thereof include a phenyl group, $C_1$–$C_{12}$ alkoxyphenyl group ($C_1$–$C_{12}$ means the number of carbon atom is 1 to 12), $C_1$–$C_{12}$ alkylphenyl group, 1-naphthyl group, 2-naphthyl group, 1-anthracenyl group, 2-anthracenyl group, 9-anthracenyl group, pentafluorophenyl group, etc. $C_1$–$C_{12}$ alkoxyphenyl group, and $C_1$–$C_{12}$ alkylphenyl group are preferable. The aryl group is an atomic group in which a hydrogen atom is removed from an aromatic hydrocarbon. The aromatic hydrocarbon includes those containing a condensed ring, and those containing two or more of independent benzene rings or condensed rings bonded through a group such as a direct bond, a vinylene group or the like.

Specifically, examples of $C_1$–$C_{12}$ alkoxyphenyl include methoxyphenyl, ethoxyphenyl, propyloxyphenyl, i-propyloxyphenyl, butoxyphenyl, i-butoxyphenyl, t-butoxyphenyl, pentyloxyphenyl, hexyloxyphenyl, cyclohexyl oxyphenyl, heptyloxyphenyl, octyloxyphenyl, 2-ethylhexyloxyphenyl, nonyloxyphenyl, decyloxy, 3,7-dimethyloctyloxyphenyl, lauryloxyphenyl, etc.

Examples of $C_1$–$C_{12}$ alkylphenyl group include a methylphenyl group, ethylphenyl group, dimethylphenyl group, propylphenyl group, mesityl group, methylethylphenyl group, i-propylphenyl group, butylphenyl group, i-butylphenyl group, t-butylphenyl group, pentylphenyl group, isoamylphenyl group, hexylphenyl group, heptylphenyl group, octylphenyl group, nonylphenyl group, decylphenyl group, dodecylphenyl group, etc.

The aryloxy group usually has about 6 to 60 carbon atoms, preferably 7 to 48. Specific examples thereof include a phenoxy group, $C_1$–$C_{12}$ alkoxyphenoxy group, $C_1$–$C_{12}$ alkylphenoxy group, 1-naphtyloxy group, 2-naphtyloxy group, pentafluoro phenyloxy group, etc. $C_1$–$C_{12}$ alkoxyphenoxy group, and $C_1$–$C_{12}$ alkylphenoxy group are preferable. Specific examples of $C_1$–$C_{12}$ alkoxyphenoxy group include a methoxyphenoxy group, ethoxyphenoxy group, propyloxyphenoxy group, i-propyloxyphenoxy group, butoxyphenoxy group, i-butoxyphenoxy group, t-butoxyphenoxy group, pentyloxyphenoxy group, hexyloxyphenoxy group, cyclohexyloxyphenoxy group, heptyloxyphenoxy group, octyloxyphenoxy group, 2-ethylhexyloxyphenoxy group, nonyloxyphenoxy group, decyloxyphenoxy group, 3,7-dimethyloctyloxyphenoxy group, lauryloxyphenoxy group, etc.

Specific examples of $C_1$–$C_{12}$ alkylphenoxy group include a methylphenoxy group, ethylphenoxy group, dimethylphenoxy group, propylphenoxy group, 1,3,5-trimethylphenoxy group, methylethylphenoxy group, i-propylphenoxy group, butylphenoxy group, i-butylphenoxy group, t-butylphenoxy group, pentylphenoxy group, isoamylphenoxy group, hexylphenoxy group, heptylphenoxy group, octylphenoxy group, nonylphenoxy group, decylphenoxy group, dodecylphenoxy group, etc.

The arylthio group usually has about 6 to 60 carbon atoms, preferably 7 to 48. Specific examples thereof include a phenylthio group, $C_1$–$C_{12}$ alkoxyphenylthio group, $C_1$–$C_{12}$ alkyl phenylthio group, 1-naphthylthio group, 2-naphthylthio group, pentafluorophenylthio group, etc. $C_1$–$C_{12}$ alkoxy phenylthio group, and $C_1$–$C_{12}$ alkyl phenylthio group are preferable.

The arylalkyl group usually has about 7 to 60 carbon atoms, preferably 7 to 48. Specific examples thereof include a phenyl-$C_1$–$C_{12}$ alkyl group, $C_1$–$C_{12}$ alkoxyphenyl-$C_1$–$C_{12}$ alkyl group, $C_1$–$C_{12}$ alkylphenyl-$C_1$–$C_{12}$ alkyl group, 1-naphtyl-$C_1$–$C_{12}$ alkyl group, 2-naphtyl-$C_1$–$C_{12}$ alkyl group, etc. $C_1$–$C_{12}$ alkoxy phenyl-$C_1$–$C_{12}$ alkyl group, and $C_1$–$C_{12}$ alkylphenyl-$C_1$–$C_{12}$ alkyl group are preferable.

The aryl alkoxy group usually has about 7 to 60 carbon atoms, preferably 7 to 48. Specific examples thereof include phenyl-$C_1$–$C_{12}$ alkoxy groups such as a phenylmethoxy group, phenylethoxy group, phenylbutoxy group, phenylpentyloxy group, phenylhexyloxy group, phenyl heptyloxy group, phenyloxtyloxy group, etc.; $C_1$–$C_{12}$ alkoxyphenyl-$C_1$–$C_{12}$ alkoxy group, $C_1$–$C_{12}$ alkylphenyl-$C_1$–$C_{12}$ alkoxy group, 1-naphtyl-$C_1$–$C_{12}$ alkoxy group, 2-naphtyl-$C_1$–$C_{12}$ alkoxy group, etc. $C_1$–$C_{12}$ alkoxyphenyl-$C_1$–$C_{12}$ alkoxy group, and $C_1$–$C_{12}$ alkyl phenyl-$C_1$–$C_{12}$ alkoxy group are preferable.

The aryl alkylthio group usually has about 7 to 60 carbon atoms, preferably 7 to 48. Specific examples thereof include a phenyl-$C_1$–$C_{12}$ alkylthio group, $C_1$–$C_{12}$ alkoxyphenyl-$C_1$–$C_{12}$ alkylthio group, $C_1$–$C_{12}$ alkylphenyl-$C_1$–$C_{12}$ alkylthio group, 1-naphtyl-$C_1$–$C_{12}$ alkylthio group, 2-naphtyl-$C_1$–$C_{12}$ alkylthio group, etc. $C_1$–$C_{12}$ alkoxyphenyl-$C_1$–$C_{12}$ alkylthio group, and $C_1$–$C_{12}$ alkylphenyl-$C_1$–$C_{12}$ alkylthio group are preferable.

The aryl alkenyl group usually has about 7 to 60 carbon atoms, preferably 7 to 48. Specific examples thereof include a phenyl-$C_2$–$C_{12}$ alkenyl group, $C_1$–$C_{12}$ alkoxyphenyl-$C_2$–$C_{12}$ alkenyl group, $C_1$–$C_{12}$ alkylphenyl-$C_2$–$C_{12}$ alkenyl group, 1-naphtyl-$C_2$–$C_{12}$ alkenyl group, 2-naphtyl-$C_2$–$C_{12}$ alkenyl group, etc. $C_1$–$C_{12}$ alkoxyphenyl-$C_2$–$C_{12}$ alkenyl group, and $C_2$–$C_{12}$ alkyl phenyl-$C_1$–$C_{12}$ alkenyl group are preferable.

The aryl alkynyl group usually has about 7 to 60 carbon atoms, preferably 7 to 48. Specific examples thereof include a phenyl-$C_2$–$C_{12}$ alkynyl group, $C_1$–$C_{12}$ alkoxyphenyl-$C_2$–$C_{12}$ alkynyl group, $C_1$–$C_{12}$ alkylphenyl-$C_2$–$C_{12}$ alkynyl group, 1-naphtyl-$C_2$–$C_{12}$ alkynyl group, 2-naphtyl-$C_2$–$C_{12}$ alkynyl group, etc. $C_1$–$C_{12}$ alkoxyphenyl-$C_2$–$C_{12}$ alkynyl group, and $C_1$–$C_{12}$ alkylphenyl-$C_2$–$C_{12}$ alkynyl group are preferable.

The substituted amino group means an amino group which has one or two substituents selected from an alkyl group, aryl group, arylalkyl group, or monovalent heterocyclic group. The alkyl group, aryl group, arylalkyl group, or monovalent heterocyclic group may have a substituent. The number of carbon atoms is usually about 1 to 60 without including the carbon atoms of the substituent, and preferably 2 to 48.

Specifically exemplified are: a methylamino group, dimethyl amino group, ethylamino group, diethylamino group, propyl amino group, dipropylamino group, i-propylamino group, diisopropylamino group, butylamino group, i-butylamino group, t-butylamino group, pentylamino group, hexylamino group, cyclohexylamino group, heptylamino group, octylamino group, 2-ethylhexyl amino group, nonylamino group, decyl amino group, 3,7-dimethyloctyl amino group, laurylamino group, cyclopentylamino group, dicyclopentylamino group, cyclohexylamino group, dicyclohexylamino group, pyrrolidyl group, piperidyl group, ditrifluoromethylamino group, phenyl amino group, diphenylamino group, $C_1$–$C_{12}$ alkoxyphenylamino group, di($C_1$–$C_{12}$ alkoxyphenyl)amino group, di($C_1$–$C_{12}$ alkyl phenyl)amino group, 1-naphtylamino group, 2-naphtylamino group, pentafluorophenylamino group, pyridylamino group, pyridazinylamino group, pyrimidylamino group, pyrazylamino group, triazyl amino group, phenyl-$C_1$–$C_{12}$ alkylamino group, $C_1$–$C_{12}$ alkoxyphenyl-$C_1$–$C_{12}$ alkylamino group, $C_1$–$C_{12}$ alkyl phenyl-$C_1$–$C_{12}$ alkylamino group, di($C_1$–$C_{12}$ alkoxyphenyl-$C_1$–$C_{12}$ alkyl) amino group, di($C_1$–$C_{12}$ alkylphenyl-$C_1$–$C_{12}$ alkyl)amino group, 1-naphtyl-$C_1$–$C_{12}$ alkylamino group, 2-naphtyl-$C_2$–$C_{12}$ alkylamino group, etc.

The substituted silyl group means a silyl group which has 1 to 3 substituents selected from an alkyl group, aryl group, arylalkyl group, or monovalent heterocyclic group. The number of carbon atoms is usually about 1 to 60, and preferably 3 to 48. The alkyl group, aryl group, arylalkyl group, or monovalent heterocyclic group may have a substituent.

Specifically exemplified are: a trimethylsilyl group, triethylsilyl group, tripropylsilyl group, tri-i-propyl silyl group, dimethyl-i-propylsilyl group, diethyl-i-propyl silyl group, t-butylsilyldimethylsilyl group, pentyldimethyl silyl group, hexyldimethylsilyl group, heptyldimethylsilyl group, octyldimethylsilyl group, 2-ethylhexyl-dimethylsilyl group, nonyldimethylsilyl group, decyldimethylsilyl group, 3,7-dimethyloctyl-dimethylsilyl group, lauryldimethylsilyl group, phenyl-$C_1$–$C_{12}$ alkylsilyl group, $C_1$–$C_{12}$ alkoxyphenyl-$C_1$–$C_{12}$ alkylsilyl group, $C_1$–$C_2$ alkylphenyl-$C_1$–$C_{12}$ alkylsilyl group, 1-naphtyl-$C_1$–$C_{12}$ alkylsilyl group, 2-naphtyl-$C_1$–$C_{12}$ alkylsilyl group, phenyl-$C_1$–$C_{12}$ alkyldimethylsilyl group, triphenylsilyl group, tri-p-xylylsilyl group, tribenzyl silyl group, diphenylmethylsilyl group, t-butyldiphenyl silyl group, dimethylphenylsilyl group, etc.

As the halogen atom, a fluorine atom, chlorine atom, bromine atom, and an iodine atom are exemplified.

The acyl group usually has about 2 to 20 carbon atoms, preferably 2 to 18. Specific examples thereof include an acetyl group, propionyl group, butyryl group, isobutyryl group, pivaloyl group, benzoyl, trifluoroacetyl group, pentafluorobenzoyl, etc.

The acyloxy group usually has about 2 to 20 carbon atoms, preferably 2 to 18. Specific examples thereof include an acetoxy group, propionyloxy group, butyryloxy group, isobutyryloxy group, pivaloyloxy group, benzoyloxy group, trifluoroacetyloxy group, pentafluorobenzoyloxy group, etc.

The imino group has about 2 to 20 carbon atoms, preferably 2 to 18. Specific examples thereof include the groups represented by the following structural formulae, and the like.

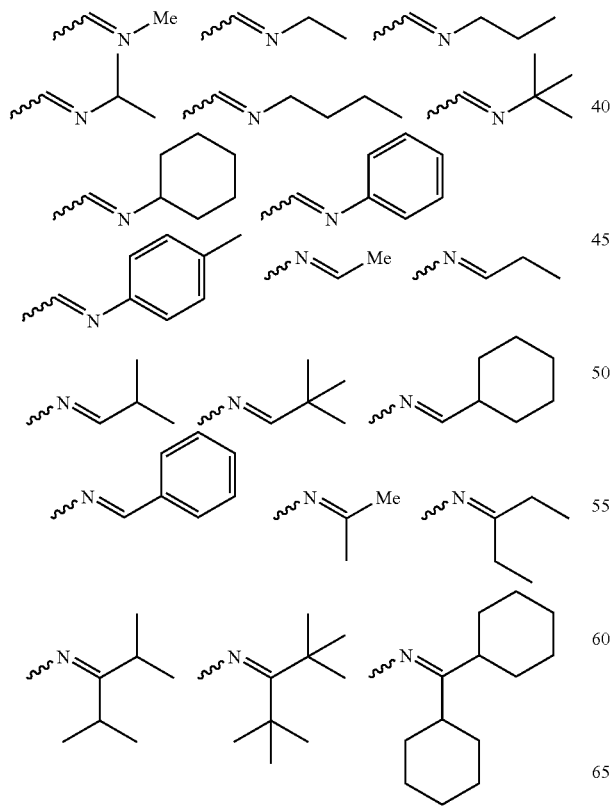

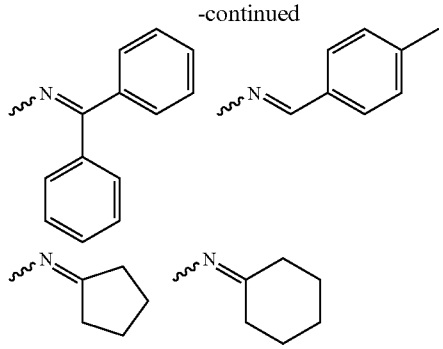

The amide group usually has about 2 to 20 carbon atoms, preferably 2 to 18. Specific examples thereof include formamide group, acetamide group, propioamide group, butyro amide group, benzamide group, trifluoroacetamide group, pentafluorobenzamide group, diformamide group, diacetamide group, dipropioamide group, dibutyroamide group, dibenzamide group, ditrifluoroacetamide group, dipentafluorobenzamide group, etc.

The imide group usually has about 2 to 60 carbon atoms, preferably 2 to 48. Specific examples thereof include the groups shown below.

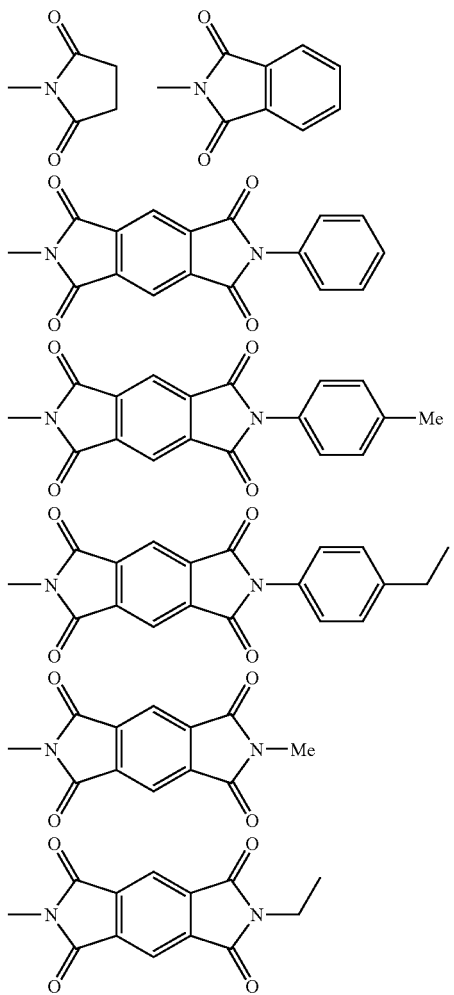

-continued

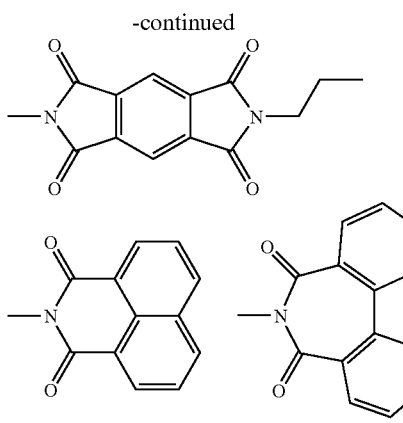

A monovalent heterocyclic group means an atomic group in which a hydrogen atom is removed from a heterocyclic compound, and usually has about 4 to 60 carbon atoms, preferably 4 to 20. The carbon atoms of the substituent are not counted as the number of carbon atoms of the heterocyclic group. The heterocyclic compound means an organic compound having a cyclic structure in which at least one heteroatom such as oxygen, sulfur, nitrogen, phosphorus, boron, etc. is contained in the cyclic structure as the element other than carbon atoms.

Specific examples thereof include a thienyl group, $C_1$–$C_{12}$ alkylthienyl group, pyroryl group, furyl group, pyridyl group, $C_1$–$C_{12}$ alkylpyridyl group, piperidyl group, quinolyl group, isoquinolyl group, etc. A thienyl group, $C_1$–$C_{12}$ alkylthienyl group, pyridyl group, and $C_1$–$C_{12}$ alkyl pyridyl group are preferable.

The substituted carboxyl group usually has about 2 to 60 carbon atoms, preferably 2 to 48. The substituted carboxyl group means a carboxyl group having a substituent such as an alkyl group, aryl group, arylalkyl group, or monovalent heterocyclic group. Specific examples thereof include a methoxycarbonyl group, ethoxycarbonyl group, propoxycarbonyl group, i-propoxycarbonyl group, butoxycarbonyl group, i-butoxycarbonyl group, t-butoxycarbonyl group, pentyloxy carbonyl group, hexyloxycarbonyl group, cyclohexyloxy carbonyl group, heptyloxycarbonyl group, octyloxycarbonyl group, 2-ethylhexyloxycarbonyl group, nonyloxycarbonyl group, decyloxycarbonyl group, 3,7-dimethyloctyloxycarbonyl group, dodecyloxycarbonyl group, trifluoromethoxycarbonyl group, pentafluoroethoxycarbonyl group, perfluorobutoxy carbonyl group, perfluorohexyloxycarbonyl group, perfluoro octyloxycarbonyl group, phenoxycarbonyl group, naphtoxycarbonyl group, pyridyloxycarbonyl group, etc. Here, the alkyl group, aryl group, arylalkyl group, or monovalent heterocyclic group may have a substituent. The carbon atoms of this substituent are not counted as the number of carbon atoms of the substituted carboxyl group.

In the above examples of substituents, the substituent containing an alkyl chain may be linear, branched or cyclic one, or the combination thereof. As the alkyl chain which is not linear, exemplified are isoamyl group, 2-ethylhexyl group, 3,7-dimethyloctyl group, cyclohexyl group, 4-$C_1$–$C_{12}$ alkylcyclohexyl group, etc. Moreover, two alkyl chain ends may be connected to form a ring. Furthermore, methyl or ethyl as a part of said alkyl chain may be replaced by a group containing a hetero atom, or a methyl or ethyl group which is substituted with one or more fluorine atoms. Here, as the hetero atom, an oxygen atom, a sulfur atom, a nitrogen atom, etc. are exemplified. Furthermore, in the examples of substituents containing an aryl group or a heterocyclic group, they may have one more or more substituents.

Among the structures represented by formula (1-1), concrete examples in case of X=S include the followings.

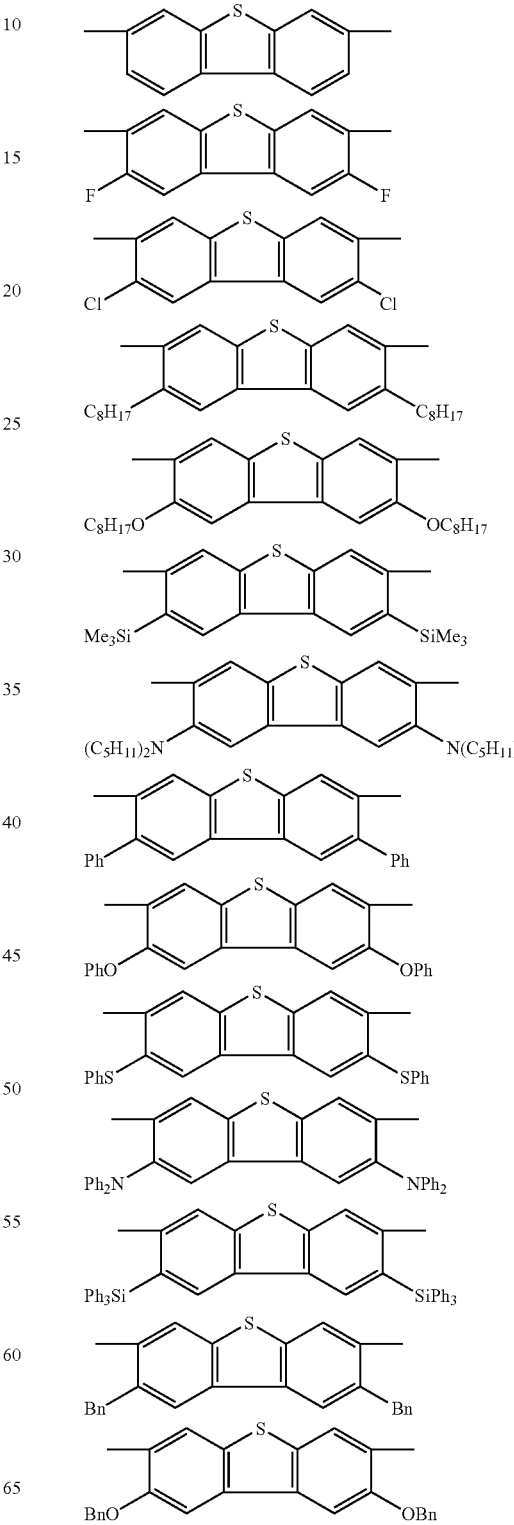

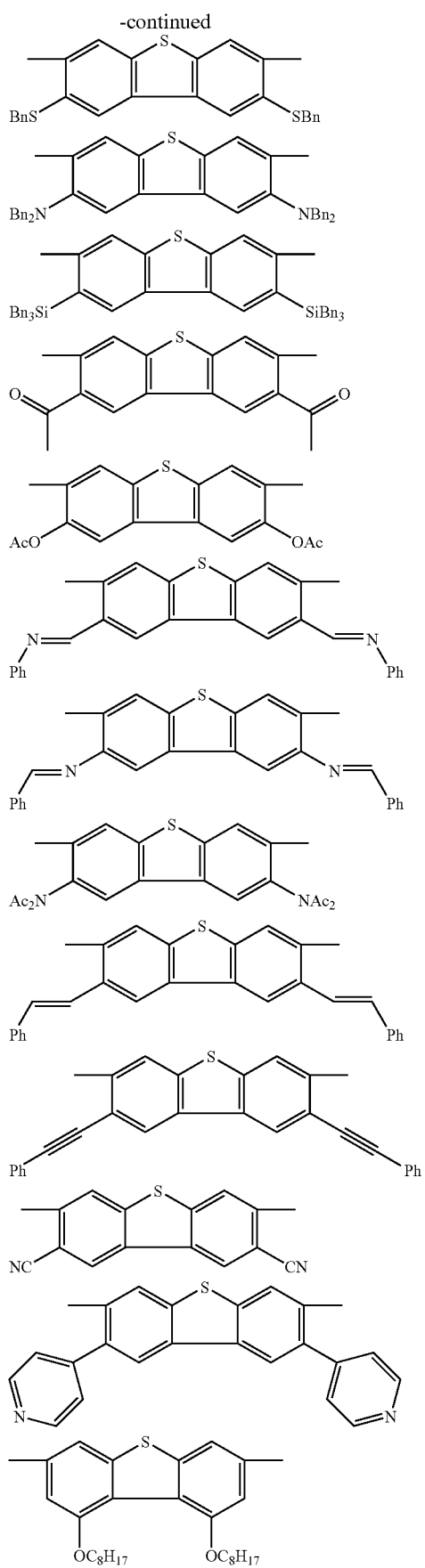
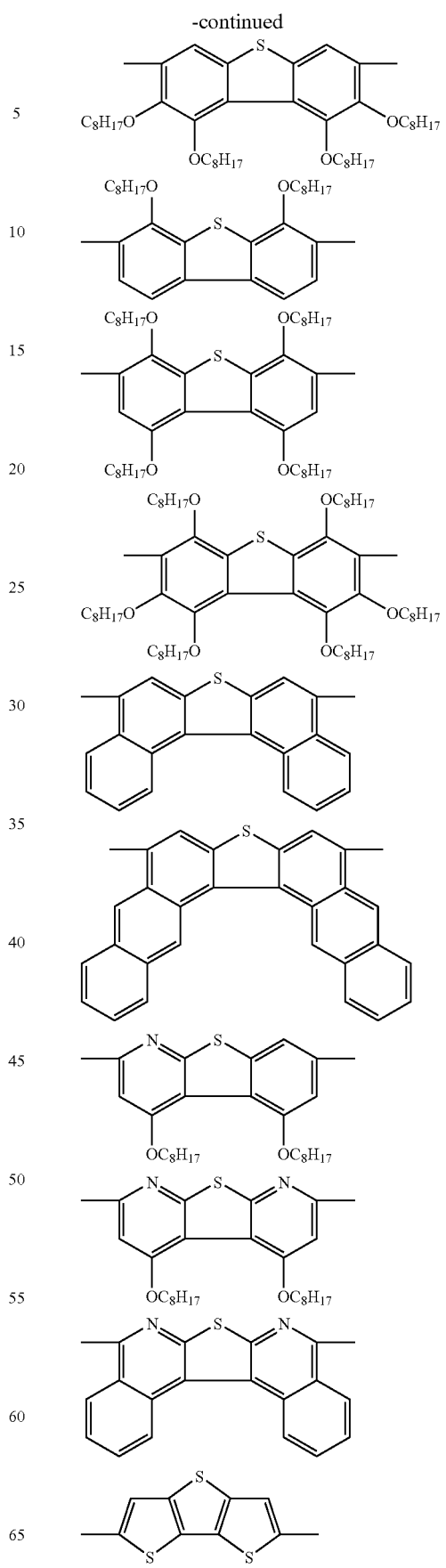

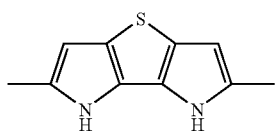
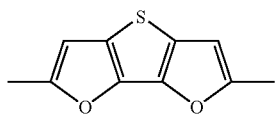
Among the structures represented by formula (1-1), concrete examples in case of X=O include the followings.
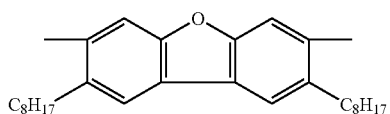
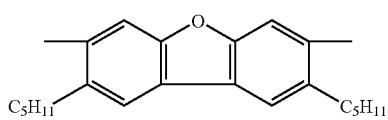
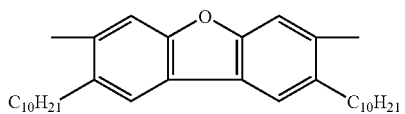
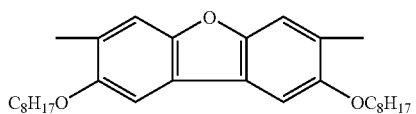
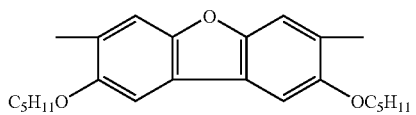
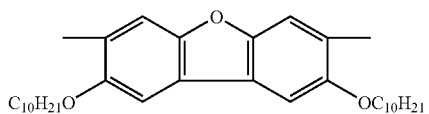
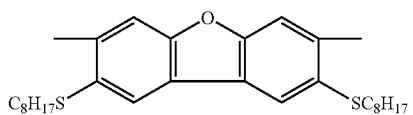
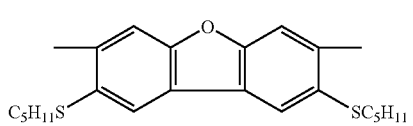
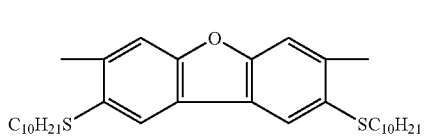
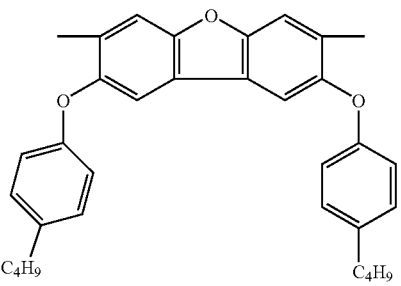
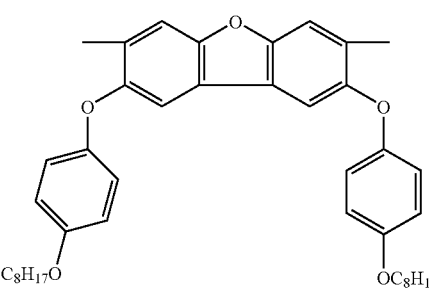
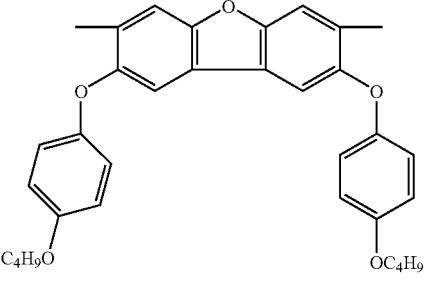
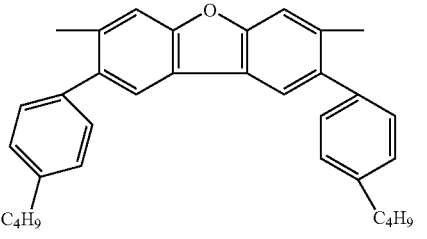
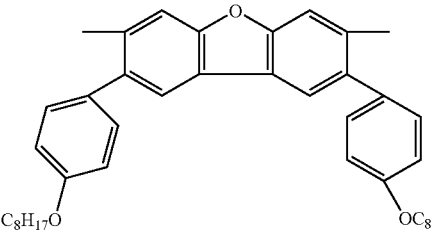
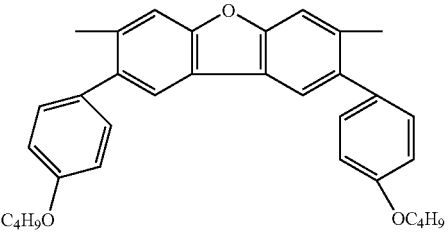
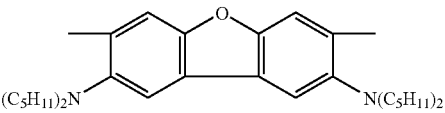

-continued
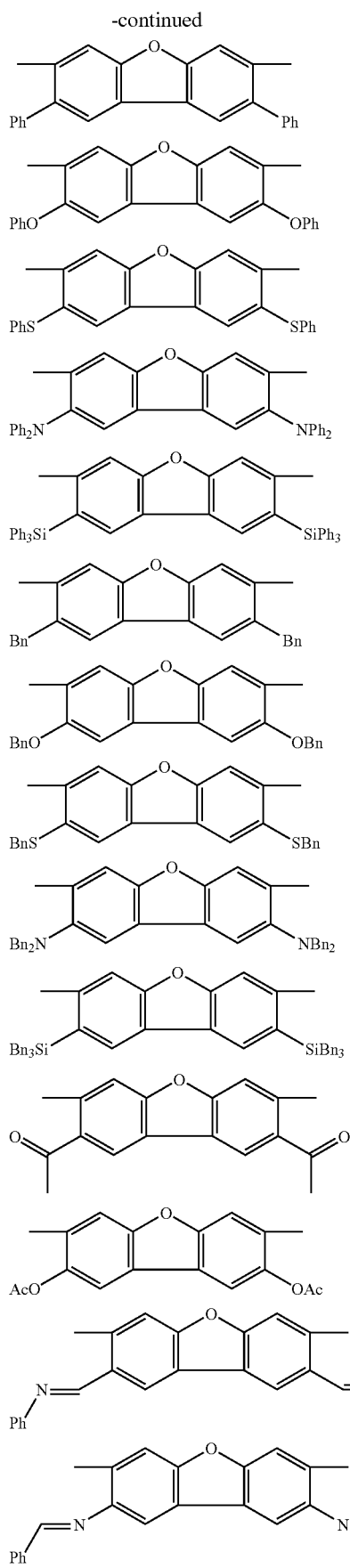
-continued
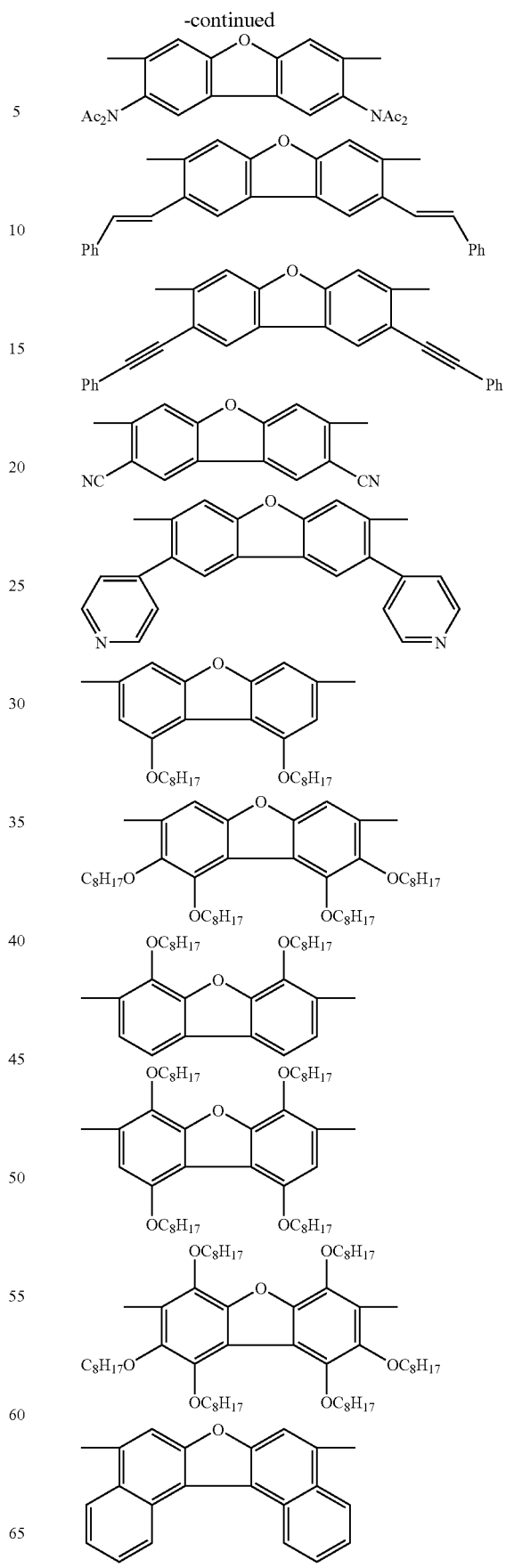

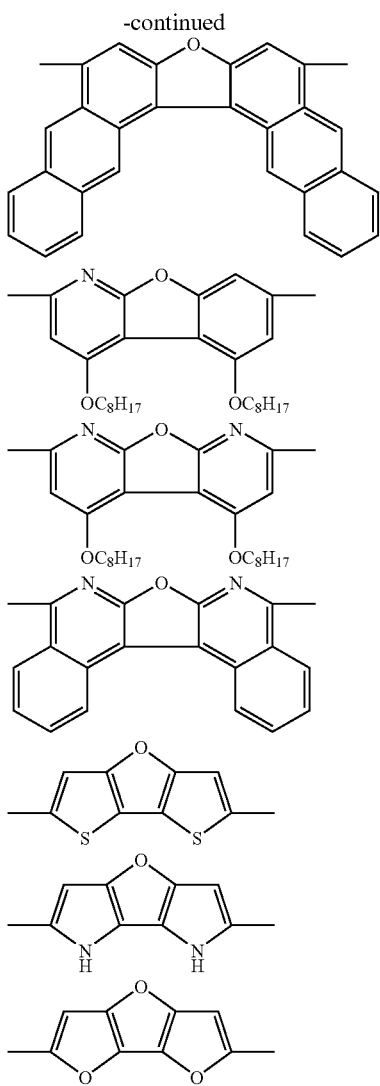
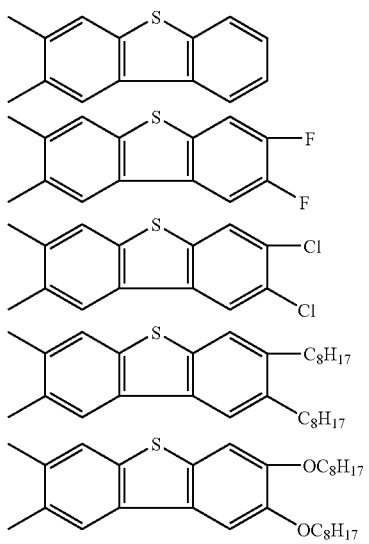
Among the structures represented by formula (1-2), concrete examples in case of X=S include the followings.
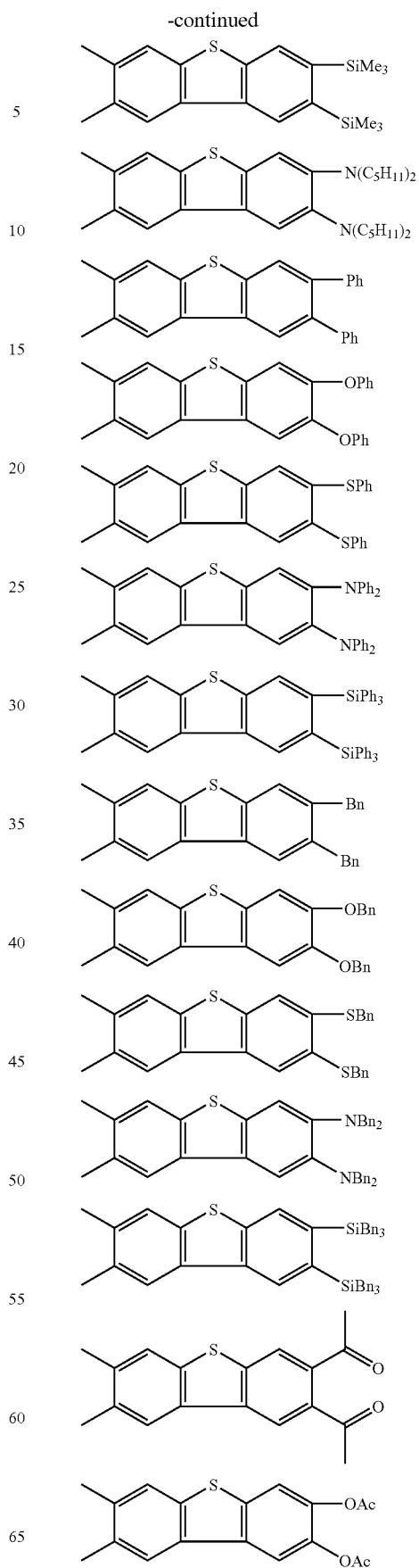

-continued
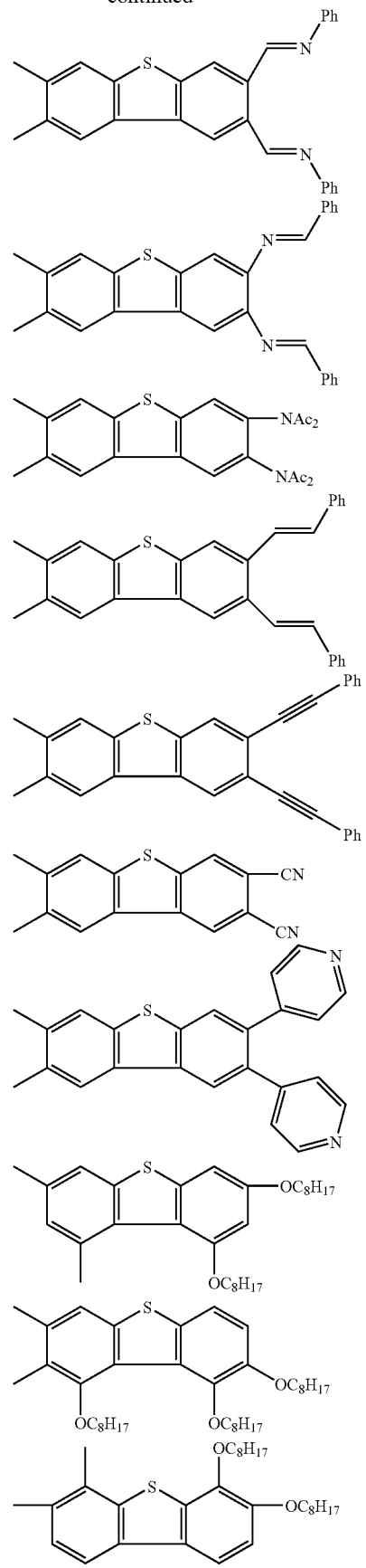
-continued
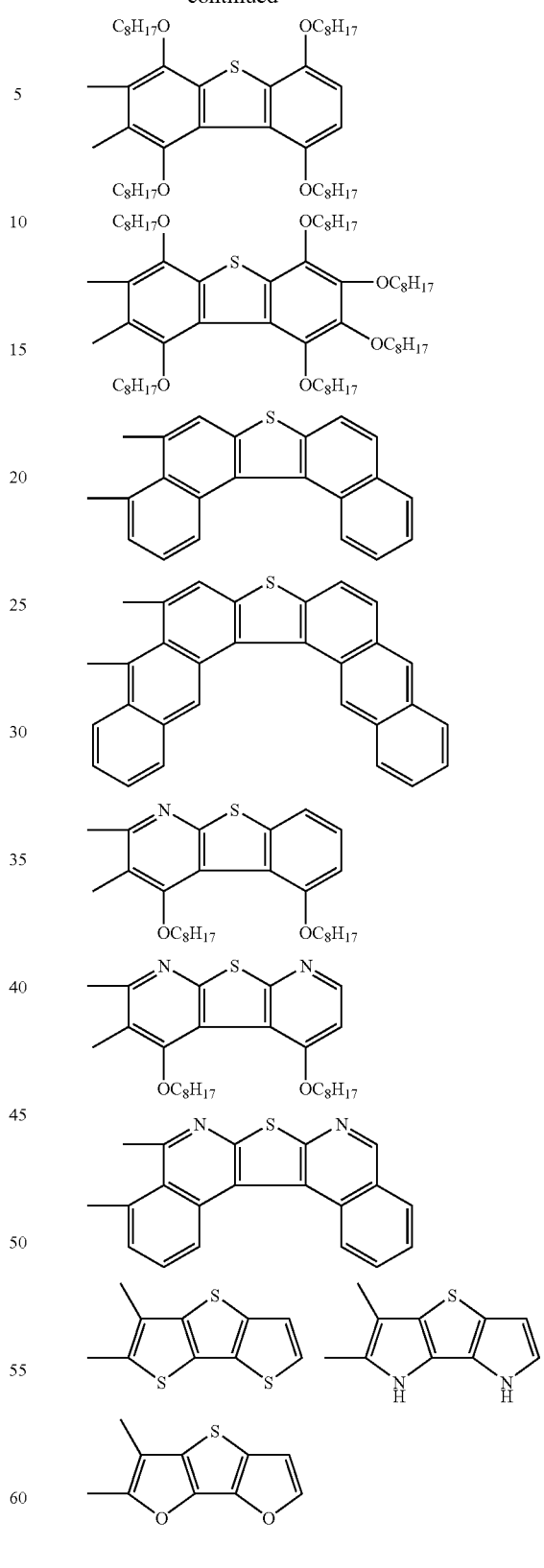
Concrete examples represented by formula (1-2) in case of X=O include the followings.

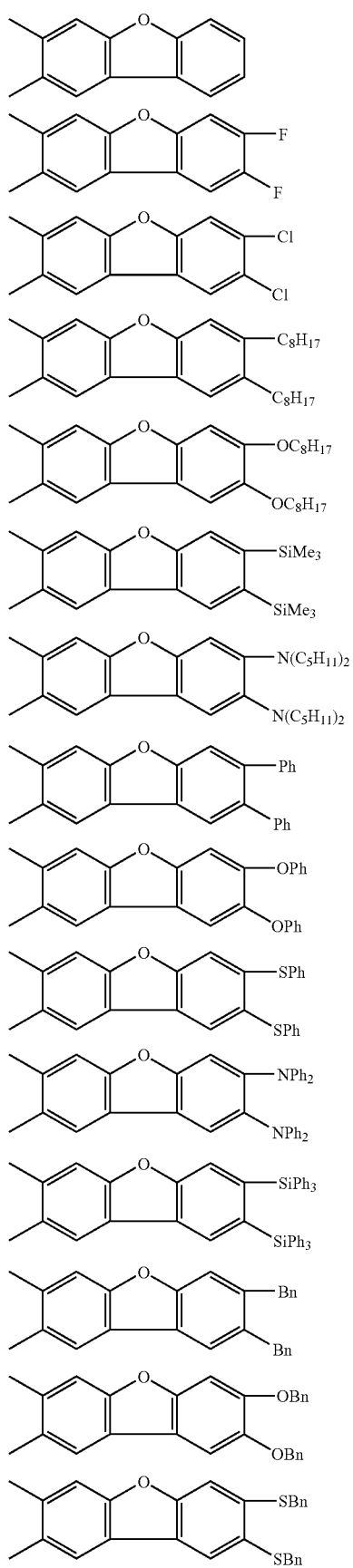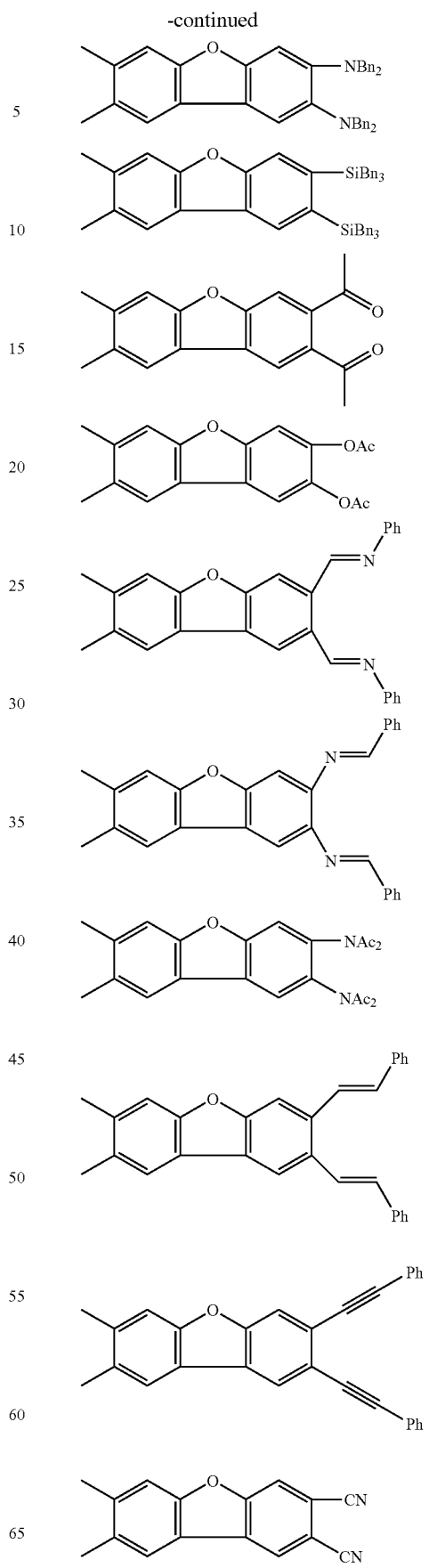

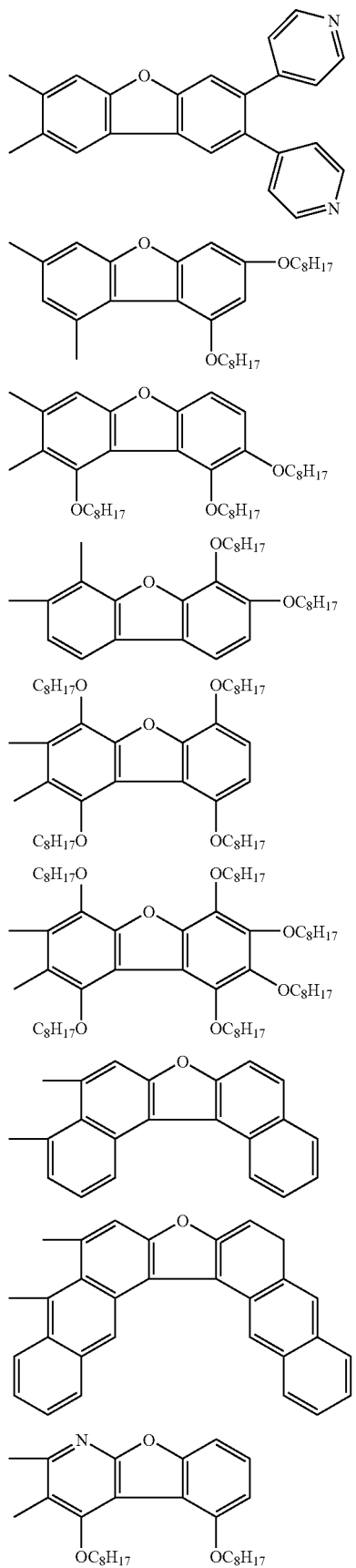

In the formulae, Me represents a methyl group, Ph represents a phenyl group, Bn represents a benzyl group, and Ac represents an acetyl group.

As for the above formulae (1-1) and (1-2), in view of improving the solubility of polymer compound, changing the wavelength of light-emission, and improving the efficiency of light-emission, it is preferable that Ring A or Ring B, and Ring C or Ring D have a substituent selected from an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imino group, amide group, imide group, monovalent heterocyclic group, carboxyl group, substituted carboxyl group, and cyano group.

Among them, an alkyl group, alkoxy group, alkylthio group, aryl group, aryloxy group, arylthio group, arylalkyl group, arylalkoxy group, arylalkylthio group, substituted amino group, substituted silyl group, fluorine atom, acyl group, acyloxy group, amide group, imide group, monovalent heterocyclic group, carboxyl group, substituted carboxyl group, and cyano group are preferable, and an alkyl group, alkoxy group, aryl group, aryloxy group, arylalkyl group, arylalkoxy group, and arylalkylthio group, are more preferable.

As the repeating unit in the polymer compound of the present invention, a repeating unit represented by formula (1-1) is preferable.

As for Ring A, Ring B, Ring C, and Ring D, those containing only an aromatic hydrocarbon ring are preferable.

Among them, preferable are those which have a structure represented by the above formula (1-1), and have only aromatic hydrocarbon rings, as Ring A, Ring B, Ring C, and Ring D. More preferable are the repeating units selected from the below formulae (2-1), (2-2), (2-3), (2-4), and (2-5).

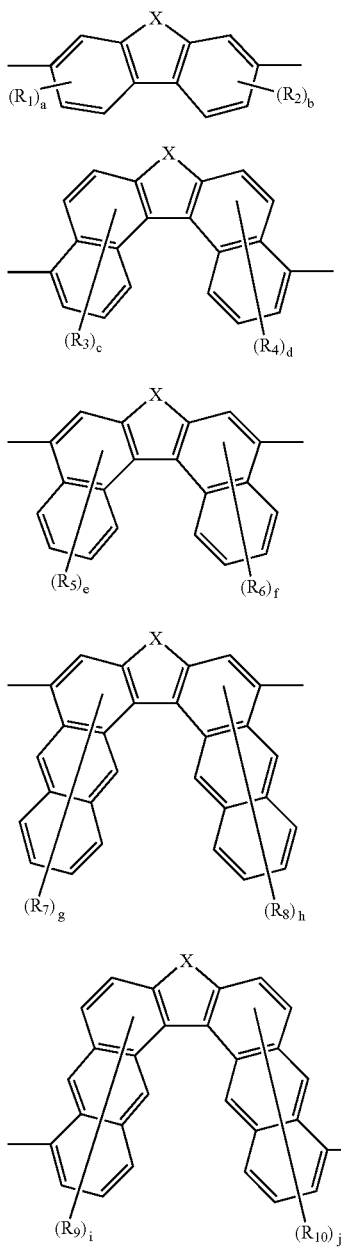

(2-1)

(2-2)

(2-3)

(2-4)

(2-5)

In the formulae, X represents S or O. $R_1$, $R_2$, $R_3$, $R_4$, $R_5$, $R_6$, $R_7$, $R_8$, $R_9$, and $R_{10}$ each independently represent an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imino group, amide group, imide group, monovalent heterocyclic group, carboxyl group, or substituted carboxyl group. a and b each independently represent an integer of 0–3. c, d, e and f each independently represent an integer of 0–5. g, h, i and j each independently represent an integer of 0–7.

In the above formulae (2-2) and (2-3), the substituents $R_3$ to $R_6$ may substitute on any carbon atoms of two benzene rings constituting the condensed aromatic ring.

In the above formulae (2-4) and (2-5), the substituents $R_7$ to $R_{10}$ may substitute on any carbon atoms of two benzene rings constituting the condensed aromatic ring.

In view of improving the solubility of polymer compound, changing the wavelength of light-emission, and improving the efficiency of light-emission, it is preferable that a+b of formula (2-1), c+d of formula (2-2), e+f of formula (2-3), g+h of formula (2-4), and i+j of formula (2-5), are 1 or more.

When $R_1$ exists in plural, a plurality of them may be the same or different. As for $R_2$, $R_3$, $R_4$, $R_5$, $R_6$, $R_7$, $R_8$, $R_9$, and $R_{10}$, when they exist in plural, respectively, a plurality of them may be the same or different.

When X=S, among the repeating units selected from the above (2-1), (2-2), (2-3), (2-4) and (2-5), the repeating unit represented by formula (2-1) is preferable. Moreover, in formula (2-1), it is more preferable that $R_1$ and/or $R_2$ is an alkyl group having 3 or more carbon atoms, an alkoxy group having 3 or more carbon atoms, an alkylthio group having 3 or more carbon atoms, an aryl group, aryloxy group, arylalkyl group, arylalkoxy group, arylalkylthio group, or monovalent heterocyclic group.

When X=O, among the repeating units selected from the above (2-1), (2-2), (2-3), (2-4) and (2-5), the repeating unit represented by formula (2-6) is preferable.

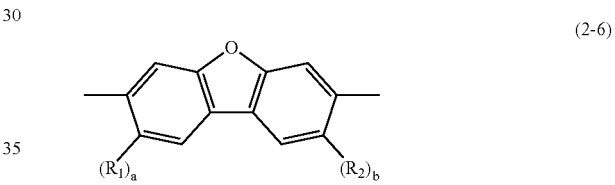

(2-6)

In the formula, $R_1$ and $R_2$ each independently represent an alkyl group having 3 or more carbon atoms, alkoxy groups having 3 or more carbon atoms, alkylthio groups having 3 or more carbon atoms, aryl group, aryloxy group, arylalkyl group, arylalkoxy group, arylalkylthio group, and monovalent heterocyclic group.

Total amount of the repeating units represented by the above formula (1-1) and (1-2), is usually 1% by mole or more and 100% by mole or less. When X=S, it is preferably 20% by mole or more, and more preferably 30% by mole or more and 90% by mole or less. When X=O, it is preferably 10% by mole or more and 100% by mole or less, and more preferably 50% by mole or more and 90% by mole or less.

In view of improving fluorescence intensity, when a copolymer consisting of repeating units represented by either one of formula (1-1) or formula (1-2), and the repeating units have only the structure of either X=S or X=O, it is preferable that the repeating units are two or more monomers having different kinds of substituents.

The polymer compound of the present invention is preferably a copolymer which contains the repeating unit having structure of the above formula (1-1) and/or (1-2) and one or more of the other repeating unit.

Examples of the other repeating unit than those represented by formulas (1-1) and (1-2) preferably include the repeating units represented by the below formula (3), formula (4), formula (5), or formula (6).

—Ar₁— (3)

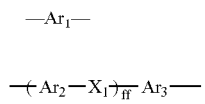
(4)

—Ar₄—X₂— (5)

—X₃— (6)

In the formulae, Ar₁, Ar₂, Ar₃, and Ar₄ represent each independently an arylene group, a divalent heterocyclic group, or a divalent group having metal-complex structure. $X_1$, $X_2$, and $X_3$ represent each independently —$CR_{11}$=$CR_{12}$—, —C≡C—, —N($R_{13}$)—, or —(Si$R_{14}R_{15}$)$_k$—. $R_{11}$ and $R_{12}$ represent each independently a hydrogen atom, alkyl group, aryl group, monovalent heterocyclic group, carboxyl group, substituted carboxyl group, or cyano group. $R_{13}$, $R_{14}$, and $R_{15}$ represent each independently a hydrogen atom, alkyl group, aryl group, monovalent heterocyclic group, arylalkyl group, and substituted amino group. ff represents an integer of 0–2. k represents an integer of 1–12. When $R_{11}$, $R_{12}$, $R_{13}$, $R_{14}$, and $R_{15}$ exist in plural, respectively, a plurality of them may be the same or different.

In the present invention, the arylene group is an atomic group in which two hydrogen atoms are removed from an aromatic hydrocarbon, and usually has 6 to 60 carbon atoms, preferably 6 to 20 carbon atoms. The aromatic hydrocarbon also includes those containing a condensed ring, and two or more of independent benzene rings or condensed rings bonded through a group such as a direct bond, a vinylene group or the like.

As the arylene group, exemplified are phenylene group (for example, formulas 1–3), nanhthalenediyl group (following formulas 4–13), anthracene-diyl group (following formulas 14–19), biphenyl-diyl group (following formulas 20–25), fluorene-diyl group (following formulas 36–38), terphenyl-diyl group (following formulas 26–28), stilbene-diyl (following formulas A–D), distilbene-diyl (following formulas E and F), condensed-ring compound group (following formulas 29–38) etc. Among them, phenylene group, biphenylene group, fluorene-diyl group, and stilbene-diyl group are preferable.

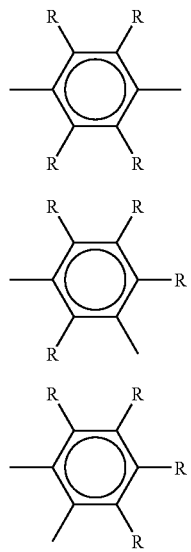

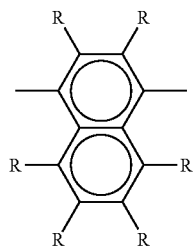
4

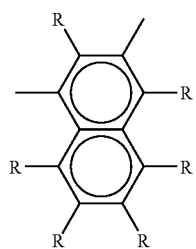
5

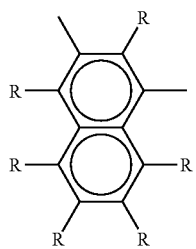
6

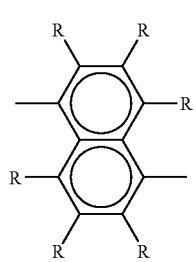
7

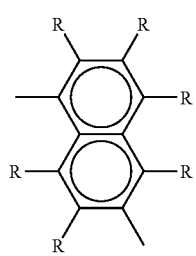
8

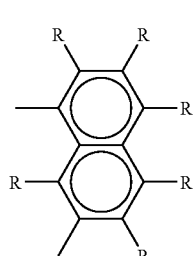
9

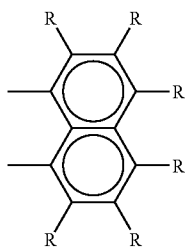
10
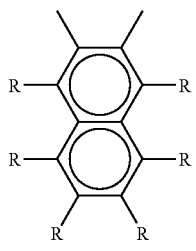
11
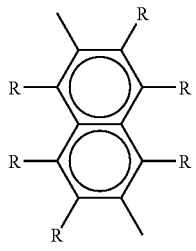
12
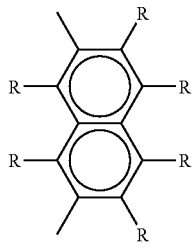
13
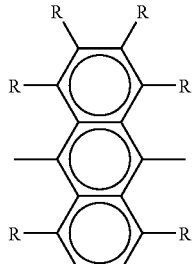
14
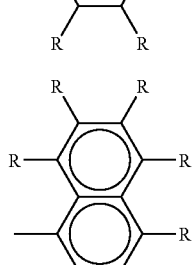
15
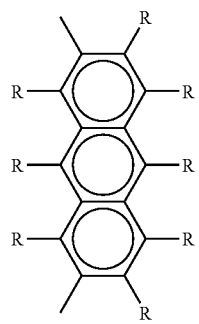
16
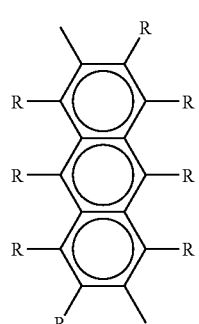
17
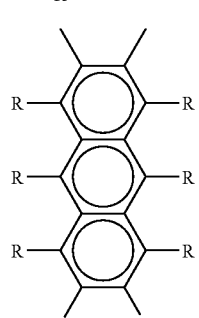
18
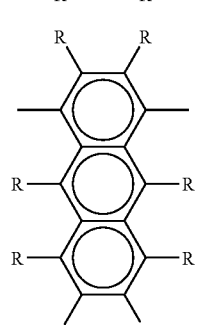
19
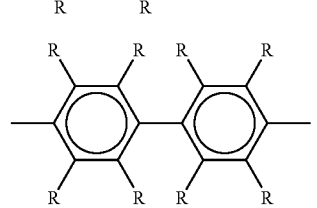
20
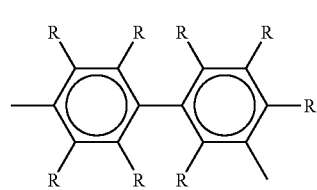
21

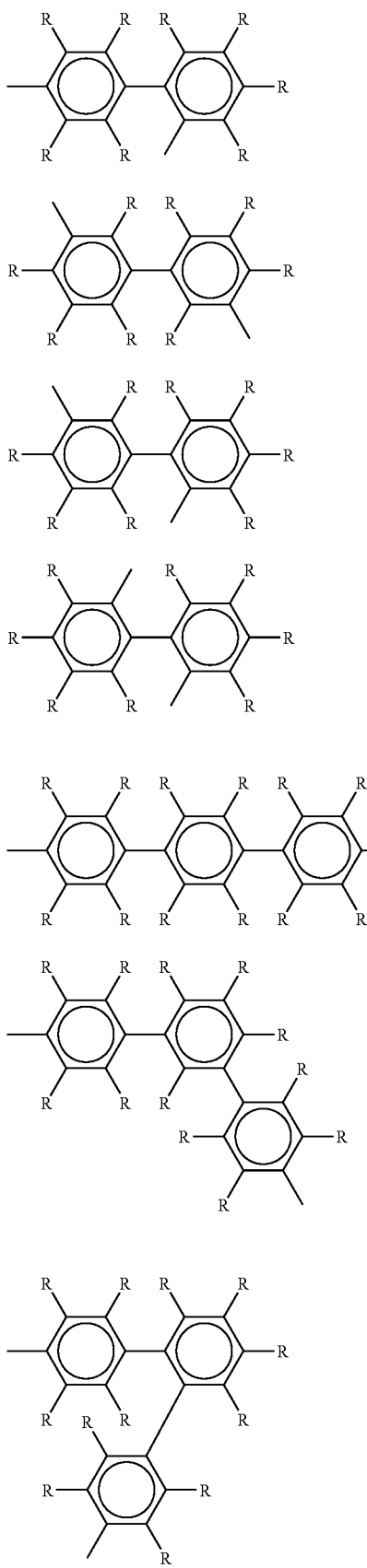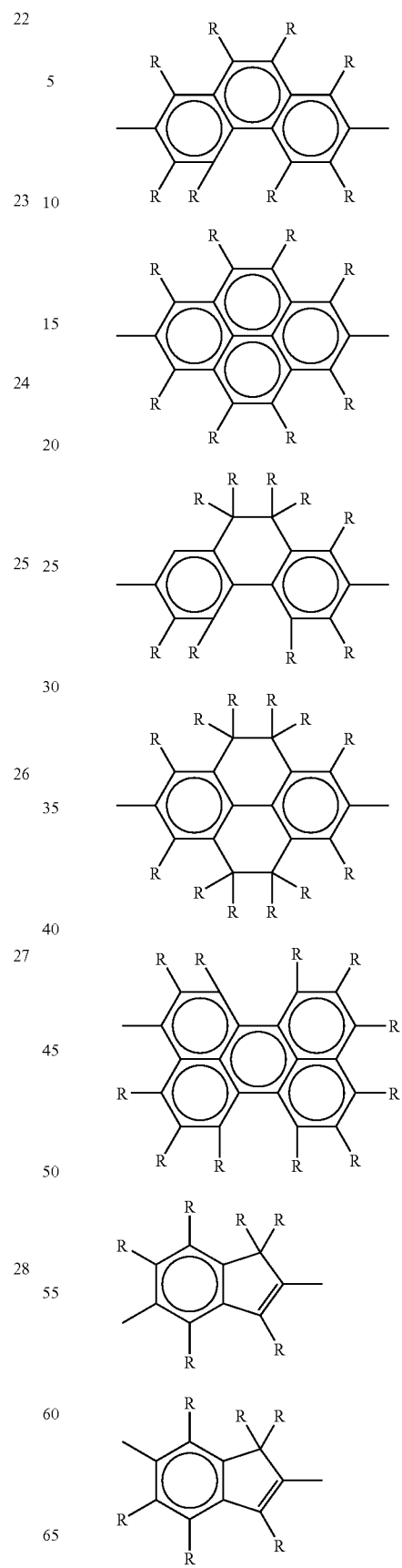

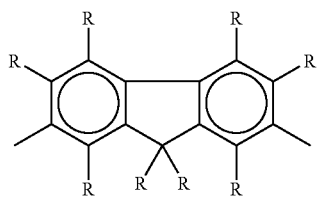

36

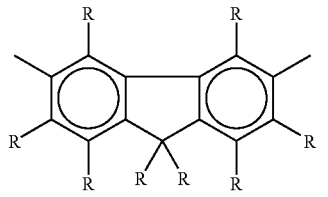

37

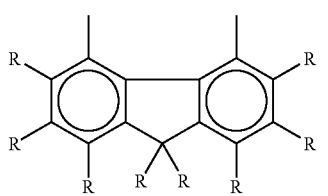

38

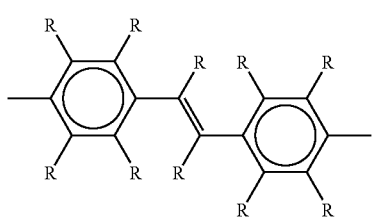

A

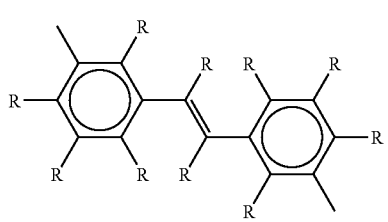

B

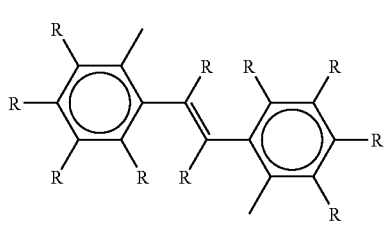

C

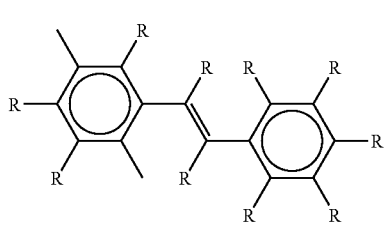

D

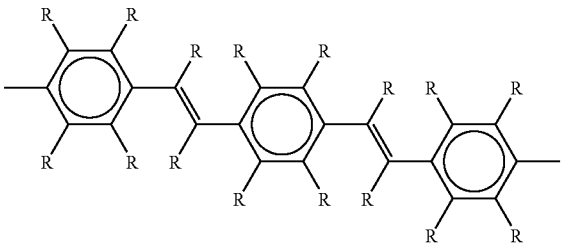

E

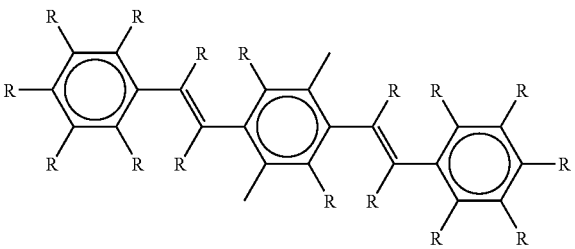

F

In the present invention, the divalent heterocyclic group means an atomic group in which two hydrogen atoms are removed from a heterocyclic compound, and the number of carbon atoms is usually about 3 to 60.

The heterocyclic compound means an organic compound having a cyclic structure in which at least one heteroatom such as oxygen, sulfur, nitrogen, phosphorus, boron, arsenic, etc. is contained in the cyclic structure as the element other than carbon atoms.

As the divalent heterocyclic compound group, followings are exemplified.

Groups containing a nitrogen as a hetero atom; pyridine-diyl group (following formulas 39–44), diazaphenylene group (following formulas 45–48), quinolinediyl group (following formulas 49–63), quinoxaline diyl group (following formulas 64–68), acridine diyl group (following formulas 69–72), bipyridyl diyl group (following formulas 73–75), phenanthroline diyl group (following formulas 76–78), etc.; groups containing a hetero atom, such as silicon, nitrogen, sulfur, selenium, etc. and having a fluorene structure (following formulas 79–93); 5 membered-ring heterocyclic compound groups containing a hetero atom such as silicon, nitrogen, sulfur, selenium, etc. (following formulas 94–98); 5 membered-ring condensation heterocyclic compound groups containing a hetero atom such as silicon, nitrogen, selenium, etc. (following formulas 99–108); groups in which 5 membered ring heterocyclic compound group containing silicon, nitrogen, sulfur, selenium, etc. as a hetero atom is connected with a phenyl group at the a position of the hetero atom to form a dimer or oligomer (following formulas 109–112); groups in which 5 membered ring heterocyclic compound group containing silicon, nitrogen, sulfur, selenium, etc. as a hetero atom is connected with a phenyl group at the a position of the hetero atom (following formulas 113–119); and groups in which 5 membered ring heterocyclic compound group containing oxygen, nitrogen, sulfur, etc. as a hetero atom is connected with a furyl group, or thienyl group (following formulas 120–125).

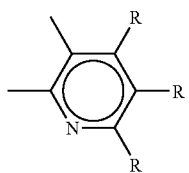
39
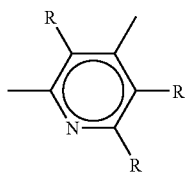
40
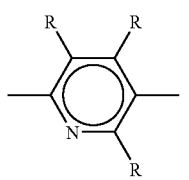
41
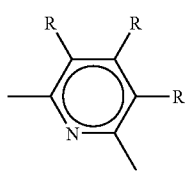
42
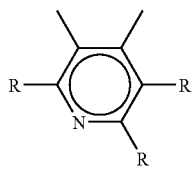
43
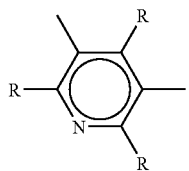
44
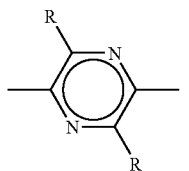
45
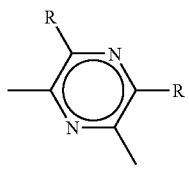
46
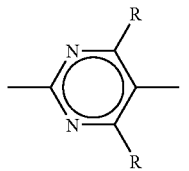
47
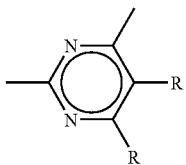
48
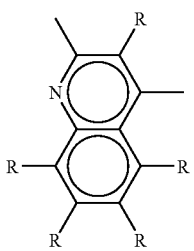
49
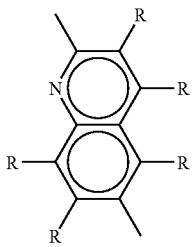
50
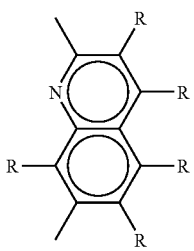
51
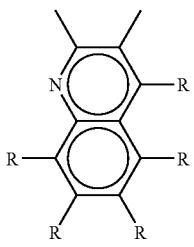
52
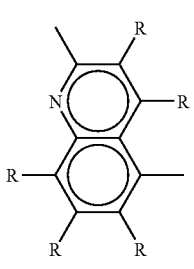
53

54
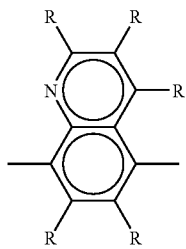
55
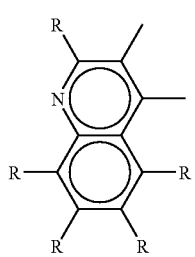
56
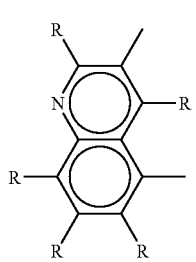
57
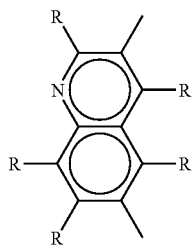
58
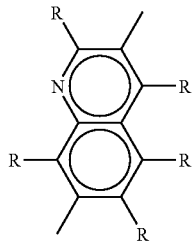
59
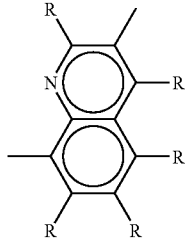
60
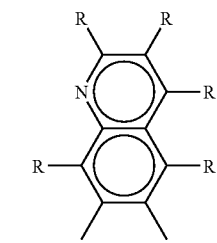
61
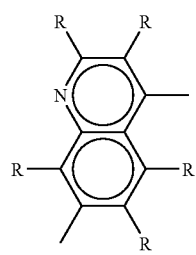
62
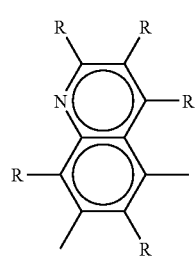
63
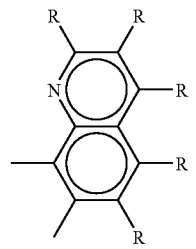
64
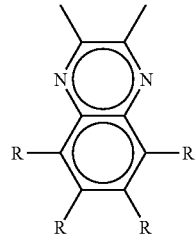
65
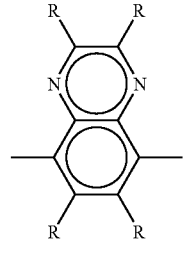

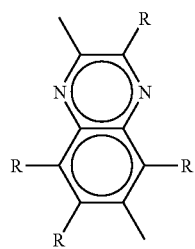
66
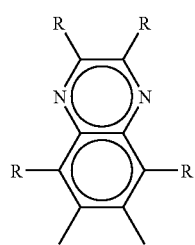
67
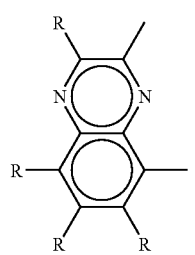
68
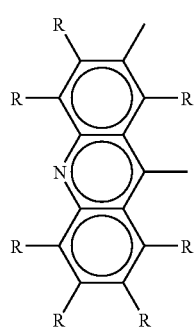
69
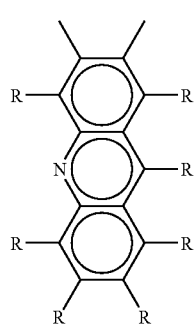
70
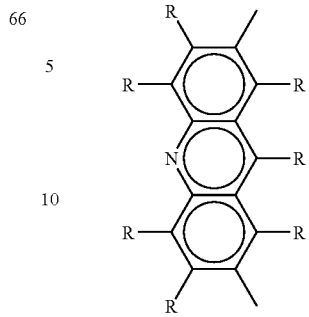
71
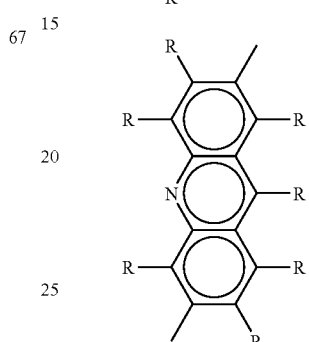
72
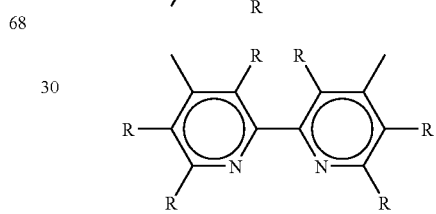
73
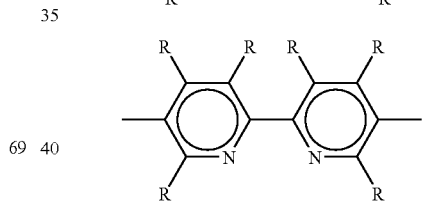
74
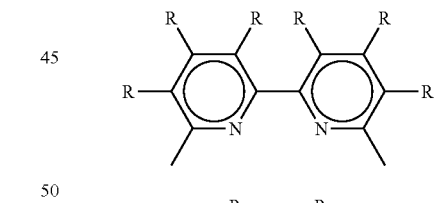
75
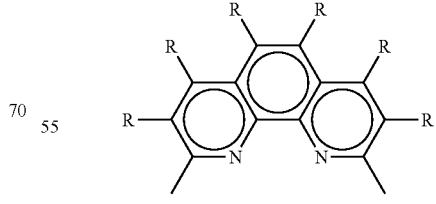
76

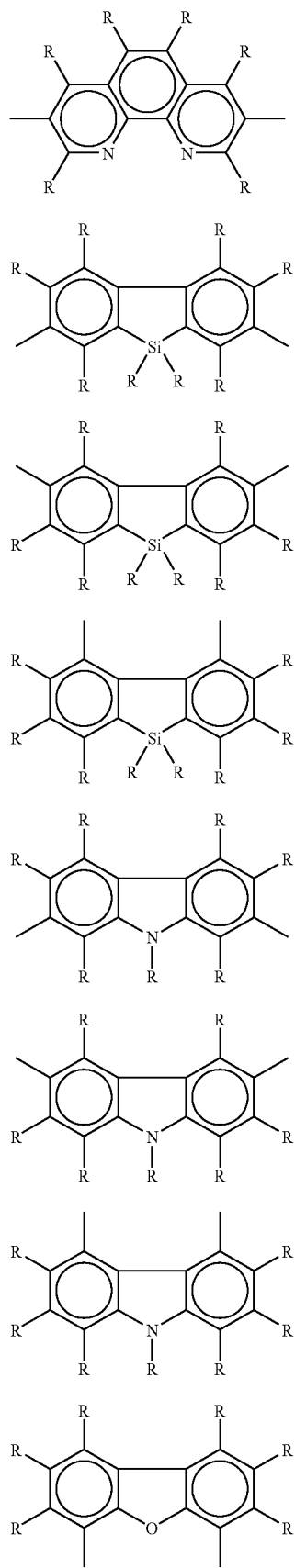
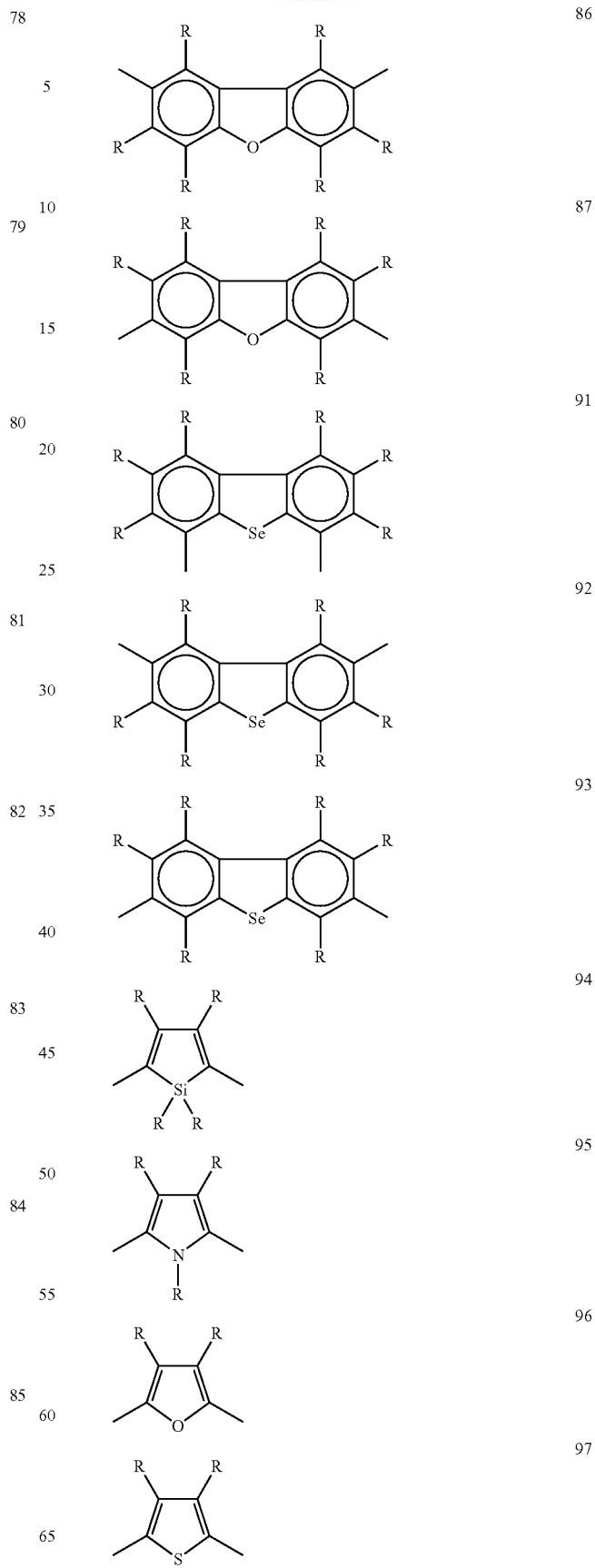

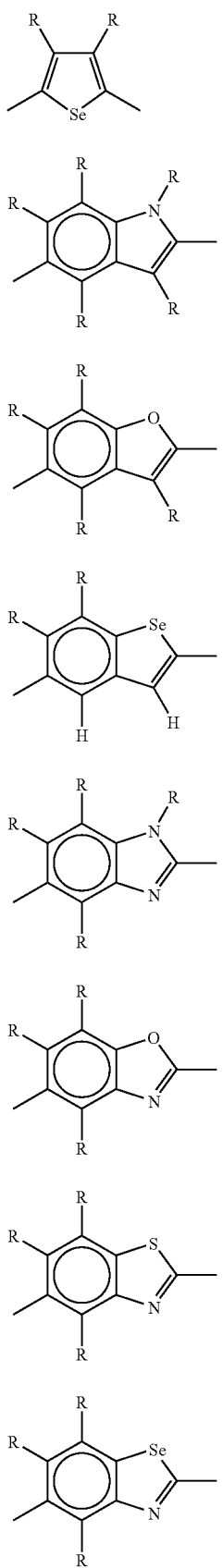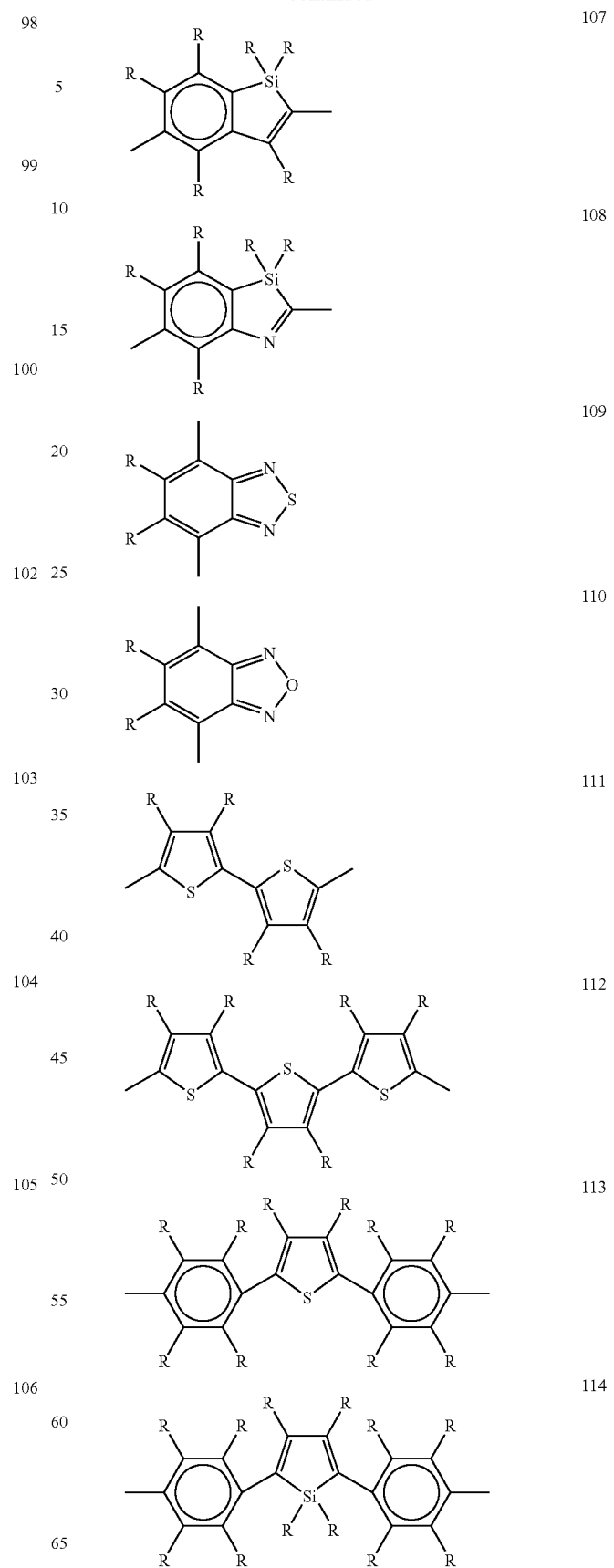

115

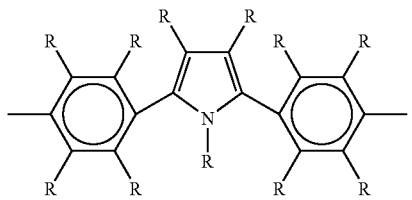

116

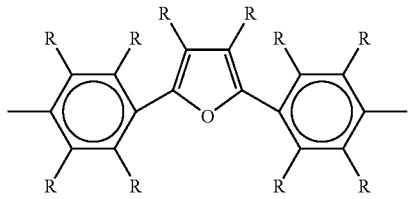

117

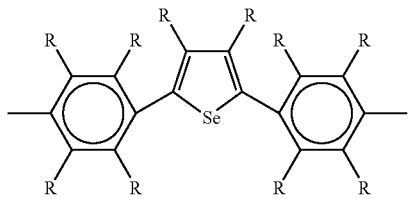

118

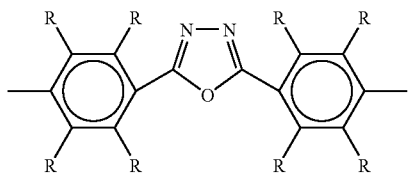

119

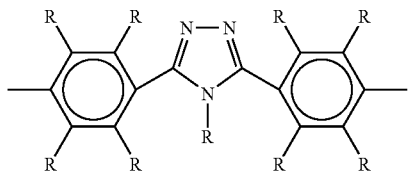

120

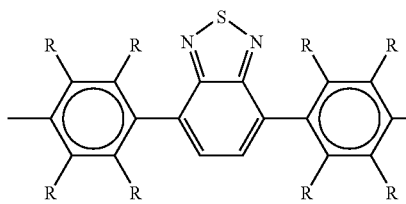

121

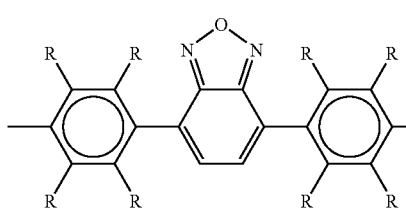

122

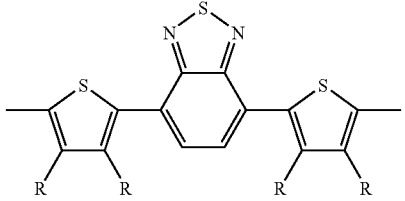

123

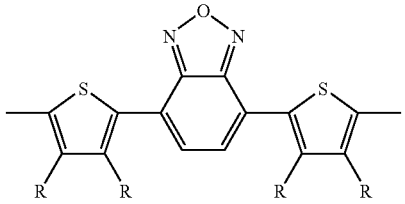

124

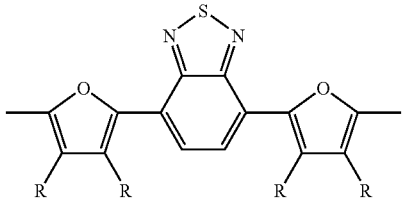

125

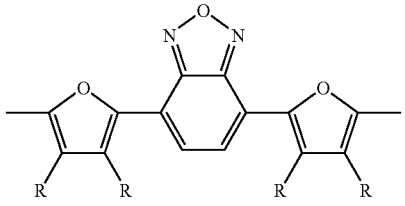

In the present invention, the divalent group having metal-complex structure is a divalent group in which two hydrogen atoms are removed from the organic ligand of the metal complex.

The number of carbon atoms of the organic ligand is usually about 4 to 60. Examples of the organic ligand include 8-quinolinol and its derivatives, benzoquinolinol and its derivatives, 2-phenyl-pyridine and its derivatives, 2-phenyl-benzothiazole and its derivatives, 2-phenyl-benzoxazole and its derivatives, porphyrin and its derivative, etc. are exemplified.

As the central metal of the complex, for example, aluminum, zinc, beryllium, iridium, platinum, gold, europium, terbium, etc. are exemplified.

As the metal complex having an organic ligand, exemplified are a metal complex and a triplet luminescence complex which are known as a low molecular weight fluorescent material or a phosphorescent material.

Specifically as the divalent group having metal-complex structure, the followings (126–132) are exemplified.

126
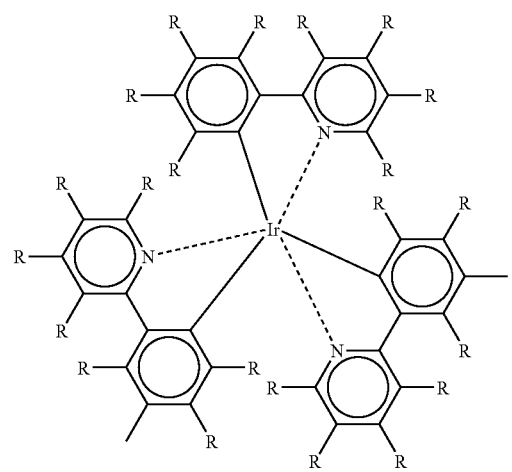
127
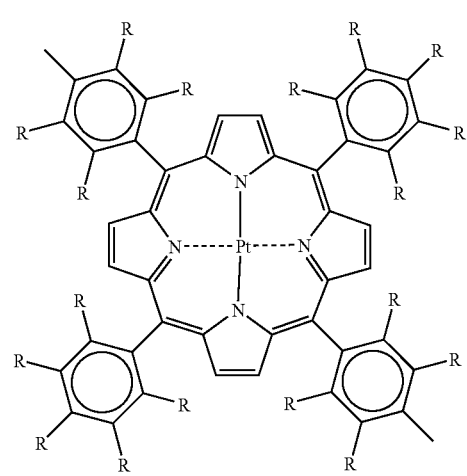
128
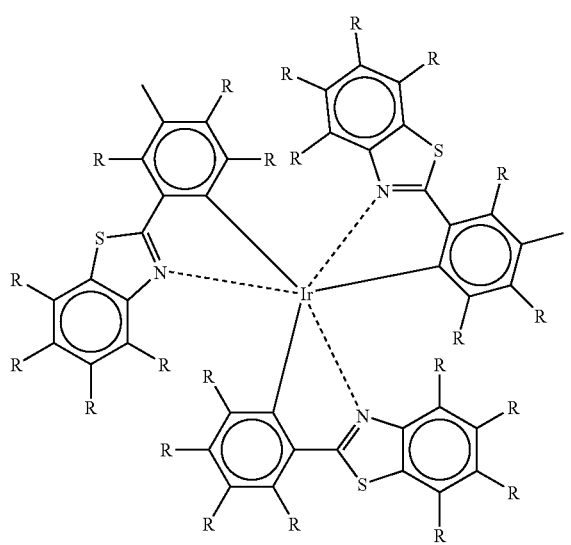
129
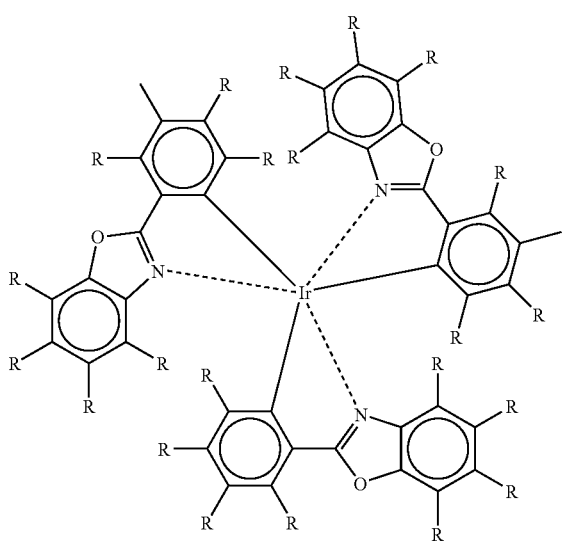
130
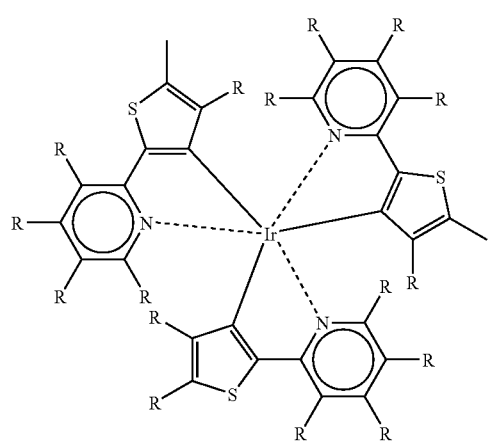
131
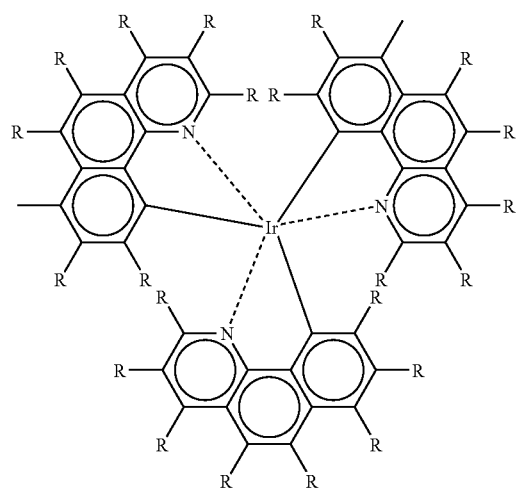

132

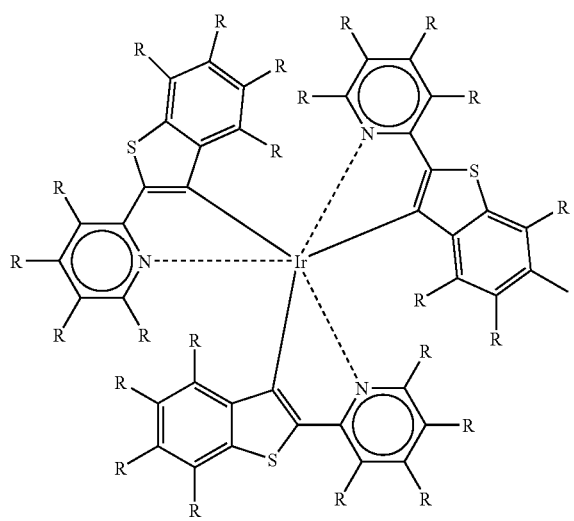

In the example shown by the above formulas 1–132, R represents each independently a hydrogen atom, alkyl group, alkoxy group, alkylthio group, aryl group, aryloxy group, arylthio group, arylalkyl group, arylalkoxy group, aryl alkylthio group, arylalkenyl group, arylalkynyl group, amino group, substituted amino group, silyl group, substituted silyl group, halogen atom, acyl group, acyloxy group, imino group, amide group, imide group, monovalent heterocyclic group, carboxyl group, substituted carboxyl group or cyano group.

The carbon atom contained in the group represented by formulas 1–132 may be replaced with a nitrogen atom, oxygen atom, or sulfur atom, and the hydrogen atom may be replaced with a fluorine atom.

Among the repeating units represented by formula (3), the repeating units represented by below formula (7), (8), (9), (10), (11), or (12) are preferable.

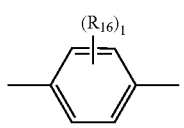

(7)

In the formula, $R_{16}$ represents an alkyl group, alkoxy group, alkylthio group, aryl group, aryloxy group, arylthio group, arylalkyl group, arylalkoxy group, arylalkylthio group, aryl alkenyl group, arylalkynyl group, amino group, substituted amino group, silyl group, substituted silyl group, halogen atom, acyl group, acyloxy group, imino group, amide group, imide group, monovalent heterocyclic group, carboxyl group, substituted carboxyl group, or cyano group. l represents an integer of 0–4. When $R_{16}$ exists in plural, a plurality of them may be the same or different.

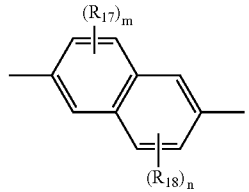

(8)

In the formula, $R_{17}$ and $R_{18}$ represent each independently an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, alogen atom, acyl group, acyloxy group, imino group, amide group, imide group, monovalent heterocyclic group, carboxyl group, substituted carboxyl group, or cyano group. m and n represent each independently an integer of 0–3. When $R_{17}$ and $R_{18}$ exist in plural, respectively, a plurality of them may be the same or different.

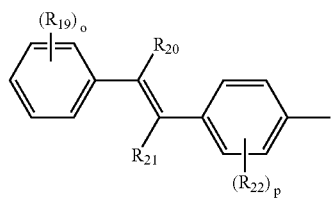

(9)

In the formula, $R_{19}$ and $R_{22}$ represent each independently an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imino group, amide group, imide group, monovalent heterocyclic group, carboxyl group, substituted carboxyl group, or cyano group. o and p each independently represent an integer of 0–4. $R_{20}$ and $R_{21}$ represent each independently a hydrogen atom, alkyl group, aryl group, monovalent heterocyclic group, carboxyl group, substituted carboxyl group, or cyano group. When $R_{19}$ and $R_{22}$ exist in plural, respectively, a plurality of them may be the same or different.

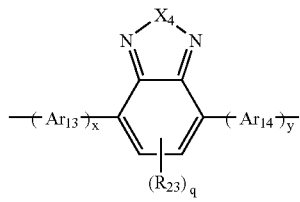

(10)

In the formula, $R_{23}$ represents an alkyl group, alkoxy group, alkylthio group, aryl group, aryloxy group, arylthio group, arylalkyl group, arylalkoxy group, arylalkylthio group, aryl alkenyl group, arylalkynyl group, amino group, substituted amino group, silyl group, substituted silyl group, halogen atom, acyl group, acyloxy group, imino group, amide group, imide group, monovalent heterocyclic group, carboxyl group, substituted carboxyl group, or cyano group. q represents an integer of 0–2. $Ar_{13}$ or $Ar_{14}$ each independently represent an arylene group, a divalent heterocyclic group, or a divalent group having metal-complex structure. x and y each independently represent 0 or 1.

$X_4$ represents O, S, SO, SO2, Se, or Te. When $R_{23}$ exists in plural, a plurality of them may be the same or different.

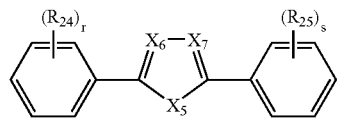

(11)

In the formula, $R_{24}$ and $R_{25}$ each independently represent an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imino group, amide group, imide group, monovalent heterocyclic group, carboxyl group, substituted carboxyl group, or cyano group. r and s each independently represent an integer of 0–4. $X_5$ shows O, S, $SO_2$, Se, Te, N—$R_{26}$, or $SiR_{27}R_{28}$. $X_6$ and $X_7$ each independently represent N or C—$R_{29}$. $R_{26}$, $R_{27}$, $R_{28}$, and $R_{29}$ each independently represent a hydrogen atom, an alkyl group, aryl group, arylalkyl group, or monovalent heterocyclic group. When $R_{24}$, $R_{25}$, and $R_{29}$ exist in plural, respectively, a plurality of them may be the same or different.

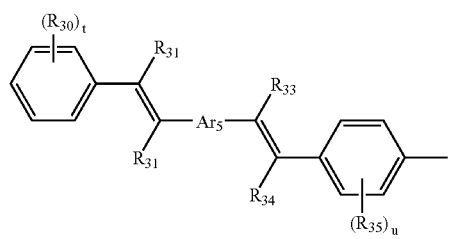

(12)

In the formula, $R_{30}$ and $R_{35}$ each independently represent an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imino group, amide group, imide group, monovalent heterocyclic group, carboxyl group, substituted carboxyl group, or cyano group. t and u each independently represent an integer of 0–4. $R_{31}$, $R_{32}$, $R_{33}$, and $R_{34}$ each independently represent a hydrogen atom, alkyl group, aryl group, monovalent heterocyclic group, carboxyl group, substituted carboxyl group, or cyano group. $Ar_5$ represents an arylene group, a divalent heterocyclic group, or a divalent group having metal-complex structure. When $R_{30}$ and $R_{35}$ exist in plural, respectively, a plurality of them may be the same or different.

Specific examples of the repeating unit represented by the above formula (7) include the followings.

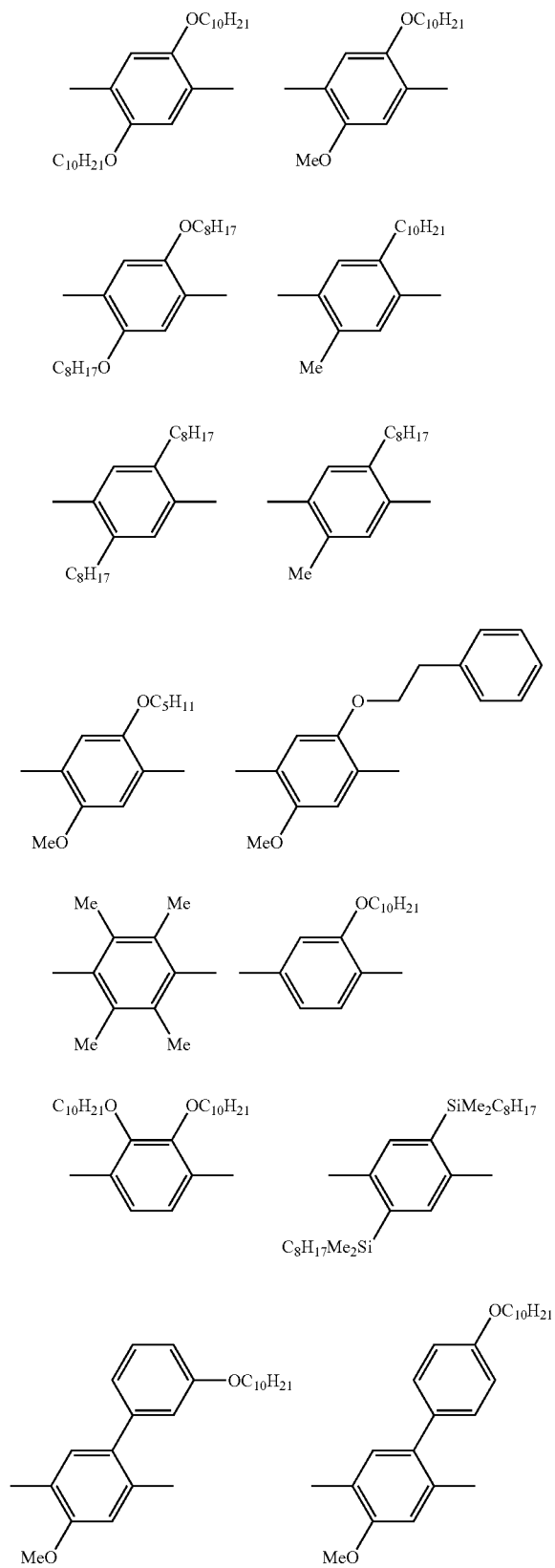

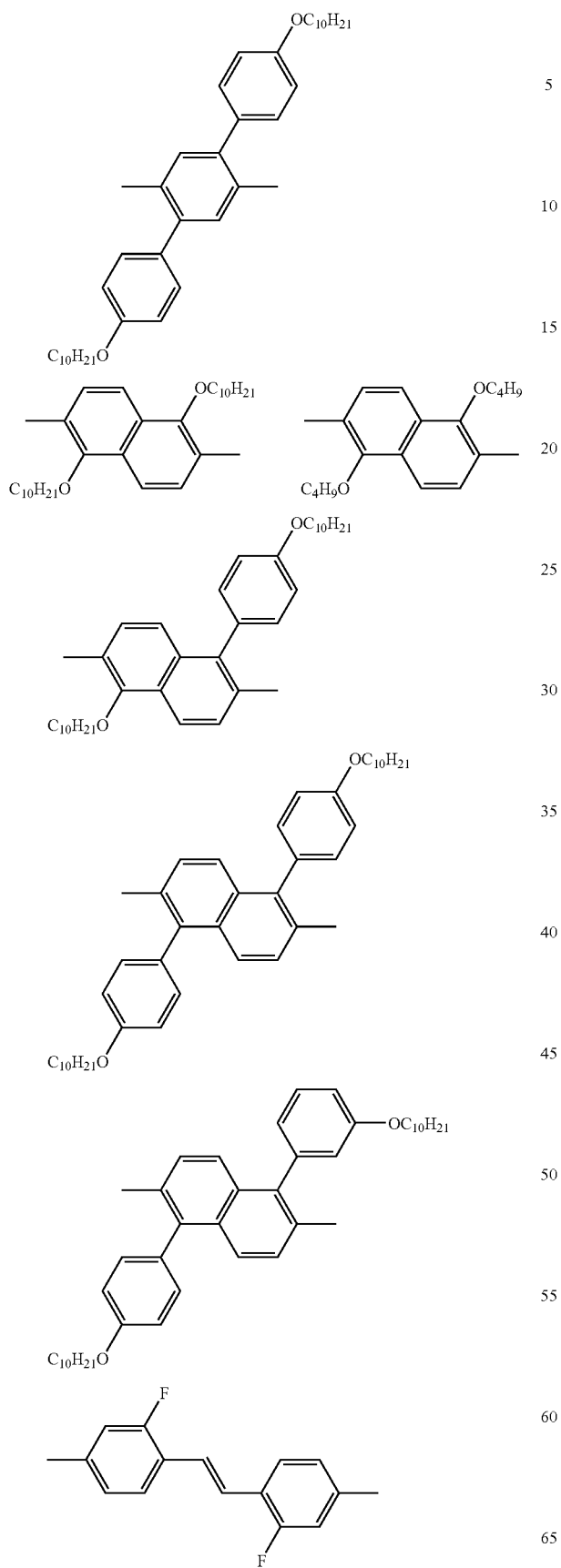
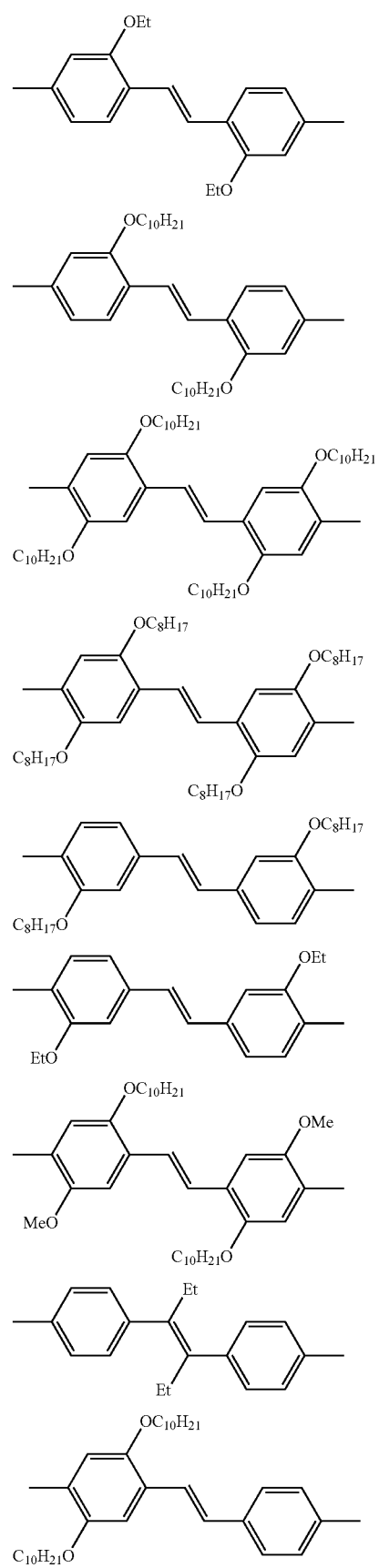

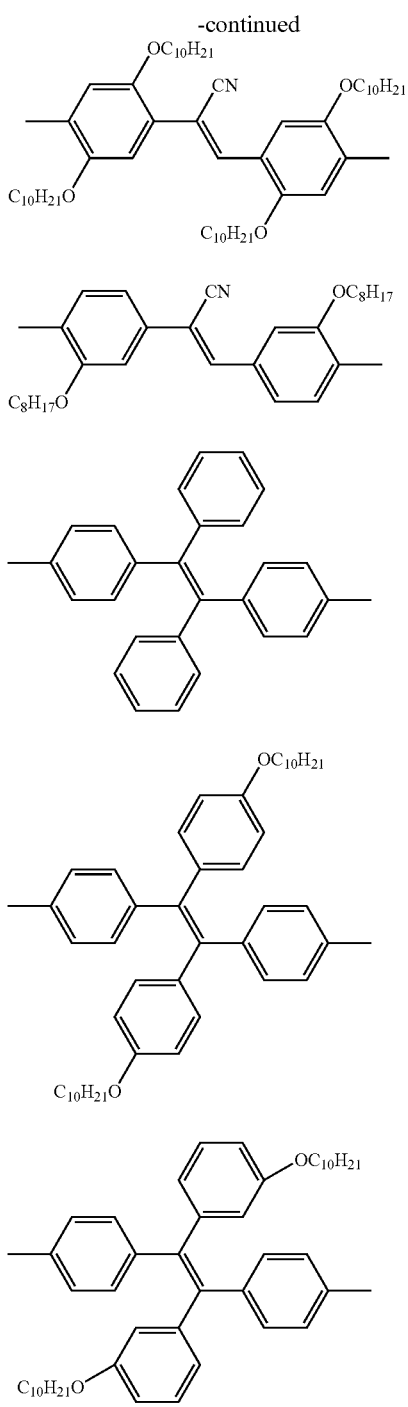

Among the repeating units represented by the above formula (4), the repeating unit represented by the below formula (13) is preferable.

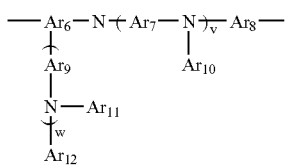

In the formula, $Ar_6$, $Ar_7$, $Ar_8$, and $Ar_9$ represent each independently an arylene group or a divalent heterocyclic group. $Ar_{10}$, $Ar_{11}$, and $Ar_{12}$ represent each independently an aryl group or a monovalent heterocyclic group. $Ar_6$, $Ar_7$, $Ar_8$, $Ar_9$, and $Ar_{10}$ may have a substituent. v and w represent each independently an integer of 0 or 1, and $0<=v+w<=1$. Specific examples of the repeating units represented by the above formula (13), include the followings represented by formulas 133–140.

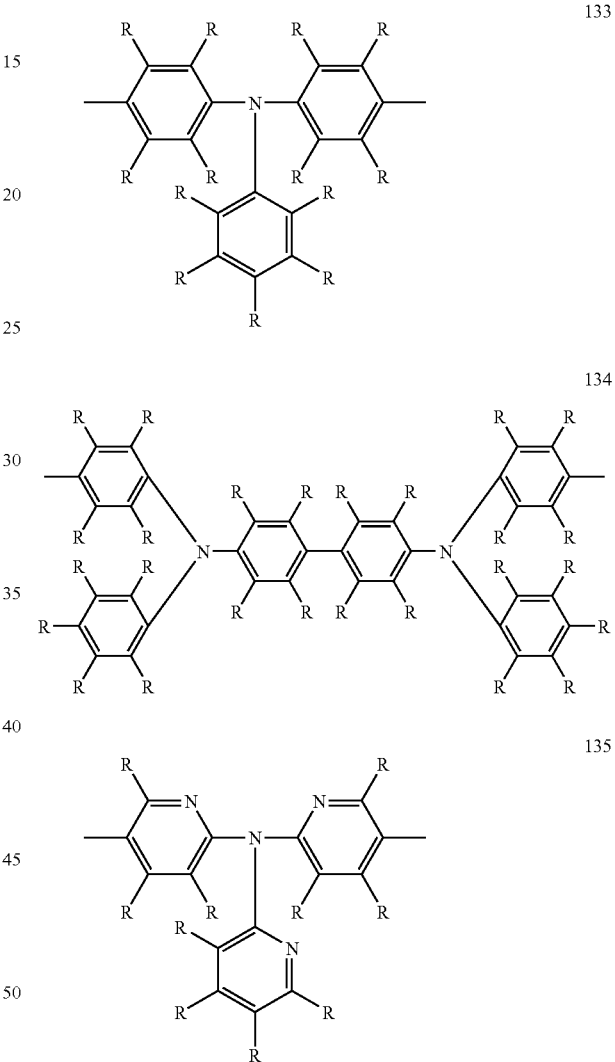

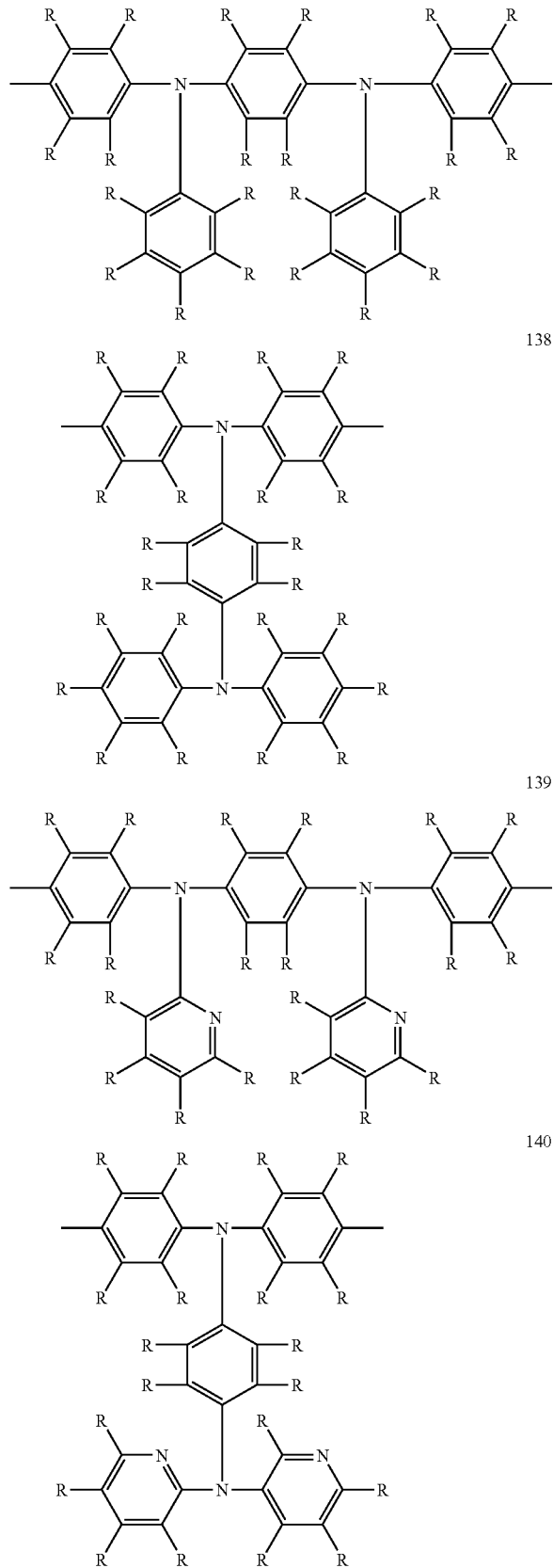

In the above formula, R is the same as those of the above formulas 1–132. In formulas 1–140, a plurality of Rs are contained in one structural formula, and they may be the same or different. In order to improve the solubility in a solvent, it is preferable to have one or more substituents other than hydrogen, and it is more preferable that the symmetry of the repeating unit including the substituent is little.

Furthermore, when R contains an aryl group or a heterocyclic group as a part of the above formula, it may further have one more or more substituents.

In the above examples of substituent R containing an alkyl chain as a part thereof, they may be linear, branched or cyclic one, or the combination thereof. As the alkyl chain which is not linear, exemplified are isoamyl group, 2-ethylhexyl group, 3,7-dimethyloctyl group, cyclohexyl group, 4-$C_1$–$C_{12}$ alkylcyclohexyl group, etc. In order to improve the solubility of the polymer compound into a solvent, it is preferable that a linear or branched alkyl chain is contained in one or more substituents.

Moreover, a plurality of Rs may be connected to form a ring. Furthermore, when R contains an alkyl chain, said alkyl chain may be interrupted by a group containing a hetero atom. Here, as the hetero atom, an oxygen atom, a sulfur atom, a nitrogen atom, etc. are exemplified.

Among them, the repeating units represented by the below formula (13-2) is preferable.

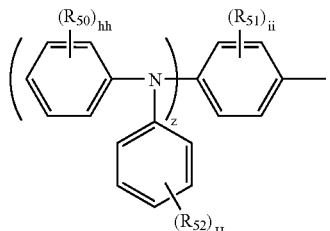

(13-2)

In the formula, $R_{50}$, $R_{51}$, and $R_{52}$ represent each independently an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imino group, amide group, imide group, monovalent heterocyclic group, carboxyl group, substituted carboxyl group, or cyano group. hh, ii, and jj each independently represent an integer of 0–4. z represents an integer of 0–2. When $R_{50}$, $R_{51}$, and $R_{52}$ exist in plural, respectively, a plurality of them may be the same or different.

The polymer compound of the present invention may contain a repeating unit other than the repeating unit represented by the above formula (1-1), (1-2) and formulas (3)–(13) within a range of not injuring light-emission characteristics or charge transportation characteristics. Moreover, these repeating units and other repeating units may be connected with non-conjugated unit, and the non-conjugated portions thereof may be contained in the repeating units. As the connected structure, the followings and a combination of two or more of them are exemplified. Here, R is a group selected from the same substituents as the above-mentioned, and Ar represents a hydrocarbon group of 6–60 carbon atoms.

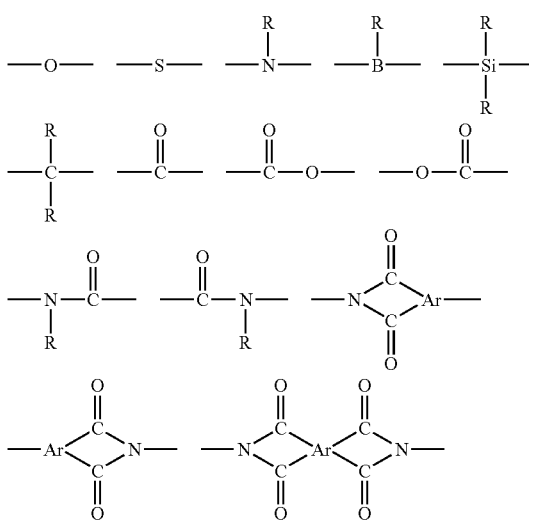

The polymer compound may also be a random, block or graft copolymer, or a polymer having an intermediate structure thereof, for example, a random copolymer having block property. From the viewpoint for obtaining a polymer compound having high fluorescent or phosphorescent quantum yield, random copolymers having block property and block or graft copolymers are more preferable than complete random copolymers. Further, the polymer compound may have a branched main chain and more than three terminals. Moreover, the polymer compound may be a dendrimer.

Furthermore, the end group of polymer compound may also be protected with a stable group since if a polymerization active group remains intact, there is a possibility of reduction in light emitting property and life-time when made into an device. Those having a conjugated bond continuing to a conjugated structure of the main chain are preferable, and there are exemplified structures connected to an aryl group or heterocyclic compound group via a carbon-carbon bond. Specifically, substituents of the chemical formula 10 in JP 9-45478A are exemplified.

The polystyrene reduced number average molecular weight of the polymer compound of the present invention is $10^3$–$10^8$, and preferably $10^4$–$10^6$.

As a good solvent for the polymer compound of the present invention, exemplified are chloroform, methylene chloride, dichloroethane, tetrahydrofuran, toluene, xylene, mesitylene, tetralin, decalin, n-butylbenzene, etc. It can be dissolved in the solvent usually 0.1% by weight or more, although it depends on the structure and the molecular weight of the polymer compound.

Next, the process for producing the polymer compound of the present invention is explained.

The polymer compound of the present invention can be produced by the below method.

(Method A) Carrying out condensation polymerization of a compound having two substituents capable of condensation polymerization, corresponding formula (1-1) or (1-2). In case of X=S, the polymer compound can be produced by:

(Method B) Carrying out condensation polymerization of a compound having two substituents whose X=SO$_2$ capable of condensation polymerization, corresponding formula (1-1) or (1-2), and then reducing the obtained polymer; or (Method C) Carrying out condensation polymerization of a compound having two substituents whose X=SO capable of condensation polymerization, corresponding formula (1-1) or (1-2), and then reducing the obtained polymer.

For example, the polymer compound of the present invention can be produced by carrying out condensation polymerization with using a compound represented by Formula (14) as one of raw materials,

wherein, U represents a repeating unit represented by the above formula (1-1) or (1-2), and $Y_1$ and $Y_2$ each independently represent a substituent capable of condensation polymerization. (Method A)

By using compounds represented by the below formula (15-1), (15-2), and (15-3), as a compound of the above formula (14), polymer compounds having a repeating unit represented by the below formula (15-4), (15-5) and (15-6), can be obtained, respectively.

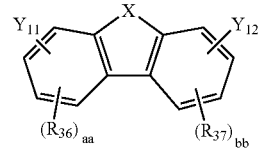

(15-1)

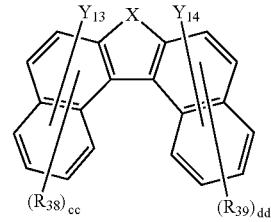

(15-2)

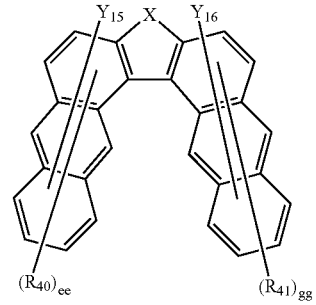

(15-3)

(wherein, $Y_{11}$, $Y_{12}$, $Y_{13}$, $Y_{14}$, $Y_{15}$, and $Y_{16}$ each independently represent a substituent capable of condensation polymerization. X represents S or O. $R_{36}$, $R_{37}$, $R_{38}$, $R_{39}$, $R_{40}$, and $R_{41}$ represent each independently an alkyl group, an alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imino group, amide group, imide group, monovalent heterocyclic group, carboxyl group, substituted carboxyl group, or cyano group. aa and bb each independently represent an integer of 0–3. cc and dd each independently represent an integer of 0–5. ee and gg each independently represent an integer of 0–7. Each of aa+bb, cc+dd, and ee+gg is one or more. When $R_{36}$, $R_{37}$, $R_{38}$, $R_{39}$, $R_{40}$, and $R_{41}$ exist in plural, respectively, a plurality of them may be the same or different).

In the above formula (15-2), the substituents $Y_{13}$, $Y_{14}$, $R_{38}$ and $R_{39}$ may substitute on any carbon atoms of two benzene rings constituting the condensed aromatic ring.

In the above formula (15-3), the substituents $Y_{15}$, $Y_{16}$, $R_{40}$ and $R_{41}$ may substitute on any carbon atoms of three benzene rings constituting the condensed aromatic ring.

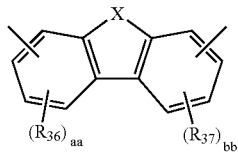
(15-4)

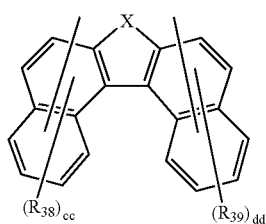
(15-5)

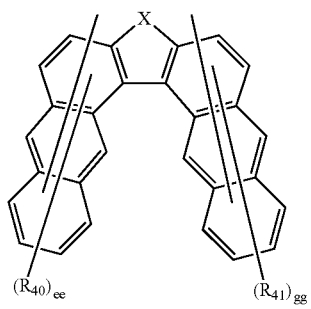
(15-6)

Examples of the compounds represented by the above formula (15-1), (15-2), or (15-3) include compounds represented by below formula (15-7), (15-8) or (15-9),

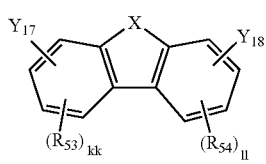
(15-7)

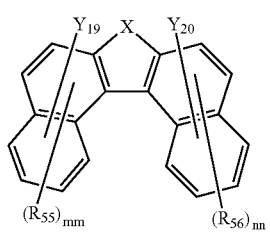
(15-8)

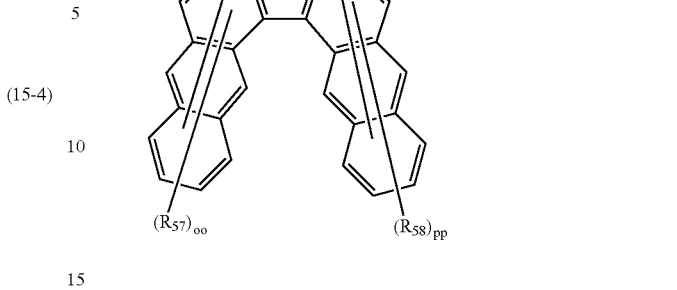
(15-9)

wherein, $Y_{17}$, $Y_{18}$, $Y_{19}$, $Y_{20}$, $Y_{21}$, and $Y_{22}$ each independently represent a halogen atom, alkyl sulfonate group, aryl sulfonate group, arylalkyl sulfonate group, boric ester group, sulfonium methyl group, phosphonium methyl group, a phosphonate methyl group, monohalogenated methyl group, boric acid group, formyl group, cyano group, or vinyl group. X represents S or O. $R_{53}$, $R_{54}$, $R_{55}$, $R_{56}$, $R_{57}$, and $R_{58}$ each independently represent an alkyl group having 3 or more carbon atoms, alkoxy group having 3 or more carbon atoms, alkylthio group having 3 or more carbon atoms, aryl group, aryloxy group, arylthio group, arylalkyl group, arylalkoxy group, arylalkylthio group, substituted amino group having 4 or more carbon atoms, and substituted silyl group having 6 or more carbon atoms. kk and ll each independently represent an integer of 0–3. mm and nn each independently represent an integer of 0–5. oo and pp each independently represent an integer of 0–7. Each of kk+ll, mm+nn, and oo+pp is one or more. When $R_{53}$, $R_{54}$, $R_{55}$, $R_{56}$, $R_{57}$, and $R_{58}$ exist in plural, respectively, a plurality of them may be the same or different.

In the above formula (15-8), the substituents $Y_{19}$, $Y_{20}$, $R_{55}$ and $R_{56}$ may substitute on any carbon atoms of two benzene rings constituting the condensed aromatic ring.

In the above formula (15-3), the substituents $Y_{21}$, $Y_{22}$, $R_{57}$ and $R_{58}$ may substitute on any carbon atoms of three benzene rings constituting the condensed aromatic ring.

In the case of X=S, a compound represented by the below formula (15-10) is further preferable.

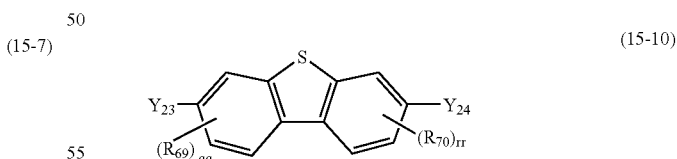
(15-10)

wherein, $Y_{23}$ and $Y_{24}$ represent a bromine atom, chlorine atom, alkyl sulfonate group, aryl sulfonate group, arylalkyl sulfonate group, boric ester group, sulfonium methyl group, phosphonium methyl group, phosphonate methyl group, and boric acid group. $R_{69}$ and $R_{70}$ each independently represent an alkyl group having 3 or more carbon atoms, an alkoxy group having 3 or more carbon atoms, an alkylthio group having 3 or more carbon atoms, aryl group, aryloxy group, arylthio group, arylalkyl group, arylalkoxy group, arylalkylthio group, substituted amino group having 4 or more carbon atoms, and substituted silyl group having 6 or more carbon atoms. qq and rr each independently represent an integer of 0–3, and qq+rr is one or more. When $R_{69}$ and $R_{70}$ exist in plural, respectively, a plurality of them may be the same or different.

Moreover, in case of X=O, a compound represented by the below formula (15-11) is further preferable.

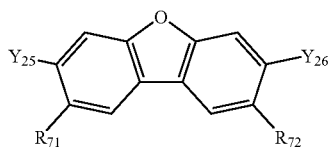

(15-11)

wherein, $Y_{25}$ and $Y_{26}$ represent a bromine atom, chlorine atom, alkyl sulfonate group, aryl sulfonate group, arylalkyl sulfonate group, boric ester group, sulfonium methyl group, phosphonium methyl group, phosphonate methyl group, and boric acid group. $R_{71}$ and $R_{72}$ each independently represent an alkyl group having 3 or more carbon atoms, an alkoxy group having 3 or more carbon atoms, an alkylthio group having 3 or more carbon atoms, aryl group, aryloxy group, arylthio group, arylalkyl group, arylalkoxy group, arylalkylthio group, substituted amino group having 4 or more carbon atoms, and substituted silyl group having 6 or more carbon atoms.

Moreover, in case of X=S, the polymer compound of the present invention can be produced by carrying out condensation polymerization of a compound represented by the below formula (22), and then reduction thereof. (Method B)

$$Y_1-V-Y_2 \quad (22)$$

wherein, V represents a repeating unit having a structure of X=SO corresponding to the above U. $Y_1$ and $Y_2$ are the as above-mentioned.

The reduction can be performed according to the below mentioned method of the producing process of compound (14) from a compound of formula (22). The repeating unit V having thiophene-sulfone structure corresponding to each U is as follows.

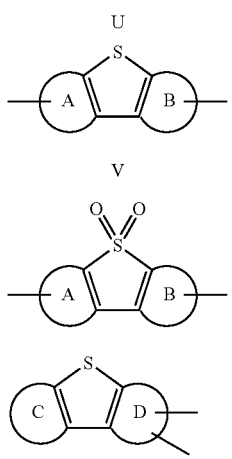

(1-1)

(22-1)

(1-2)

(22-2)

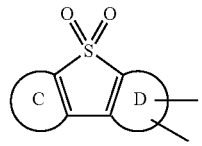

For example, by carrying out condensation polymerization of a compound of below formula (15-12) as a compound of formula (22-1), then reducing the product with using a reducing agent, a polymer compound having a repeating unit represented by the above formula (15-1) can be obtained.

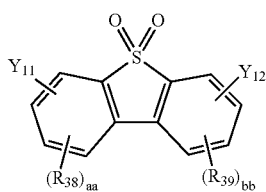

(15-12)

wherein, $Y_{11}$, $Y_{12}$, $R_{38}$, $R_{39}$, aa, and bb are the same as above-mentioned.

The polymer compound of the present invention can be obtained also by carrying out condensation polymerization of a compound of formula (23), and then reducing the product. (Method c)

$$Y_1-W-Y_2 \quad \text{Formula (23)}$$

wherein, W represents a repeating unit having a structure represented by X=SO corresponding to the above U. $Y_1$ and $Y_2$ are the same as above-mentioned.

The repeating-unit W having thiophene structure corresponding to each U is as follows.

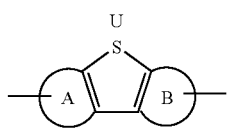

(1-1)

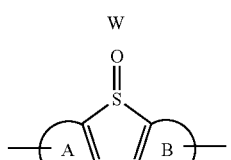

(23-1)

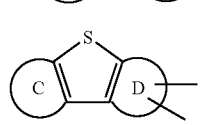

(1-2)

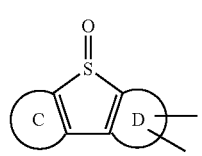

(23-2)

For example, by carrying out condensation polymerization of a compound of below formula (15-13) as a compound of formula (23-1), then reducing the product with using a reducing agent, a polymer compound having a repeating unit represented by the above formula (15-1) can be obtained.

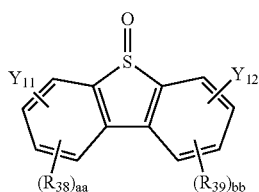

(15-13)

wherein, $Y_{11}$, $Y_{12}$, $R_{38}$, $R_{39}$, aa, and bb are the same as above-mentioned.

In the process of the present invention, as the substituent capable of condensation polymerization, exemplified are a halogen atom, alkyl sulfonate group, arylsulfonate group, arylalkylsulfonate group, boric ester group, sulfonium methyl group, phosphonium methyl group, phosphonate methyl group, monohalogenated-methyl group, boric acid group, formyl group, cyano group, vinyl group, etc.

Here, as the alkylsulfonate group, exemplified are methane sulfonate group, ethane sulfonate group, trifluoromethane sulfonate group, etc. As the arylsulfonate group, exemplified are benzene sulfonate group, p-toluene sulfonate group, etc. As the arylsulfonate group, exemplified are benzylsulfonate group etc.

As the boric ester group, exemplified are the groups represented by the below formula.

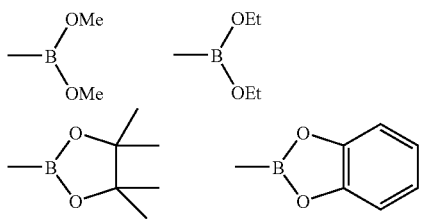

In the formula, Me represents methyl group and Et represents ethyl group.

As the sulfonium methyl group, exemplified are the groups represented by the below formula.

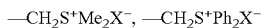

(X represents a halogen atom and Ph represents phenyl group.)

As the phosphonium methyl group, exemplified are the groups represented by the below formula.

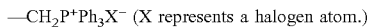

(X represents a halogen atom.)

As the phosphonate methyl group, exemplified are the groups represented by the below formula.

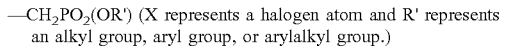

(X represents a halogen atom and R' represents an alkyl group, aryl group, or arylalkyl group.)

As the monohalogenated-methyl group, exemplified are fluoromethyl group, methyl-chloride group, bromomethyl group, and iodomethyl group.

Preferable substituents as a substituent capable of condensation polymerization depend upon a kind of polymerization reaction. For example, when using a zero-valent nickeckel complex, such as Yamamoto coupling reaction, exemplified are a halogen atom, alkyl sulfonate group, aryl sulfonate group, or arylalkyl sulfonate group. When using a nickel catalyst or a palladium catalyst, such as Suzuki coupling reaction, exemplified are an alkyl sulfonate group, halogen atom, boric ester group, boric acid group, etc.

When the polymer compound of the present invention has a repeating units other than a thiophene condensed ring unit, a condensation polymerization can be carried out under the existence of a compound having two substituents capable of condensation polymerization as the repeating unit other than the thiophene condensed ring unit.

As the compound having two substituents capable of condensation polymerization used as a repeating unit other than formula (1-1) and (1-2), exemplified are the compounds of above formula (16)–(19).

 (16)

 (17)

 (18)

 (19)

wherein, $Ar_1$, $Ar_2$, $Ar_3$, $Ar_4$, ff, $x_1$, $x_2$, and $X_3$ are the same as the above. $Y_3$, $Y_4$, $Y_5$, $Y_6$, $Y_7$, $Y_8$, $Y_9$, and $Y_{10}$ each independently represent a substituent capable of condensation polymerization.

As the compound having two substituents capable of condensation polymerization used as a repeating unit other than formula (1-1) and (1-2), the compound represented by the below formula (24-1) is preferable.

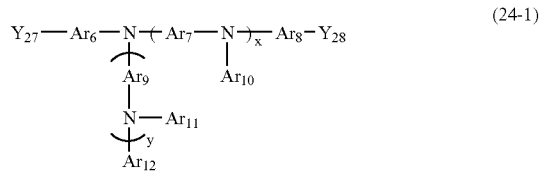

(24-1)

wherein, $Ar_6$, $Ar_7$, $Ar_8$, $Ar_9$, $Ar_{10}$, $Ar_{11}$, $Ar_{12}$, x, and y are the same as the above. $Y_{27}$ and $Y_{28}$ each independently represent a substituent capable of condensation polymerization.

A compound represented by formula (24-2) is further preferable.

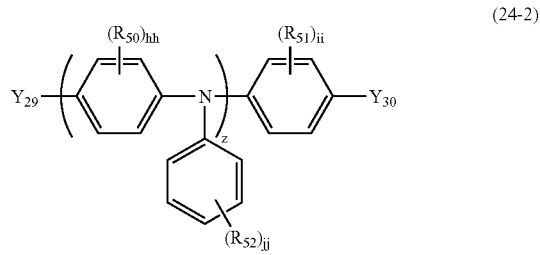

(24-2)

wherein, $R_{50}$, $R_{51}$, $R_{52}$, hh, ii, jj, and z are the same as the above. $Y_{29}$ and $Y_{30}$ each independently represent a substituent capable of condensation polymerization.

Specifically, a compound used as a monomer, having a plurality of reactive substituents is dissolved, if necessary, in an organic solvent, and can be reacted at the melting temperature or more and the boiling point or less of the organic solvent using an alkali or suitable catalyst, for example. For example, known methods can be used, described in "Organic Reactions", vol. 14, pp. 270 to 490, John Wiley & Sons, Inc., 1965, "Organic Reactions", vol. 27, pp. 345 to 390, John Wiley & Sons, Inc., 1982, "Organic Synthesis", Collective Volume VI, pp. 407 to 411, John Wiley & Sons, Inc., 1988, Chemical Review, vol. 95, p. 2457 (1995), Journal of Organometallic Chemistry, vol. 576, p. 147 (1999), Journal of Praktical Chemistry, vol. 336, p. 247 (1994), Makromolecular Chemistry Macromolecular Symposium, vol. 12, p. 229 (1987), and the like.

In a method of producing the polymer compound of the present invention, as the method of carrying out condensation polymerization, a known condensation reaction can be used according to the substituent of the compound represented by the above formula (14)–(24-2) capable of condensation polymerization.

When the polymer compound of the present invention generates a double bond in the condensation polymerization, a method recited in JP 5-202355A is exemplified. Namely, exemplified are: a polymerization by Wittig reaction of a compound having formyl group and a compound having phosphonium methyl group, or a compound having formyl group and a compouond having phosphonium methyl group; a polymerization by Heck reaction of a compound having vinyl group and a compound having halogen atom; a polycondensation by dehydrohalogenation method of a compound having two or more mono-halogenated methyl group; a polycondensation by the sulfonium-salt decomposition method of a compound having two or more sulfonium methyl groups; a polymerization by Knoevenagel reaction of a compound having a formyl group and a compound having cyano group; a polymerization by McMurry reaction of a compound having two or more formyl groups, etc.

When a polymer compound of the present invention generates a triple bond in the main chain in condensation polymerization, for example, Heck reaction can be used.

Moreover, when neither a double bond nor a triple bond is generated, exemplified are: a polymerizing method of a corresponding monomer by Suzuki coupling reaction; a polymerizing method by Grignard reaction; a polymerizing method by nickel (0) complex; a polymerizing method by an oxidizing agent such as $FeCl_3$; an electrochemical oxidation polymerization method; or a method by decomposition of an intermediate polymer having a suitable leaving group.

Of these, the polymerization method by a Wittig reaction, the polymerization method by a Heck reaction, the polymerization method by a Knoevenagel reaction, the polymerization method by a Suzuki coupling reaction, the polymerization method by a Grignard reaction and the polymerization method using a Ni(0) catalyst are preferable since structure control is easy in these methods.

In the manufacture methods of the present invention, it is preferable is that $Y_1, Y_2, Y_3, Y_4, Y_5, Y_6, Y_7, Y_8, Y_9$, and $Y_{10}$ are each independently a halogen atom, alkyl sulfonate group, aryl sulfonate group, or arylalkyl sulfonate group, and condensation polymerization is carried out under the existence of zerovalent nickel complex.

As the raw material compounds, a dihalogenated compound, bis (alkylsulfonate)compound, bis (arylsulfonate)compound, bis (arylalkylsulfonate) compound or halogen-alkyl sulfonate compound, halogen-aryl sulfonate compound, halogen-arylalkyl sulfonate compound, alkylsulfonate-aryl sulfonate compound, alkylsulfonate-arylalkyl sulfonate compound are exemplified.

Moreover, in the manufacture method of the present invention, it is preferable that $Y_1, Y_2, Y_3, Y_4, Y_5, Y_6, Y_7, Y_8, Y_9$, and $Y_{10}$ are each independently a halogen atom, alkyl sulfonate group, arylsulfonate group, arylalkylsulfonate group, boric acid group or boric ester group, and The ratio of the total moles (J) of a halogen atom, alkylsulfonate group, aryl sulfonate group, and arylalkyl sulfonate group, to the total moles (K) of the boric acid group and boric ester group is substantially 1 (K/J is usually in the range of 0.7–1.2), and condensation polymerization is carried out using a nickel catalyst or a palladium catalyst.

As the concrete combination of the raw material compounds, exemplified is a combination of dihalogenated compound, bis(alkylsulfonate)compound, a bis (arylsulfonate)compound or bis(arylalkylsulfonate) compound, with diboric acid compound or diboric ester compound.

Moreover, exemplified are halogen-boric acid compound, halogen-boric ester compound, alkylsulfonate-boric acid compound, alkylsulfonate-boric ester compound, aryl sulfonate-boric acid compound, arylsulfonate-boric ester compound, arylalkylsulfonate-boric acid compound, arylalkylsulfonate-boric acid compound, and arylalkylsulfonate-boric ester-compound.

It is preferable that the organic solvent used is subjected to a deoxygenation treatment sufficiently and the reaction is progressed under an inert atmosphere, generally for suppressing a side reaction, though the treatment differs depending on compounds and reactions used. Further, it is preferable to conduct a dehydration treatment likewise (however, this is not applicable in the case of a reaction in a two-phase system with water, such as a Suzuki coupling reaction).

For the reaction, an alkali or suitable catalyst is added appropriately. These may be selected according to the reaction used. It is preferable that the alkali or catalyst is soluble sufficiently in a solvent used for the reaction. As the method of mixing an alkali or catalyst, there is exemplified a method of adding a solution of an alkali or catalyst slowly while stirring under an inner atmosphere of argon and nitrogen and the like or a method of slowly adding the reaction solution to a solution of an alkali or catalyst, inversely.

When these polymer compounds are used as a light-emitting material of a polymer LED, the purity thereof exerts an influence on light emitting property, therefore, it is preferable that a monomer is purified by a method such as distillation, sublimation purification, re-crystallization and the like before being polymerized and further, it is preferable to conduct a purification treatment such as re-precipitation purification, chromatographic separation and the like after the synthesis.

In case of X═S, the compound represented by the above formula (14) can be produced by reducing the compounds of below formula (22) or (23), with using a reducing agent.

 (22)

 (23)

wherein, V represents a repeating unit having the structure of X═$SO_2$ corresponding to the above U. W represents a repeating unit having the structure of X═SO corresponding to the above U. $Y_1$ and $Y_2$ are the same as above-mentioned.

For example, the dibenzothiophene derivative represented by the above formula (15-1) can be produced by reducing the compound represented by the below formula (15-12) with using a reducing agent.

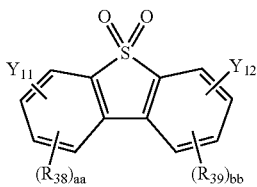

(15-12)

wherein, $Y_{11}$, $Y_{12}$, $R_{38}$, $R_{39}$, aa, and bb are the same as above-mentioned.

The reducing agent is not specially limited, and examples thereof include, titanium compounds, such as titanium trichloride; silane compounds, such as trichlorosilane; aluminium hydride compounds, such as aluminium hydride, di-i-butyl aluminium hydride, lithium aluminium hydride, trimethoxy aluminum lithium hydride, tri-t-butoxy aluminum lithium hydride, aluminum sodium hydride, triethoxy aluminum sodium hydride, bis(2-methoxyethoxy) aluminum sodium hydride, diethylaluminum sodium hydride; diboranes or substituted borane compounds such as diborane, dichloroborane, 2,3-dimethyl-2-butylborane, bis-3-methyl-2-butylborane, diisopinocamphenylborane, dicyclo hexylborane, 9-borabicyclo[3,3,1]nonane, boron hydride metal compounds, such as lithium borohydride, lithium borohydride cyanide, triethylboron lithium hydride, s-butylboron lithium hydride, t-butylboron lithium hydride, sodium borohydride, trimethoxyboron sodium hydride, and sodium borohydride sulfide; composites, such as tetrafluoroboric acid trimethyl oxonium—sodium borohydride, sodium borohydride—cobalt chloride, and methyl fluorosulfate-sodium borohydride cyanide, etc.

Among them, aluminium hydride compounds are preferable, and lithium aluminium hydride is especially preferable.

The reduction reaction can be carried out in a solvent under an inert atmosphere, such as nitrogen or argon. The temperature of the reaction is preferably from −80° C. to a boiling point of the solvent.

As the solvents, exemplified are: saturated hydrocarbons, such as pentane, hexane, heptane, octane, and cyclohexane; unsaturated hydrocarbons, such as benzene, toluene, ethylbenzene, and xylene; halogenated saturated hydrocarbons, such as carbon tetrachloride, chloroform, dichloromethane, chlorobutane, bromobutane, chloropentane, bromopentane, chlorohexane, bromohexane, chlorocyclohexane, and bromocyclohexane; halogenated unsaturated hydrocarbons, such as chlorobenzene, dichlorobenzene, and trichlorobenzene; alcohols, such as methanol, ethanol, propanol, isopropanol, butanol, and t-butyl alcohol; carboxylic acids, such as formic acid, acetic acid, and propionic acid; ethers, such as dimethylether, diethylether, methyl-t-butyl ether, tetrahydrofuran, tetrahydropyran, and dioxane; amines, such as trimethylamine, triethylamine, N,N,N',N'-tetramethylethylenediamine, and pyridine; amides, such as N,N-dimethylformamide, N,N-dimethylacetamide, N,N-diethylacetamide and N-methylmorpholine oxide, etc. The solvent can be used alone or a mixtures thereof. Among them. etheres are preferable, and tetrahydrofuran and diethylether are more preferable.

As the post-treatment, a usual method is available, for example, quenching with water, and extracting by an organic solvent, and then distilling the solvent. Isolation and purification of the product can be performed by methods such as fractionation by chromatography, or recrystallization.

Next, the use of the polymer compound of the present invention is explained.

The polymer compound of the present invention has fluorescence or phosphorescence in the solid state, and it can be used as a light emitting polymer (high molecular weight light-emitting material). Moreover, said polymer compound has excellent electronic transportation ability, and can be used suitably as a polymer-LED material, or a charge transporting material. The polymer LED using this light emitting polymer is a high performance polymer LED which can be driven at a low-voltage and efficiently. Therefore, the polymer LED can be preferably used for back light of a liquid crystal display, a light source of curved or flat surface for lighting, a segment type display element, and apparatus such as a flat-panel display of dot matrix.

Moreover, the polymer compound of the present invention can be used also as a coloring matter for lasers, a material for organic solar-cell, an organic transistor for organic semiconductor, and a conductive thin film such as conductive thin-film material, and organic-semiconductor thin film.

Furthermore, it can be used also as a luminescent thin-film material which emits fluorescence or phosphorescence.

Next, the polymer LED of the present invention is explained.

The polymer LED of the present invention comprises an organic layer between the electrodes consisting of an anode and a cathode, and the organic layer contains the polymer compound of the present invention.

The organic layer may be any of a light emitting layer, a hole transporting layer, and an electron transporting layer, and it is preferable that the organic layer is a light emitting layer.

The light emitting layer means a layer having a function of light-emission. The hole transportating layer means a layer having a function of transporting holes, and an electron transporting layer means a layer having a function of transporting electrons. The electron transporting layer and the hole transporting layer are collectively referred to as a charge transport layer. Two or more layers of the light emitting layer, hole transporting layer, and electron transporting layer can be used each independently.

When an organic layer is the light emitting layer, said light emitting layer which is an organic layer may contain further a hole transporting material, an electron transporting material, or a light-emitting material.

The composition comprising the polymer compound of the present invention and at least one compounds selected from a hole transporting material, an electron transporting material, and light-emitting material can be used as a light-emitting material or a charge transporting material. When mixing the polymer compound of the present invention and a hole transporting material, the mixed ratio of the hole transporting material is 1 wt %–80 wt % based on the total amount of the mixture, and it is preferably 5 wt %–60 wt %. When mixing the polymer compound of the present invention and an electron transporting material, the mixed ratio of the electron transporting material is 1 wt %–80 wt % based on the total amount of the mixture, and it is preferably 5 wt %–60 wt %. Furthermore, when mixing the polymer compound of the present invention and a light-emitting material, the mixed ratio of the light-emitting material is 1 wt %–80 wt % based on the total amount of the mixture, and it is preferably 5 wt %–60 wt %.

When mixing the polymer compound of the present invention with a light-emitting material, a hole transporting material, and/or an electron transporting material, the mixed ratio of the light-emitting material is 1 wt %–50 wt % based on the total amount of the mixture, and it is preferably 5 wt %–40 wt %. The total amount of the hole transporting material and the electron transporting material is 1 wt %–50 wt %, and it is preferably 5 wt %–40 wt %. The amount of the polymer compound of the present invention is 99 wt %–20 wt %.

As the hole transporting material, electron transporting material, and light-emitting material to be mixed, known low molecular weight compounds, known phosphorescent compounds and known polymer compounds can be used, and it is preferable to use a polymer compound. As the hole transporting material, electron transporting material or light-emitting material of polymer compound, exemplified are: a polyfluorene and derivatives thereof and copolymers thereof; a polyarylene and derivatives thereof and copolymers thereof; a polyarylene vinylene and derivatives thereof and copolymers thereof; and an aromatic amine and derivatives thereof. These are disclosed in WO 99/13692, WO 99/48160, GB2340304A, WO 00/53656, WO 01/19834, WO 00/55927, GB2348316 and WO 00/46321, WO 00/06665, WO 99/54943, WO 99/54385, U.S. Pat. No. 5,777,070 and WO 98/06773, WO 97/05184, WO 00/35987, WO 00/53655, WO 01/34722, WO 99/24526, WO 00/22027, WO 00/22026, WO 98/27136, U.S. patent application Ser. No. 573,636 and WO 98/21262, U.S. Pat. No. 5,741,921, WO 97/09394, WO 96/29356, WO 96/10617, EP0707020 and WO 95/07955, JP 2001-181618A, JP 2001-123156A, JP 2001-3045A, JP 2000-351967A, JP 2000-303066A, JP 2000-299189A, JP 2000-252065A, JP 2000-136379A, JP 2000-104057A, JP 2000-80167A, JP 10-324870A, JP 10-114891A, JP 9-111233A, JP 9-45478A, etc.

As the light-emitting material of low molecular weight compound, exemplified are: naphthalene, and derivatives thereof; anthracene and derivatives thereof, and derivatives thereof; coloring matters, such as polymethines, xanthenes, coumarins, and cyanines; 8-hydroxyquinoline or the metal complex of its derivative; aromatic amines; tetraphenyl cyclopentadienes or its derivative; tetraphenylbutadiene or its derivatives, etc.

Specifically, known materials disclosed in JP 57-51781A or JP 59-194393A, can be used.

As the phosphorescent compounds, exemplified are: those having iridium as a central metal, such as Ir(ppy)3 and Btp$_2$Ir(acac); those having platinum as a central metal, such as PtOEP; those having europium as a central metal, such as Eu(TTA)3 phen, etc.

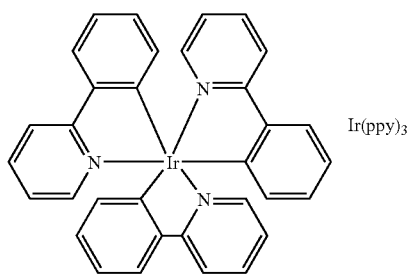

Ir(ppy)$_3$

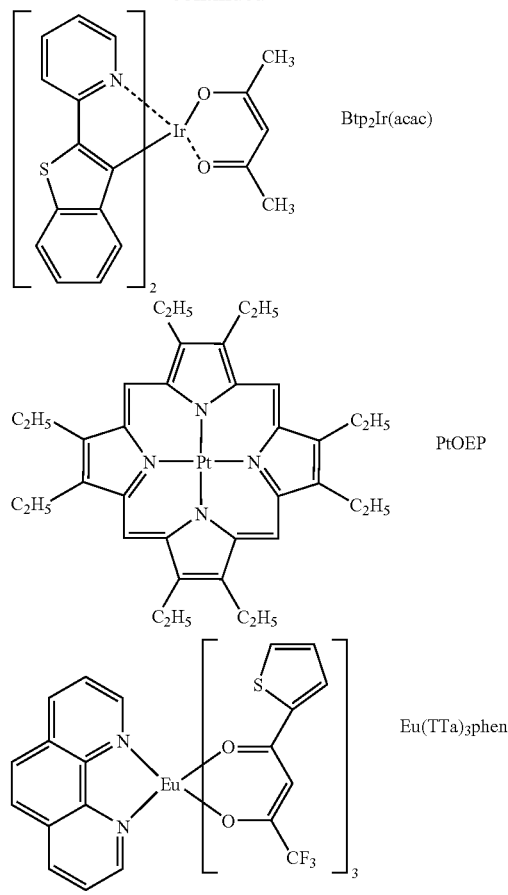

Specifically, examples of the phosphorescent compounds are described in: Nature, (1998), 395, 151; Appl. Phys. Lett. (1999), 75(1), 4; Proc. SPIE-Int. Soc. Opt. Eng. (2001), 4105 (Organic Light-Emitting Materials and DevicesIV), 119; J. Am. Chem. Soc., (2001), 123, 4304; Appl. Phys. Lett., (1997), 71(18), 2596; Syn. Met., (1998), 94(1), 103; Syn. Met., (1999), 99(2), 1361; Adv. Mater., (1999), 11(10), 852; Jpn. J. Appl. Phys., 34, 1883 (1995), etc.

As a polymer compound to be mixed with the phosphorescent compounds, those represented by formula (1-1) having only the structure of X=S are preferable.

Regarding the thickness of the light emitting layer, the optimum value differs depending on material used, and may properly be selected so that the driving voltage and the light emitting efficiency become an optimum value, and the thickness is, for example, from 1 nm to 1 μm, preferably from 2 nm to 500 nm, further preferably from 5 nm to 200 nm.

As a forming method of the light emitting layer, for example, exemplified is a method by film forming from a solution.

As the film-forming method from a solution, application methods, such as a spin coat method, casting method, micro gravure coating method, gravure coating method, bar-coating method, roll coating method, wire bar coat method, dip coat method, spray coating method, screen printing, flexography method, offset printing, and ink jet printing method, can be used. Printing methods, such as screen printing, flexography method, offset printing, and ink jet printing method, are preferable, since pattern forming and multicolored printing are easy.

As the ink composition used for the printing method etc., at least 1 kind of the polymer compounds of the present invention should be contained, additives, such as a hole transporting material, electron transporting material, light-emitting material, solvent, or stabilizer, may be contained in addition to the polymer compound of the present invention.

The amount of the polymer compound of the present invention in said ink composition is 20 wt %–100 wt % based on the total weight of the composition except the solvent, and preferably 40 wt %–100 wt %.

When a solvent is contained, the amount of the solvent in the ink composition is 1 wt %–99.9 wt % based on the total weight of the composition, preferably 60 wt %–99.5 wt %, and more preferably 80 wt %–99.0 wt %.

The suitable viscosity of the ink composition is depend on the printing methods. When the ink composition is processed via a discharging apparatus, in order to prevent clogging and ejection-deflecting at discharging, the viscosity is preferably in a range of 1–20 mPa·s at 25° C.

The solvent used as the ink composition is not especially limited, and preferable are those which can dissolve or disperse the materials constituting the ink composition other than the solvent uniformly.

When the materials constituting the ink composition are soluble in a nonpolar solvent, as the solvent, exemplified are: chlorinated solvents, such as chloroform, methylene chloride, and dichloroethane; ether solvents, such as tetrahydrofuran; aromatic hydrocarbon solvents, such as toluene, and xylene; ketone solvents, such as acetone, and methyl ethyl ketone; and ester solvents, such as ethyl acetate, butyl acetate, and ethyl cellosolve acetate.

Moreover, as the polymer LED of the present invention, there are exemplified: a device having an electron transporting layer disposed between a cathode and a light emitting layer; a device having a hole transporting layer disposed between an anode and a light emitting layer; and a device having an electron transporting layer disposed between a cathode and a light emitting layer, and a hole transporting layer disposed between an anode and a light emitting layer.

For example, the following structures a) to d) are specifically exemplified.

a) anode/light emitting layer/cathode
b) anode/hole transporting layer/light emitting layer/cathode
c) anode/light emitting layer/electron transporting layer//cathode
d) anode/hole transporting layer/light emitting layer/electron transporting layer/cathode (wherein, / indicates adjacent lamination of layers. Hereinafter, the same)

When the polymer LED of the present invention has a hole transporting layer, as the hole transporting materials used, there are exemplified polyvinylcarbazole or derivatives thereof, polysilane or derivatives thereof, polysiloxane derivatives having an aromatic amine in the side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, or the like.

Specific examples of the hole transporting material include those described in JP 63-70257A, JP 63-175860A, JP 2-135359A, JP 2-135361A, JP 2-209988A, JP 3-37992A and JP 3-152184A.

Among them, as the hole transporting materials used in the hole transporting layer, preferable are polymer hole transporting materials such as polyvinylcarbazole or derivatives thereof, polysilane or derivatives thereof, polysiloxane derivatives having an aromatic amine compound group in the side chain or the main chain, polyaniline or derivatives thereof, polythiophene or derivatives thereof, poly(p-phenylenevinylene) or derivatives thereof, poly(2,5-thienylenevinylene) or derivatives thereof, or the like, and further preferable are polyvinylcarbazole or derivatives thereof, polysilane or derivatives thereof and polysiloxane derivatives having an aromatic amine compound group in the side chain or the main chain.

Moreover, as the hole transporting material of low molecular weight compound, exemplified are pyrazoline derivatives, arylamine derivatives, stilbene derivatives, and triphenyl diamine derivatives. In case of the low molecular weight hole transporting material, it is preferably dispersed in a polymer binder for use.

As the polymer binder to be mixed, preferable are those which do not inhibit charge transportation extremely and do not have strong absorbance in a visible light. As the polymer binder, exemplified are: poly (N-vinylcarbazole); polyaniline or derivatives thereof; poly thiophene or derivatives thereof; poly(p-phenylenevinylene) or derivatives thereof; poly(2,5-thienylenevinylene) or derivatives thereof; polycarbonate; polyacrylate, poly methylacrylate, polymethylmethacrylate, polystyrene, polyvinylchloride, polysiloxane, etc.

Polyvinyl carbazole and derivatives thereof are obtained from, for example, a vinyl monomer, by cationic polymerization or radical polymerization.

As the polysilane or derivatives thereof, there are exemplified compounds described in Chem. Rev., 89, 1359 (1989) and GB 2300196 published specification, and the like. For synthesis, methods described in them can be used, and a Kipping method can be suitably used particularly.

As the polysiloxane or derivatives thereof, those having the structure of the above-described hole transporting material having lower molecular weight in the side chain or main chain, since the siloxane skeleton structure has poor hole transporting property. Particularly, there are exemplified those having an aromatic amine having hole transporting property in the side chain or main chain.

The method for forming a hole transporting layer is not restricted, and in the case of a hole transporting layer having lower molecular weight, a method in which the layer is formed from a mixed solution with a polymer binder is exemplified. In the case of a polymer hole transporting material, a method in which the layer is formed from a solution is exemplified.

The solvent used for the film forming from a solution is not particularly restricted providing it can dissolve a hole transporting material. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like, from a solution.

Regarding the thickness of the hole transporting layer, the optimum value differs depending on material used, and may properly be selected so that the driving voltage and the light emitting efficiency become an optimum value. The thickness is should be at least such that pinholes are not generated, but when it is too thick, the driving voltage of a device becomes high, and it is not preferable. Therefore, the film thickness of the hole transporting layer is, for example, from 1 nm to 1 μm, preferably 2 nm–500 nm, and more preferably 5 nm–200 nm.

When the polymer LED of the present invention has an electron transporting layer, known compounds are used as the electron transporting materials, and there are exemplified oxadiazole derivatives, anthraquinonedimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline and derivatives thereof, polyquinoxaline and derivatives thereof, polyfluorene or derivatives thereof, and the like.

Specifically, there are exemplified those described in JP 63-70257A, JP 63-175860A, JP 2-135359A, JP 2-135361A, JP 2-209988A, JP 3-37992A and JP 3-152184A.

Among them, oxadiazole derivatives, benzoquinone or derivatives thereof, anthraquinone or derivatives thereof, or metal complexes of 8-hydroxyquinoline or derivatives thereof, polyquinoline and derivatives thereof, polyquinoxaline and derivatives thereof, polyfluorene or derivatives thereof are preferable, and 2-(4-biphenyl)-5-(4-t-butylphenyl)-1,3,4-oxadiazole, benzoquinone, anthraquinone, tris(8-quinolinol)aluminum and polyquinoline are further preferable.

The method for forming the electron transporting layer is not particularly restricted, and in the case of an electron transporting material having lower molecular weight, a vapor deposition method from a powder, or a method of film-forming from a solution or melted state is exemplified, and in the case of a polymer electron transporting material, a method of film-forming from a solution or melted state is exemplified, respectively. At the time of film forming from a solution or a molten state, the above polymer binder can be used together.

The solvent used in the film-forming from a solution is not particularly restricted provided it can dissolve electron transporting materials and/or polymer binders. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film-forming method from a solution or melted state, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

Regarding the thickness of the electron transporting layer, the optimum value differs depending on material used, and may properly be selected so that the driving voltage and the light emitting efficiency become an optimum value. The thickness is should be at least such that pinholes are not generated, but when it is too thick, the driving voltage of a device becomes high, and it is not preferable.

Therefore, the film thickness of the hole transporting layer is, for example, from 1 nm to 1 μm, preferably 2 nm–500 nm, and more preferably 5 nm–200 nm.

Among charge transporting layers provided adjacent to an electrode, those having a function to improve the charge injection efficiency from an electrode and to lower the driving voltage of a device may be sometimes called charge injection layers (a hole injection layer, electronic injection layer).

For enhancing adherence with an electrode and improving charge injection from an electrode, the above-described charge injecting-layer or insulation layer having a thickness of 2 nm or less may also be provided adjacent to an electrode, and further, for enhancing adherence of the interface, preventing mixing and the like, a thin buffer layer may also be inserted into the interface of a charge transporting layer and light emitting layer.

The order and number of layers laminated and the thickness of each layer can be appropriately applied while considering light emitting efficiency and life of the device.

In the present invention, as the polymer LED having a charge injecting layer (electron injecting layer, hole injecting layer) provided, there are listed a polymer LED having a charge injecting layer provided adjacent to a cathode and a polymer LED having a charge injecting layer provided adjacent to an anode.

For example, the following structures e) to p) are specifically exemplified.

e) anode/charge injecting layer/light emitting layer/cathode
f) anode/light emitting layer/charge injecting layer/cathode
g) anode/charge injecting layer/light emitting layer/charge injecting layer/cathode
h) anode/charge injecting layer/hole transporting layer/light emitting layer/cathode
i) anode/hole transporting layer/light emitting layer/charge injecting layer/cathode
j) anode/charge injecting layer/hole transporting layer/light emitting layer/charge injecting layer/cathode
k) anode/charge injecting layer/light emitting layer/electron transporting layer/cathode
l) anode/light emitting layer/electron transporting layer/charge injecting layer/cathode
m) anode/charge injecting layer/light emitting layer/electron transporting layer/charge injecting layer/cathode
n) anode/charge injecting layer/hole transporting layer/light emitting layer/electron transporting layer/cathode
o) anode/hole transporting layer/light emitting layer/electron transporting layer/charge injecting layer/cathode
p) anode/charge injecting layer/hole transporting layer/light emitting layer/electron transporting layer/charge injecting layer/cathode As the specific examples of the charge injecting layer, there are exemplified: layers containing an conducting polymer; layers which are disposed between an anode and a hole transporting layer and contain a material having an ionization potential between the ionization potential of an anode material and the ionization potential of a hole transporting material contained in the hole transporting layer, and the like.

When the above-described charge injecting layer is a layer containing an conducting polymer, the electric conductivity of the conducting polymer is preferably $10^{-5}$ S/cm or more and $10^3$ S/cm or less, and for decreasing the leak current between light emitting pixels, more preferably $10^{-5}$ S/cm or more and $10^2$ S/cm or less, further preferably $10^{-5}$ S/cm or more and $10^1$ S/cm or less.

Regarding the kind of an ion doped, an anion is used in a hole injecting layer and a cation is used in an electron injecting layer. As examples of the anion, a polystyrene sulfonate ion, alkylbenzene sulfonate ion, camphor sulfonate ion and the like are exemplified, and as examples of the cation, a lithium ion, sodium ion, potassium ion, tetrabutyl ammonium ion and the like are exemplified.
The thickness of the charge injecting layer is for example, from 1 nm to 100 nm, preferably from 2 nm to 50 nm.

Specifically, there are listed the following structures q) to ab) for example.

q) anode/insulation layer having a thickness of 2 nm or less/light emitting layer/cathode
r) anode/light emitting layer/insulation layer having a thickness of 2 nm or less/cathode
s) anode/insulation layer having a thickness of 2 nm or less/light emitting layer/insulation layer having a thickness of 2 nm or less/cathode
t) anode/insulation layer having a thickness of 2 nm or less/hole transporting layer/light emitting layer/cathode
u) anode/hole transporting layer/light emitting layer/insulation layer having a thickness of 2 nm or less/cathode
v) anode/insulation layer having a thickness of 2 nm or less/hole transporting layer/light emitting layer/insulation layer having a thickness of 2 nm or less/cathode
w) anode/insulation layer having a thickness of 2 nm or less/light emitting layer/electron transporting layer/cathode
x) anode/light emitting layer/electron transporting layer/insulation layer having a thickness of 2 nm or less/cathode
y) anode/insulation layer having a thickness of 2 nm or less/light emitting layer/electron transporting layer/insulation layer having a thickness of 2 nm or less/cathode
z) anode/insulation layer having a thickness of 2 nm or less/hole transporting layer/light emitting layer/electron transporting layer/cathode
aa) anode/hole transporting layer/light emitting layer/electron transporting layer/insulation layer having a thickness of 2 nm or less/cathode
ab) anode/insulation layer having a thickness of 2 nm or less/hole transporting layer/light emitting layer/electron transporting layer/insulation layer having a thickness of 2 nm or less/cathode The substrate forming the polymer LED of the present invention may preferably be that does not change in forming an electrode and layers of organic materials, and there are exemplified glass, plastics, polymer film, silicon substrates and the like. In the case of a opaque substrate, it is preferable that the opposite electrode is transparent or semitransparent.

Usually, either the anode or the cathode in the polymer LED of the present invention is transparent or semitransparent. It is preferable that the anode side is transparent or semitransparent.

As the material of this anode, electron conductive metal oxide films, semitransparent metal thin films and the like are used. Specifically, there are used indium oxide, zinc oxide, tin oxide, and films (NESA and the like) fabricated by using an electron conductive glass composed of indium-tin-oxide (ITO), indium•zinc•oxide and the like, which are metal oxide complexes, and gold, platinum, silver, copper and the like are used, and among them, ITO, indium•zinc•oxide, tin oxide are preferable. As the fabricating method, a vacuum vapor deposition method, sputtering method, ion plating method, plating method and the like are used. As the anode, there may also be used organic transparent conducting films such as polyaniline or derivatives thereof, polythiophene or derivatives thereof and the like.

The thickness of the anode can be appropriately selected while considering transmission of a light and electric conductivity, and for example, from 10 nm to 10 μm, preferably from 20 nm to 1 μm, further preferably from 50 nm to 500 nm.

Further, for easy charge injection, there may be provided on the anode a layer comprising a phthalocyanine derivative conducting polymers, carbon and the like, or a layer having an average film thickness of 2 nm or less comprising a metal oxide, metal fluoride, organic insulating material and the like.

As the material of a cathode used in the polymer LED of the present invention, that having lower work function is preferable. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, or alloys comprising two of more of them, or alloys comprising one or more of them with one or more of gold, silver, platinum, copper, manganese, titanium, cobalt, nickel, tungsten and tin, graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be formed into a laminated structure of two or more layers.

The thickness of the cathode can be appropriately selected while considering transmission of a light and electric conductivity, and for example, from 10 nm to 10 μm, preferably from 20 nm to 1 μm, further preferably from 50 nm to 500 nm.

As the method for fabricating a cathode, there are used a vacuum vapor deposition method, sputtering method, lamination method in which a metal thin film is adhered under heat and pressure, and the like. Further, there may also be provided, between a cathode and an organic layer, a layer comprising an conducting polymer, or a layer having an average film thickness of 2 nm or less comprising a metal oxide, metal fluoride, organic insulation material and the like, and after fabrication of the cathode, a protective layer may also be provided which protects the polymer LED. For stable use of the polymer LED for a long period of time, it is preferable to provide a protective layer and/or protective cover for protection of the device in order to prevent it from outside damage.

As the protective layer, there can be used a polymer compound, metal oxide, metal fluoride, metal borate and the like. As the protective cover, there can be used a glass plate, a plastic plate the surface of which has been subjected to lower-water-permeation treatment, and the like, and there is suitably used a method in which the cover is pasted with an device substrate by a thermosetting resin or light-curing resin for sealing. If space is maintained using a spacer, it is easy to prevent an device from being injured. If an inner gas such as nitrogen and argon is sealed in this space, it is possible to prevent oxidation of a cathode, and further, by placing a desiccant such as barium oxide and the like in the above-described space, it is easy to suppress the damage of an device by moisture adhered in the production process. Among them, any one means or more are preferably adopted.

The polymer LED of the present invention can be suitably used as a flat light source, segment display apparatus, dot-matrix display apparatus, and back light of a liquid crystal display.

For obtaining light emission in plane form using the polymer LED of the present invention, an anode and a cathode in the plane form may properly be placed so that they are laminated each other. Further, for obtaining light emission in pattern form, there are a method in which a mask with a window in pattern form is placed on the above-described plane light emitting device, a method in which an organic layer in non-light emission part is formed to obtain extremely large thickness providing substantial non-light emission, and a method in which any one of an anode or a cathode, or both of them are formed in the pattern. By forming a pattern by any of these methods and by placing some electrodes so that independent on/off is possible, there is obtained a display device of segment type which can display digits, letters, simple marks and the like. Further, for forming a dot matrix device, it may be advantageous that anodes and cathodes are made in the form of stripes and placed so that they cross at right angles. By a method in which a plurality of kinds of polymer compounds emitting different colors of lights are placed separately or a method in which a color filter or luminescence converting filter is used, area color displays and multi color displays are obtained. A dot matrix display can be driven by passive driving, or by active driving combined with TFT and the like. These display devices can be used as a display of a computer, television, portable terminal, portable telephone, car navigation, view finder of a video camera, and the like.

Further, the above-described light emitting device in plane form is a thin self-light-emitting one, and can be suitably used as a flat light source for back-light of a liquid crystal display, or as a flat light source for illumination. Further, if a flexible plate is used, it can also be used as a curved light source or a display.

EXAMPLES

The following examples further illustrate the present invention in detail but do not limit the scope thereof.

As for the molecular weight, a number-average molecular weight and a weight-average molecular weight were obtained as a polystyrene reduced average molecular weight by gel permeation chromatography (GPC) using chloroform as a solvent.

Synthetic Example 1

Synthesis of Compound A

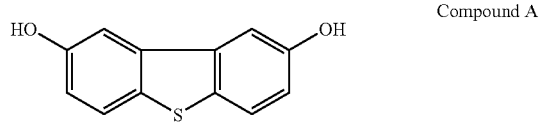

Compound A 2,8-dibromodibenzothiophene 7 g and THF 280 ml were charged into a 1 liter four-necked flask under an inert atmosphere, and stirred to dissolve at a room temperature, then cooled to −78° C. n-butyllithium 29 ml (1.6 mol/L hexane solution) was added dropwise to it. After the dropwise addition, it was stirred for 2 hours, at the fixed temperature, and trimethoxyboronic acid 13 g was added dropwise. After the dropwise addition, the temperature was raised to a room temperature slowly. After stirring for 3 hours at a room temperature, disappearance of the raw material was confirmed by TLC. 5% sulfuric acid 100 ml was added to terminate the reaction, and stirred at a room temperature for 12 hours. After washing with water, the organic layer was extracted. After replacing the solvent with ethyl acetate, 30% aqueous hydrogen peroxide 5 ml was added and stirred at 40° C. for 5 hours. Then the organic layer was extracted, washed with 10% aqueous solution of iron(II)ammonium sulfate, and dried. By removing the solvent, brown solid 4.43 g was obtained. By products, such as a dimer, were also produced as confirmed by LC-MS measurement, and the purity of Compound A was 77% (LC area percentage).

MS(APCI(−)):(M−H)⁻ 215

Synthetic Example 2

Synthesis of Compound B

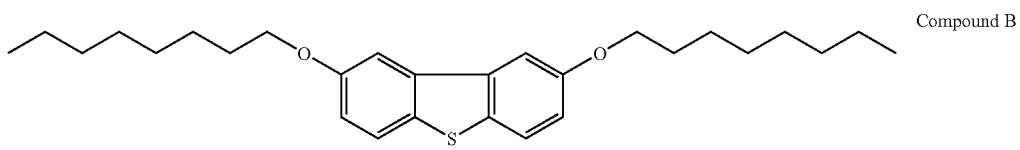

Compound B

Under an inert atmosphere, into a 200 ml three neck flask, Compound A 4.3 g, n-octylbromide 25.1 g and potassium carbonate 12.5 g were charged, and methylisobutyl ketone 50 ml was added as a solvent, then refluxed with heating at 125° C. for 6 hours. After the reaction, the solvent was removed, and the reaction product was separated with chloroform and water, the organic layer was extracted and further washed with water twice. After drying by anhydrous sodium sulfate, it was purified through silica gel column (eluent:toluene/cyclohexane=1/10) to give Compound B 8.49 g (LC area %=97%, yield=94%) was obtained.

$^1$H-NMR(300 MHz/CDCl$_3$): δ 0.91 (t, 6H), 1.31~1.90 (m, 24H), 4.08 (t, 4H), 7.07 (dd, 2H), 7.55 (d, 2H), 7.68 (d, 2H)

Synthetic Example 3

Synthesis of Compound C

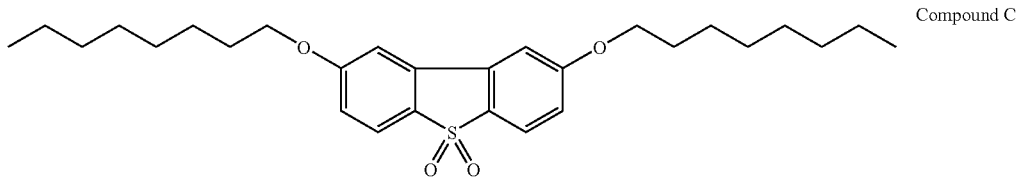
Compound C

Compound B 6.67 g and acetic acid 40 ml were charged into a 100 ml three neck flask, and the bath-temperature was raised to 140° C. with using an oil bath. Then, 30% hydrogen-peroxide 13 ml was added through a condenser, and stirred vigorously, then the reaction was terminated by being poured into 180 ml of cold water. After extracting with chloroform and being dried, the solvent was removed and Compound C 6.96 g (LC area %=90%, yield=97%) was obtained.

$^1$H-NMR(300 MHz/CDCl$_3$): δ 0.90 (t, 6H), 1.26~1.87 (m, 24H), 4.06 (t, 4H), 7.19 (dd, 2H), 7.69 (d, 2H), 7.84 (d, 2H) MS(APCI(+)):(M+H)$^+$ 473

Synthetic Example 4

Synthesis of Compound D

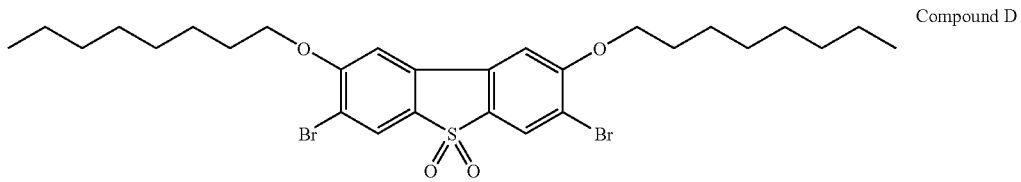
Compound D

Compound C 3.96 g and mixed solution 15 ml of acetic acid/chloroform=1:1 were charged into a four-necked flask 200 ml under an inert atmosphere, stirred at 70° C. and dissolved. Then, bromine 6.02 g dissolved in the above solvent 3 ml was added and stirred for 3 hours. A sodium thiosulfate aqueous solution was added to remove unreacted bromine, and the reaction product was separated with chloroform and water, the organic layer was extracted and dried. After removing the solvent, it was purified through silica gel column (eluent: chloroform/hexane=1/4) to give Compound D 4.46 g (LC area %=98%, yield=84%) was obtained.

$^1$H-NMR(300 MHz/CDCl$_3$): δ 0.95 (t, 6H), 1.30~1.99 (m, 24H), 4.19 (t, 4H), 7.04 (s, 2H), 7.89 (s, 2H) MS(FD$^+$)M$^+$ 630

Example 1

Synthesis of Compound E

Compound D 3.9 g and diethyl ether 50 ml were charged into a 200 ml three neck flask under an inert atmosphere, and the temperature was raised to 40° C. and stirred. Lithium aluminium hydride 1.17 g was added a little at a time and reacted for 5 hours. Excess of lithium aluminium hydride was decomposed by adding a small amount of water at a time, and washed with 36% hydrochloric acid 5.7 ml. The reaction mixture was separated with chloroform and water, the organic layer was extracted and dried. It was purified through silica gel column (eluent: chloroform/hexane=1/5) to give Compound E 1.8 g (LC area %=99%, yield=49%) was obtained.

$^1$H-NMR(300 MHz/CDCl$_3$): δ 0.90 (t, 6H), 1.26~1.97 (m, 24H), 4.15 (t, 4H), 7.45 (s, 2H), 7.94 (s, 2H) MS(FD$^+$)M$^+$ 598

According to MS (APCI (+)) method, peaks were observed at 615 and 598.

Example 2

<Synthesis of Polymer Compound 1>

After dissolving Compound E 352 mg and 2,2'-bipyridyl 274 mg in tetrahydrofuran (dehydrated) 20 ml, the inside of the system was replaced with nitrogen by bubbling with nitrogen gas. To this solution, bis(1,5-cyclooctadiene)nickel (0) {Ni(COD)$_2$} 500 mg was added, and the temperature was raised to 60° C. and reacted for 3 hours. After the reaction, this reaction liquid was cooled to a room temperature (about 25° C.), and added dropwise to a mixed solution of 25% aqueous ammonia 10 ml/methanol 120 ml/50 ml ion-exchanged water and stirred for 1 hour. The deposited precipitate was filtrated and dried for 2 hours under reduced pressure, and dissolved in toluene 30 ml. Then, 30 ml of 1N hydrochloric acid was added and stirred for 1 hour, the aqueous layer was removed, 30 ml of 4% aqueous ammonia was added to the organic layer, and the aqueous layer was removed after stirring for 1 hour. The organic layer was added dropwise to methanol 200 ml, and stirred for 1 hour, then the deposited precipitate was filtrated and dried under

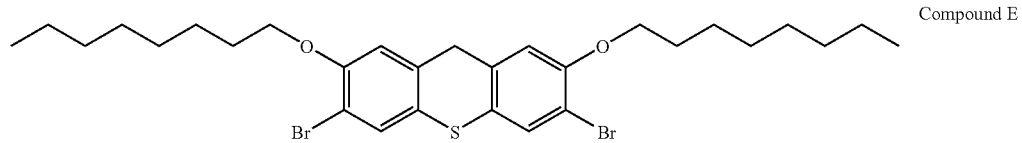
Compound E reduced pressure for 2 hours, and dissolved in toluene 30 ml. Then, purification through alumina column (5 g of alumina) was carried out, and recovered toluene solution was added to methanol 250 ml, stirred for 1 hour, and deposited precipitate was filtrated and dried under reduced pressure for two hours. A polymer was obtained in yield of 46 mg. This polymer is referred to as Polymer Compound 1.
The polystyrene reduced average molecular weight of Polymer Compound 1 was Mn=$2.1\times10^4$, and Mw=$8.1\times10^4$.

Example 3

<Synthesis of Polymer Compound 2>

A copolymer was produced according to the procedure of Example 2, with using Compound E 253 mg, and N,N'-bis(4-bromophenyl)-N,N'-bis(4-n-butylphenyl)-1,4-phenylenediamine 125 mg as the starting materials.

Yield of the copolymer was 127 mg. In the copolymer, the ratio of the repeating unit of dibenzothiophene to the amine derivative was 70:30. This copolymer is referred to as Polymer Compound 2. The polystyrene reduced average molecular weight of Polymer Compound 2 was Mn=$2.3\times10^4$, and Mw=$5.8\times10^4$.

Example 4

<Synthesis of Polymer Compound 3>

A copolymer was produced according to the procedure of Example 2, with using Compound E 296 mg, and N,N-bis(4-bromophenyl)-N'N'-diphenyl-1,4-phenylenediamine 144 mg as the starting materials.

Yield of the copolymer was 118 mg. In the copolymer, the ratio of the repeating units of dibenzothiophene to the amine derivative was 70:30. This copolymer is referred to as Polymer Compound 3. The polystyrene reduced average molecular weight of Polymer Compound 3 was Mn=$2.6\times10^4$, and Mw=$8.9\times10^4$.

Example 5

<Synthesis of Polymer Compound 4>

Compound E 6450 mg, N,N-bis(4-bromophenyl)-N-(4-(1-methylbutyl) phenyl)amine 2700 mg and 2,2'-bipyridyl 5500 mg were charged into a flask, after the inside of the system was replaced with nitrogen, they were dissolved in 400 ml of dehydrated tetrahydrofuran degassed with argon gas. To this solution, under nitrogen atmosphere, bis(1,5-cyclooctadiene)nickel(0) {Ni(COD)$_2$} 10000 mg was added, and the temperature was raised to 60° C. and. reacted for 3 hours. After the reaction, this reaction mixture was cooled to a room temperature, and added dropwise to a mixed solution of 25% aqueous ammonia 100 ml/methanol 500 ml/100 ml ion-exchanged water and stirred for 1 hour. The deposited precipitate was filtrated and dried for 2 hours under reduced pressure, and dissolved in toluene 40 ml. Then, 40 ml of 1N hydrochloric acid was added and stirred for 1 hour, the aqueous layer was removed, 40 ml of 3% aqueous ammonia was added to the organic layer, and the aqueous layer was removed after stirring for 1 hour. After washing with 150 ml ion-exchanged water, the washed organic layer was poured into methanol 100 ml, and stirred for 1 hour. Then the deposited precipitate was filtrated and dried under reduced pressure for 2 hours, and dissolved in toluene 40 ml. Then, purification through alumina column (20 g of alumina) was carried out, and recovered toluene solution was added to methanol 200 ml, stirred for 1 hour, and deposited precipitate was filtrated and dried under reduced pressure for two hours.

Yield of the copolymer was 4000 mg. In the copolymer, the ratio of the repeating units of dibenzothiophene derivative to the amine derivative was 70:30. This copolymer is referred to as Polymer Compound 4. The polystyrene reduced average molecular weight of Polymer Compound 4 was Mn=$4.8\times10^4$, and Mw=$5.3\times10^5$.

Example 6

<Synthesis of Polymer Compound 5>

Compound E 400 mg, N,N'-bis(3-methyl-4-bromophenyl)diphenylbenzidine 440 mg and 2,2'-bipyridyl 510 mg were charged into a reaction flask, and the inside of the system was replaced with nitrogen. To this, 400 ml of dehydrated tetrahydrofuran degassed by bubbling with argon gas was added. To this mixture, bis(1,5-cyclooctadiene)nickel(0) 1000 mg was added, and a reaction was carried out at 60° C. for 3 hours. The reaction was carried out under nitrogen atmosphere. After the reaction, this reaction mixture was cooled, and added dropwise to a mixed solution of 25% aqueous ammonia 10 ml/methanol 120 ml/50 ml ion-exchanged water and stirred for about 1 hour. The deposited precipitate was recovered by filtration. After being washed with ethanol, the precipitate was dried for 2 hours under reduced pressure. Then the precipitate was dissolved in toluene 30 ml, then, 30 ml of 1N hydrochloric acid was added and stirred for 1 hour, the aqueous layer was removed, 30 ml of 4% aqueous ammonia was added to the organic layer, and the aqueous layer was removed after stirring for 1 hour. The organic layer was added dropwise to methanol 150 ml, and stirred for 1 hour. Then the deposited precipitate was filtrated and dried under reduced pressure for 2 hours, and dissolved in toluene 30 ml. Then, purification through alumina column (20 g of alumina) was carried out, and recovered toluene solution was added to methanol 100 ml, stirred for 1 hour, and deposited precipitate was filtrated and dried under reduced pressure for two hours.

Yield of the copolymer was 79 mg. In the copolymer, the ratio of the repeating units of dibenzothiophene derivative to the amine derivative was 50:50. This copolymer is referred to as Polymer Compound 5. The polystyrene reduced average molecular weight of Polymer Compound 5 was Mn=$2.0\times10^3$, and Mw=$3.4\times10^4$.

Example 7

<Synthesis of Polymer Compound 6>

A copolymer was produced according to the procedure of Example 6, with using Compound E 400 mg, and 2,3-diethyl-5, 8-dibromoquinoxaline 97 mg.

Yield of the copolymer was 50 mg. In the copolymer, the ratio of the repeating unit of dibenzothiophene derivative to quinoxaline unit was 70:30. This copolymer is referred to as Polymer Compound 6. The polystyrene reduced average molecular weight of Polymer Compound 6 was Mn=$2.5\times10^4$, and Mw=$9.0\times10^4$.

Example 8

<A synthesis of a Polymer Compound 7>

A copolymer was produced according to the procedure of Example 6, with using Compound E 350 mg, N,N'-bis(4-bromophenyl)-N,N'-bis (4-n-butylphenyl) 1,4-phenylenediamine (amine derivative 1) 57 mg, and N,N-bis (4-bromophenyl)-N-(4-(1-methyl butyl) phenyl) amine (amine derivative 2) 78 mg.

Yield of the copolymer was 76 mg. In the copolymer, the ratio of the repeating unit of dibenzothiophene derivative: amine derivative 1: amine derivative 2 was 70:10:20. This copolymer is referred to as Polymer Compound 7. The polystyrene reduced average molecular weight of Polymer Compound 7 was Mn=$7.4\times10^4$, and Mw=$2.4\times10^5$.

Example 9
\<Synthesis of Polymer Compound 8\>

A copolymer was produced according to the procedure of Example 5, with using Compound E 310 mg, N,N'-bis(4-bromophenyl)-N,N'-(4-butylphenyl)-1,4-phenylenediamine 310 mg, and bis(4-bromophenyl) ether 170 mg.

Yield of the copolymer was 130 mg. In the copolymer, the ratio of the repeating unit of dibenzothiophene derivative: amine derivative: diphenylether unit was 35:30:35. This copolymer is referred to as Polymer Compound 8. The polystyrene reduced average molecular weight of Polymer Compound 8 was $Mn=7.4\times10^3$, and $Mw=1.4\times10^4$.

Example 10
Synthesis of Compound F

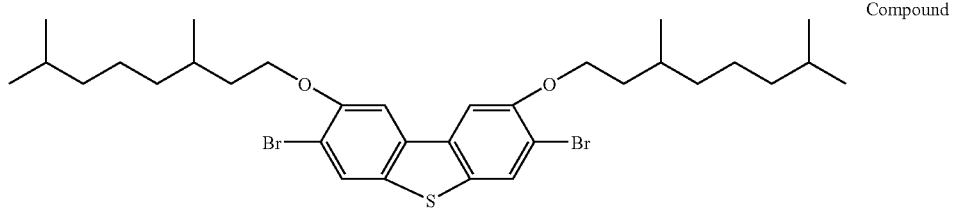

Compound F

Compound F was synthesized according to the procedure of the synthesis of Compound E from Compound A. Yield 46%, and purity 96%.

$^1$H-NMR(300 MHz/CDCl$_3$): δ 0.89 (dd, 12H), 1.01 (d, 6H), 1.17–2.01 (m, 20H), 4.18 (t, 4H), 7.42 (s, 2H) and 7.92 (s, 2H)

According to a MS (APCI (+)) method, peaks were observed at 671 and 654.

Example 11
\<Synthesis of Polymer Compound 9\>

A polymer was synthesized according to the procedure of Example 5, using Compound F 1000 mg. The yield of resultant polymer was 100 mg. This polymer is referred to as Polymer Compound 9.

The polystyrene reduced average molecular weight of Polymer Compound 9 was $Mn=5.0\times10^4$, and $Mw=1.1\times10^5$.

Example 12
\<Synthesis of Polymer Compound 10\>

According to the procedure of Example 6, it was synthesized using Compound F 320 mg and Compound E 310 mg. In the copolymer, the ratio of the repeating units corresponding to Compound F and Compound E is 50:50. This polymer is referred to as Polymer Compound 10.

The polystyrene reduced average molecular weight of Polymer Compound 10 was $Mn=8.8\times10^4$, and $Mw=3.0\times10^5$.

Example 13
\<Synthesis of Polymer Compound 11\>

According to the procedure of Example 6, it was synthesized using Compound F 320 mg and N,N'-bis(4-bromophenyl)-N,N'-bis(4-n-butylphenyl)-1,4-phenylenediamine 140 mg.

The yield of the resultant copolymer was 150 mg. In the copolymer, the ratio of the repeating units of dibenzothiophene derivative and amine derivative is 70:30.

This copolymer is referred to as Polymer Compound 11. The polystyrene reduced average molecular weight of Polymer Compound 11 was $Mn=3.9\times10^3$, and $Mw=4.4\times10^4$.

Example 14
\<Synthesis of Polymer Compound 12\>

According to the procedure of Example 6, it was synthesized using compound F 270 mg, compound E 250 mg, and N,N'-bis (4-bromophenyl)-N,N'-bis (4-n-butylphenyl)-1,4-phenylenediamine 240 mg. In the copolymer, the ratio of the repeating units corresponding to Compound F, Compound E, and the amine derivative is 35:35:30.

This copolymer is referred to as Polymer Compound 12. The polystyrene reduced average molecular weight of Polymer Compound 12 was $Mn=3.8\times10^4$, and $Mw=5.9\times10^4$.

Example 15
Synthesis of Compound G

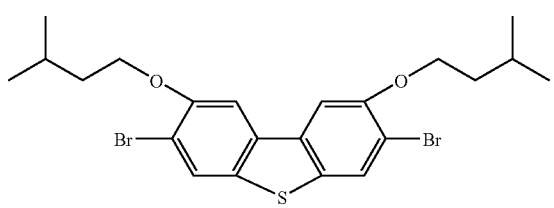

Compound G

It was synthesized according to the procedure of the synthesis of Compound E from compound A. 53% of yield, and 100% of purity.

$^1$H-NMR(300 MHz/CDCl$_3$): δ 1.00 (d, 12H), 1.75 (dd, 2H), 1.87 (m, 4H) 4.11 (t, 4H), 7.07 (dd, 2H), 7.55 (d, 2H) and 7.68 (s, 2H)

Example 16
\<Synthesis of Polymer Compound 13\>

According to the procedure of Example 6, it was synthesized using Compound G 260 mg and Compound E 300 mg. The yield of the resultant polymer was 150 mg. In the copolymer, the ratio of the repeating units corresponding to Compound G and Compound E is 50:50.

This polymer is referred to as Polymer Compound 13. The polystyrene reduced average molecular weight of Polymer Compound 13 was $Mn=9.0\times10^4$, and $Mw=2.0\times10^5$.

Example 17
\<Synthesis of Polymer Compound 14\>

According to the procedure of Example 6, it was synthesized using Compound E 300 mg, Compound G 64 mg, N,N'-bis (4-bromophenyl)-N,N'-bis (4-n-butylphenyl) 1,4-phenylenediamine 180 mg. The yield of the resultant copolymer was 80 mg. In the copolymer, the ratio of the repeating units corresponding to Compound G, Compound E, and the amine derivative is 56:14:30.

This copolymer is referred to as Polymer Compound 14. The polystyrene reduced average molecular weight of Polymer Compound 14 was Mn=$3.2\times10^4$, and Mw=$6.3\times10^4$.

Synthetic Example 18

Synthesis of Compound H

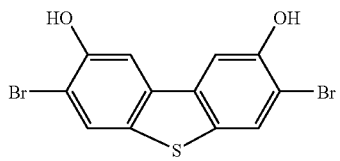

Compound H

Under an inert atmosphere, Compound E 1.0 g was added to dichloromethane 11 ml, and after completely dissolved in it, 3.5 ml of boron tribromide(1.0 mol/l dichloromethane solution) was added dropwise.

After the dropwise addition, it was heated to 40° C., and stirred for 5 hours. The reaction mixture was poured into 0° C. ion-exchanged water, and stirred for 1 hour. The deposited solid was filtrated and dried in vacuo, 0.60 g of the desired product was obtained. (96% of yield, 99% of purity).

$^1$H-NMR(300 MHz/(CD$_3$)$_2$SO): δ 7.60 (s, 2H), 8.16 (s, 2H), 10.485 (br, 2H) MS(APCI(−)):(M−H)$^-$ 373

Example 19

Synthesis of Compound J

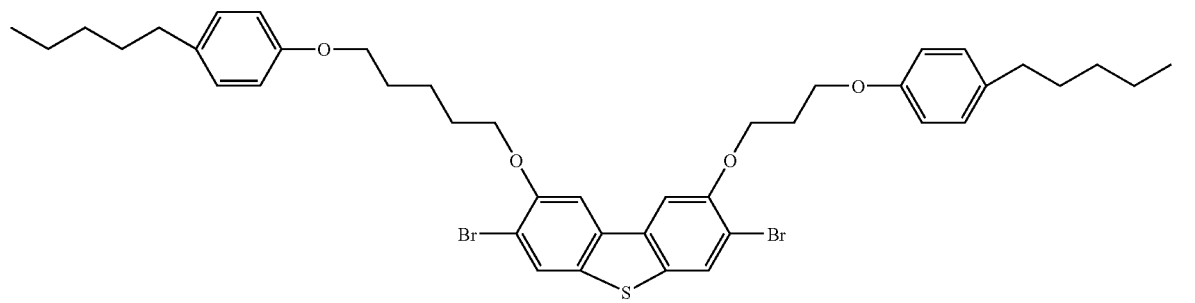

Compound J

Compound H 5.00 g, 1-bromo(4-pentylphenoxy propane) 11.4 g, potassium carbonate 9.24 g and DMF 75 ml were charged into a reaction vessel, and refluxed with heating for 4.5 hours. It was separated with toluene and water, and the organic layer was extracted, and dried with sodium sulfate. After removing the solvent, filtrated through a silica gel short column with toluene, washing is carried out twice with hot hexane, and 7.77 g of the desired products was obtained. The yield was 74%, and the purity was 100%.

$^1$H-NMR(300 MHz/CDCl$_3$): δ 0.88 (t, 6H), 1.24–2.55 (m, 20H), 4.25 (t, 4H), 4.34 (t, 4H), 6.86 (dd, 4H), 7.07 (dd, 4H), 7.49 (s, 2H), 7.94 (s, 2H)

Example 20

<Synthesis of Polymer Compound 15>

Compound J 391 mg and 2,2'-bipyridyl 130 mg were dissolved in 14 mL of dehydrated tetrahydrofuran, and under nitrogen atmosphere, bis(1,5-cyclooctadiene)nickel (0) {Ni (COD)$_2$} 230 mg was added to this solution, and the temperature was raised to 60° C., and reacted for 3 hours. After the reaction, this reaction mixture was cooled to a room temperature, added dropwise to a mixed solution of 25% aqueous ammonia 7 ml/methanol 80 ml/40 ml ion-exchanged water, and stirred for 1 hour. The deposited precipitate was filtrated, dried under reduced pressure for 2 hours, and dissolved in tolune 20 ml. 1N hydrochloric-acid 20 mL was added and stirred for 3 hours, then the aqueous layer was removed and 4% aqueous ammonia 20 mL was added to the organic layer, and after stirring for 3 hours, the aqueous layer was removed. The organic layer was added dropwise to methanol 100 mL, and stirred for 1 hour, the deposited precipitate was filtrated and dried under reduced pressure for 2 hours, and then dissolved in toluene 20 ml. Then, purification through alumina column (10 g of alumina) was carried out, and recovered toluene solution was added to methanol 100 ml, stirred for 1 hour, and deposited precipitate was filtrated and dried under reduced pressure for two hours. A polymer was obtained in yield of 220 mg. This polymer is referred to as Polymer Compound 15.

The polystyrene reduced average molecular weight of Polymer Compound 15 was Mn=$2.3\times10^5$, and Mw=$1.1\times10^6$.

Example 21

<Synthesis of Polymer Compound 16>

It was synthesized according to the procedure of Example 20, using compound J 274 mg, and N,N'-bis(4-bromophenyl)-N,N'bis(4-n-butylphenyl)-1,4-phenylenediamine 102 mg. The yield of the resultant copolymer was 50 mg. In the copolymer, the ratio of the repeating units of dibenzothiophene derivative and the amine derivative is 70:30.

This copolymer is referred to as Polymer Compound 16. The polystyrene reduced average molecular weight of Polymer Compound 16 was Mn=$8.1\times10^4$, and Mw=$5.6\times10^5$.

Example 22

<Fluorescence Characteristics>

0.2 wt % chloroform solutions of Polymer Compounds 1 to 16 were spin-coated on quartz, and thin film thereof were prepared, respectively. The fluorescence spectra of the thin films were measured using a spectrophotofluorometer (Hitachi 850). All of them had strong fluorescence and showed fluorescence peak wavelength and fluorescence intensity as shown in Table 1, respectively.

TABLE 1

| Polymer Compound | Fluorescence peak (nm) | Fluorescence intensity |
|---|---|---|
| 1 | 426 | 0.67 |
| 2 | 474 | 1.65 |
| 3 | 470 | 1.62 |
| 4 | 450 | 4.13 |
| 5 | 440 | 1.82 |
| 6 | 458 | 3.96 |
| 7 | 468 | 2.89 |
| 8 | 461 | 2.14 |
| 9 | 472 | 1.73 |
| 10 | 438 | 1.76 |
| 11 | 480 | 2.18 |
| 12 | 474 | 3.32 |
| 13 | 418 | 1.38 |
| 14 | 476 | 2.92 |
| 15 | 403 | 1.94 |
| 16 | 469 | 3.37 |

Example 23

<Device Characteristics>

On a glass substrate on which ITO film was formed in a thickness of 150 nm by sputtering method, a film was formed by a thickness of 50 nm with a spin coat using a solution (Bayer Co., Baytron P) of poly(ethylenedioxythiophene)/polystyrene sulfonic acid, and then it was dried at 200° C. for 10 minutes on a hot plate. Next, films were formed by spin-coating with a rotational speed of 800 rpms, using toluene solutions of the polymer compounds obtained above whose concentration were set to being 1.5 wt %. The film thickness was about 60 nm. Furthermore, after drying this at 80° C. under reduced pressure for 1 hour, an EL dvice was fabricated, by depositing about 4 nm of LiF as the cathode buffer layer, about 5 nm of calcium, and subsequently, about 80 nm of aluminum as the cathode. Here, after the vacuum degree reached to $1 \times 10^{-4}$ Pa or less, the deposition of metal were started.

By applying a voltage to the resultant devices, EL and the maximum EL efficiency were obtained from these devices as shown in the below Table 2. The intensity of EL light emission was approximately proportional to the current density.

TABLE 2

| Polymer Compound | EL Peak (nm) | Light Emitting Efficiency (cd/A) |
|---|---|---|
| 2 | 480 | 0.12 |
| 4 | 452 | 0.55 |
| 5 | 428 | 0.02 |
| 6 | 472 | 0.03 |
| 7 | 460 | 0.07 |
| 9 | 460 | 0.36 |
| 10 | 412 | 0.31 |
| 11 | 492 | 0.37 |
| 12 | 472 | 0.60 |
| 13 | 436 | 0.37 |
| 14 | 468 | 0.28 |
| 15 | 428 | 0.50 |
| 16 | 480 | 1.85 |

Synthetic Example 6

Synthesis of Compound K

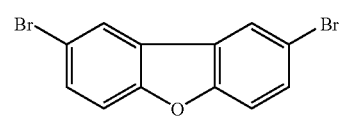

Compound K

Under an inert atmosphere, benzofuran (23.2 g, 137.9 mmol) and acetic acid (232 g) were charged into a 1L of three-necked flask. After dissolving by stirring at a room temperature, the temperature was raised to 75° C.

After the temperature rising, diluted bromine (92.6 g, 579.3 mmol) with acetic acid (54 g) was added dropwise. After the dropwise addition, it was stirred for 3 hours at the fixed temperature, and then left to cool. After checking the disappearance of raw material by TLC, aqueous sodium thiosulfate solution was added to terminate the reaction, and then, it was stirred at a room temperature for 1 hour. After the stirring, the cake was filtrated, and further washed with aqueous sodium thiosulfate, and water, and then dried. The resultant crude product was recrystallized in hexane, and the desired product was obtained. (Amount: 21.8 g, Yield 49%)

$^{1}$H-NMR(300 MHz/CDCl$_{3}$): δ 7.44 (d, 2H), 7.57 (d, 2H), 8.03 (s, 2H)

Synthetic Example 7

Synthesis of Compound L

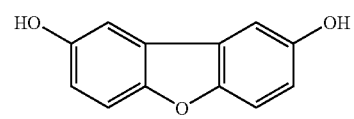

Compound L

Under an inert atmosphere, Compound K (16.6 g, 50.9 mmol) and tetrahydrofuran (293 g) were charged into a 500 ml four-necked flask, and it was cooled to −78° C. After adding dropwise n-butyllithium (80 ml<1.6 mol/L hexane solution>127.3 mmol), it was stirred for 1 hour at the fixed temperature.

Under an inert atmosphere, trimethoxyboronic acid (31.7 g, 305.5 mmol) and tetrahydrofuran (250 ml) were put into a 1000 ml four-necked flask, and cooled to −78° C., the above-mentioned reaction mixture was added dropwise thereon.

After the dropwise addition, the temperature raised slowly to a room temperature, and it was stirred at a room temperature for 2 hours, and the disappearance of the raw material was checked by TLC. The reaction mixture was charged into concentrated sulfuric acid (30 g) and water (600 ml) in a 2000 ml beaker, and the reaction was terminated. Toluene (300 ml) was added, and the organic layer was extracted, and further washed with adding water. After distilling off the solvent, 8 g of thereof and ethyl acetate (160 ml) were put into a 300 ml four-necked flask, then, 30% aqueous hydrogen peroxide (7.09 g) was added, it was stirred at 40° C. for 2 hours. This reaction mixture was washed with an aqueous solution of an ammonium iron(II) sulfate (71 g) and water (500 ml) in a 1000 ml beaker. After stirring, the organic layer was extracted, and washed with water. By distilling off the solvent, a crude product 7.57 g of Compound L was obtained.

MS spectrum [M–H]⁻ 199.0

Synthetic Example 8

Synthesis of Compound M

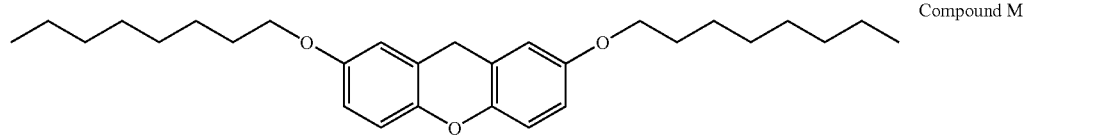

Compound M

In a 200 ml four-necked flask, under an inert atmosphere, Compound L (2.28 g, 11.4 mmol) which was synthesized according to the procedure of Synthetic Example 7 and N,N-dimethylformamide (23 g) were put in, after dissolving by stirring at a room temperature, potassium carbonate (9.45 g, 68.3 mmol) was added, and the temperature was raised to 100° C. After the temperature raising, n-octylbromide (6.60 g, 34.2 mmol) diluted with N,N-dimethylformamide (11 g) was added dropwise. After the dropwise addition, the temperature was raised to 60° C., it was stirred for 2 hours at the fixed temperature, and the disappearance of the raw material was checked by TLC. Water (50 ml) was added to terminate the reaction, and then toluene (50 ml) was added, the organic layer was extracted, and then washed with water twice. After being dried with anhydrous sodium sulfate, the solvent was distilled off. By purifying the resultant crude product with a silica gel column, the desired product was obtained. (Amount: 1.84 g, Yield: 38%)

MS spectrum: M⁺ 425.3

Example 24

Synthesis of Compound N

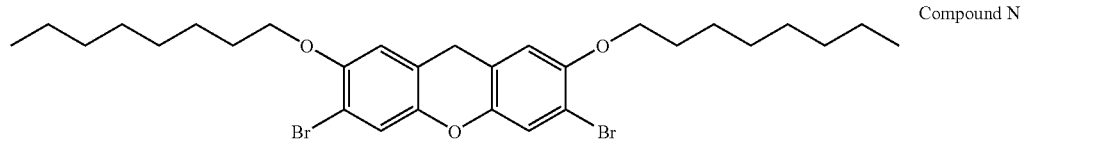

Compound N

In a 500 ml four-necked flask, under an inert atmosphere, Compound M (7.50 g, 17.7 mmol) which was synthesized according to the procedure of Synthetic Example 3 and N,N-dimethylformamide were put in, after dissolving by stirring at a room temperature, it was cooled with an ice bath. After cooling, N-bromosuccinimide (6.38 g, 35.9 mmol) diluted with N,N-dimethylformamide (225 ml) was added dropwise. After the dropwise addition, the temperature was kept cooling with an ice-bath, at a room temperature for 18.5 hours, and then raised to 40° C., and it was stirred for 6.5 hours at the fixed temperature, and the disappearance of the raw material was checked by TLC. The solvent was distilling off, and then toluene (75 ml) was added to dissolve, the organic layer was washed with water three times. After being dried with anhydrous sodium sulfate, the solvent was distilled off. By purifying a half of the resultant crude product with a silica gel column, the desired product was obtained. (Amount: 0.326 g)

¹H-NMR(300 MHz/CDCl₃) delta 0.90 (t, 6H), 1.26–1.95 (m, 24H), 4.11 (t, 4H), 7.34 (s, 2H), 7.74 (s, 2H) MS spectrum: M⁺ 582.1

Example 25

<Synthesis of Polymer Compound 17>

It was synthesized according to the procedure of Example 20, using Compound N 306 mg, N,N'-bis(4-bromophenyl)-N,N'-bis(4-n-butylphenyl)-1,4-phenylenediamine 153 mg. The yield of the resultant polymer was 110 mg. In the copolymer, the ratio of the repeating units of the dibenzofuran derivative and the amine derivative is 70:30.

This polymer is referred to as Polymer Compound 17. The polystyrene reduced average molecular weight of Polymer Compound 17 was Mn=1.3×10⁴, and Mw=6.3×10⁴.

Example 26

<Fluorescence Characteristics>

According to the procedure of Example 22, a thin-film of polymer compound 17 was formed and the fluorescent light was measured. A strong fluorescence was shown and fluorescence peak wavelength was shown at 474 nm.

Example 27

<Device Characteristics>

An EL device was fabricated according to the procedure of Example 23 using Polymer Compound 17. By applying a voltage to the resultant device, EL from this device having a peak at 468 nm was observed. The intensity of EL luminescence was approximately proportional to the current density. As for the device, the luminance exceeded 1 cd/m² at about 3.3 V, and the maximum efficiency of 1.01 cd/A was shown.

Example 28

<Synthesis of Polymer Compound 18>

It was synthesized according to the procedure of Example 20, using Compound N 285 mg, N,N'-bis(4-bromophenyl)-N,N'-bis (4-n-butyl phenyl)-1,4-phenylenediamine 48 mg, and N,N'-bis (4-bromophenyl)-4-isobutyl-aniline 64 mg. The yield of the resultant polymer was 90 mg. In the copolymer, the ratio of the repeating units of the dibenzofuran derivative and the amine derivatives is, respectively, 70:10:20 in the order of the bromo compounds described as the above.

This polymer is referred to as Polymer Compound 18. The polystyrene reduced average molecular weight of Polymer Compound 18 was Mn=2.8×10⁴, and Mw=1.7×10⁵.

Example 29
<Fluorescence Characteristics>

A thin film of Polymer Compound 18 was formed according to the procedure of Example 22. The fluorescence spectrum of this thin film was measured using a spectrophotofluorometer (Fluorolog made by JOBINYVON-SPEX Co.). A strong fluorescence was observed and fluorescence peak was shown at 458 nm.

Example 30
<Device Characteristics>

An EL device was fabricated according to the procedure of Example 23 using Polymer Compound 18. By applying a voltage to the resultant device, EL luminescence from this device having a peak at 468 nm was observed. The intensity of EL luminescence was approximately proportional to the current density. As for the device, the luminance exceeded 1 cd/m² at about 3.3 V, and the maximum efficiency of 2.96 cd/A was shown.

Example 31
<Synthesis of Polymer Compound 19>

It was synthesized according to the procedure of Example 20, using Compound N 263 mg. The yield of the resultant polymer was 50 mg.

This polymer is referred to as Polymer Compound 19. The polystyrene reduced average molecular weight of Polymer Compound 19 was Mn=8.9×10⁴, and Mw=1.9×10⁵.

Example 32
<Fluorescence Characteristics >

A thin film of Polymer Compound 19 was fabricated according to the procedure of Example 22 and the fluorescent light was measured according to the procedure of Example 29. A strong fluorescence was observed and shows fluorescence peak at 411 nm.

Example 33
<Device Characteristics>

An EL device was fabricated according to the procedure of Example 23 using Polymer Compound 19. By applying a voltage to the resultant device, EL having a peak at 456 nm was observed. The intensity of EL was approximately proportional to the current density. As for the device, the luminance exceeded 1 cd/m² at about 4.9 V, and the maximum efficiency of 0.84 cd/A was shown.

Synthetic Example 9

Synthesis of Compound P

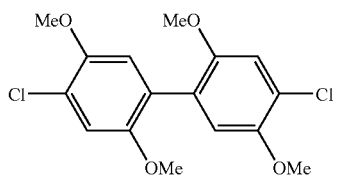

Compound P

A starting material of 2,2',5,5'-tetramethoxy-1,1'-biphenyl was synthesized from 1-bromo-2,5-dimethoxybenzene by a coupling reaction using zero-valent nickel.

Under an inert atmosphere, 2,2',5,5'-tetramethoxy-1,1'-biphenyl (7.0 g, 26 mmol) was charged into a three-necked flask, and dissolved in dehydrated N,N-dimethylformamide (100 ml). While cooling the flask by an ice bath, from a dropping funnel, N-chlorosuccinimide (6.8 g, 52 mmol) of dehydrated N,N-dimethylformamide (70 ml) solution was added dropwise for 15 minutes. After the dropwise addition, the temperature raised slowly to a room temperature with stirring slowly, and it was stirred for 1 day. Water (300 ml) was added to the reaction mixture, and the deposited precipitate was collected. The resultant precipitate was recrystallized from toluene/hexane, and the desired product was obtained. (Amount 5.8 g)

¹H-NMR(300 MHz/CDCl₃): δ 3.74 (s, 6H), 3.87 (s, 6H), 6.85 (s, 2H), 7.02 (s, 2H)

Synthetic Example 10

Synthesis of Compound Q

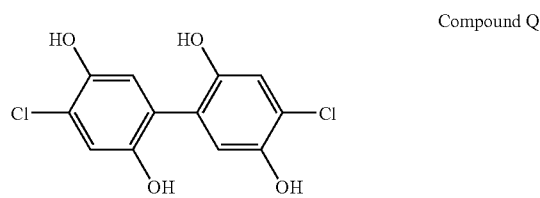

Compound Q

Under an inert atmosphere, Compound P (5.8 g, 17 mmol) was charged into a three necked flask, and dissolved in dehydrated methylene chloride (100 ml). While cooling the flask by an ice bath, methylene chloride solution (1 mol/L, 50 ml) of boron tribromide was added dropwise for 30 minutes, from a dropping funnel.

Being extracted with ethyl acetate from the reaction liquid, the organic layer was washed with water, then the solvent was distilled off and the desired product was obtained. The resultant precipitate was recrystallized from toluene/hexane, and the desired product was obtained. (Amount 4.9 g).

¹H-NMR(300 MHz/CDCl₃): δ 6.64 (s, 2H), 6.82 (s, 2H), 8.9 to 9.1 (br, 2H) and 9.37 (s, 2H)

Synthetic Example 11

Synthesis of Compound R

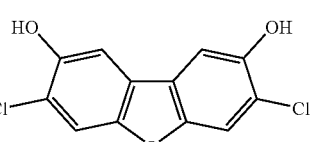

Compound R

Under an inert atmosphere, Compound Q (4.8 g, 17 mmol), zeolite (6.7 g; Zeolite HSZ 360HUA (Tosoh)) and o-dichlorobenzene (170 ml) dried with molecular sieves were charged into a three necked flask. It was stirred for 13 hours, with heating by an oil bath (180° C. of the bath temperature). The reaction mixture is cooled to about a room temperature, and hexane (200 ml) was added to it. The deposited precipitate was filtrated, washed with hexane, and dried. The precipitate was extracted with ethylacetate, and the solution was filtrated through a short column of silica gel. The solvent was distilled off, and the desired product was obtained. (Amount 3.5 g).

MS spectrum: [M−H]⁻ 267.0

93

Synthetic Example 12

Synthesis of Compound S

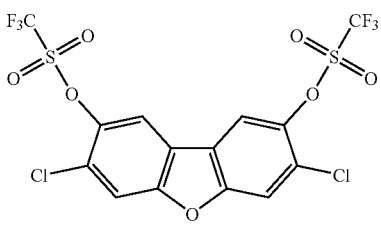

Compound S

Under an inert atmosphere, Compound R (4.2 g), and 4-N,N-dimethylaminopyridine (5.7 g) were charged into a three necked flask, and dissolved in dehydrated methylene chloride (40 ml). With cooling the flask by an ice bath, trifluoromethane sulfonic acid anhydride (11 g) was added dropwise for 30 minutes. Then, the temperature was raised slowly, to a room temperature, it was stirred for 5 hours. Toluene was added and filtrated by filter paper, the filtrate was filtrated through a silica gel short column, and the solvent was distilled off. The resultant solid was recrystallized from toluene/hexane, and the desired product was obtained. (7.6 g).

$^1$H-NMR(300 MHz/CDCl$_3$): δ 7.80 (s, 2H) and 7.93 (s, 2H)

Example 34

Synthesis of Compound T

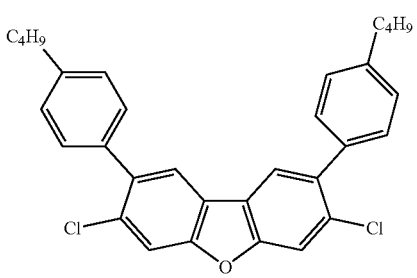

Compound T

Under an inert atmosphere, Compound S (3.9 g), 4-n-butylbenzene boric acid (3.9 g), potassium carbonate (5.1 g), and tetrakis(triphenylphosphine) palladium (0.14 g) were charged into 100 ml reaction tube, and dissolved in degassed toluene (20 ml) and water (20 ml), and then reacted at 100° C. for 12 hours. After the reaction, the toluene layer was washed with water, and filtrated thorough a silica gel short column, and the solvent was distilled off.

The resultant solid was purified through a silica gel column, and the desired product was obtained. (3.3 g).

$^1$H-NMR(300 MHz/CDCl$_3$): δ 0.97 (t, 6H), 1.42 (m, 4H), 1.67 (m, 4H), 2.69 (t, 4H), 7.28 (d, 4H), 7.39 (d, 4H), 7.70 (s, 2H), and 7.84 (s, 2H).

Example 35

<Synthesis of Polymer Compound 20>

It was synthesized according to the procedure of Example 20, using Compound T 297 mg, N,N'-bis(4-bromo phenyl)-N,N'-bis(4-n-butylphenyl)-1,4-phenylenediamine 138 mg.

The yield of the resultant polymer was 234 mg. In the copolymer, the ratio of the repeating units of the dibenzofuran derivative and the amine derivative is 70:30.

94

This polymer is referred to as Polymer Compound 20. The polystyrene reduced average molecular weight of Polymer Compound 20 was Mn=4.3×10$^3$, and Mw=8.2×10$^3$.

Synthetic Example 13

Synthesis of Compound U

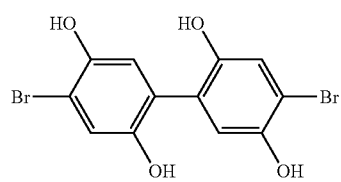

Compound U 2,2',5,5'-tetramethoxy-1,1'-biphenyl was brominated according to the procedure of Synthetic Example 9 with using N-bromosuccinimide instead of N-chlorosuccinimide, and demethylation was performed according to the procedure of Synthetic Example 10, to obtain the desired product.

$^1$H-NMR(300 MHz/CDCl$_3$): δ 6.74 (s, 2H), 6.97 (s, 2H), 8.97 (s, 2H), 9.45 (s, 2H).

Synthetic Example 14

Synthesis of Compound V

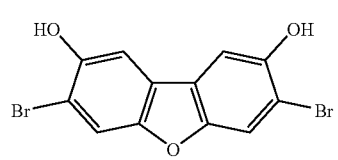

Compound V

According to the procedure of Synthetic Example 11, Compound U was used instead of Compound Q, and the desired product was obtained.

MS spectrum: [M−H]$^-$ 356.9

Example 36

Synthesis of Compound W

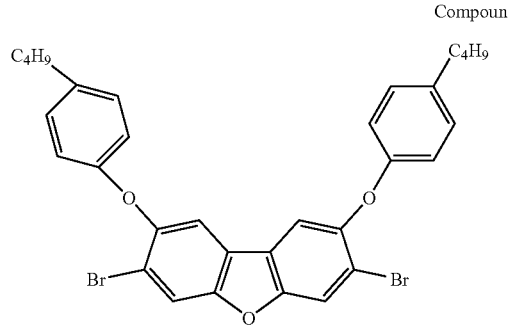

Compound W

In a three necked flask, Compound V (0.93 g), 4-butylphenylboronic acid (1.0 g), and copper(II) acetate (0.71 g) molecular sieves 4A (9.3 g, powder) and dichloromethane (31 ml) and pyridine (0.41 g) were stirred at a room temperature for 3 hours in air. The reaction mixture was filtrated through cerite, and chloroform and hydrochloric acid (1 mol/L) were added to the filtrate, the organic layer was extracted, and dried with sodium sulfate. It was purified through a silica gel column (toluene:cyclohexane=1:2), washed with hot hexane, then the desired product (white solid) was obtained. (0.52 g).

$^1$H-NMR(300 MHz/CDCl$_3$): δ 0.92 (t, 6H), 1.35 (m, 4H), 1.54 (m, 4H), 2.58 (t, 4H), 6.89 (dd, 4H), 7.12 (dd, 4H), 7.37 (s, 2H), and 7.84 (s, 2H)

Example 37

<Synthesis of Polymer Compound 21>

It was synthesized according to the procedure of Example 20, using Compound W 174 mg, N,N'-bis(4-bromophenyl)-N,N'-bis(4-n-butylphenyl)-1,4-phenylenediamine 82 mg. The yield of the resultant polymer was 95 mg. In the copolymer, the ratio of the repeating units of the dibenzofuran derivative and the amine derivative is 70:30 in the above described order of the corresponding bromo compounds. This polymer is referred to as Polymer Compound 21.

The polystyrene reduced average molecular weight of Polymer Compound 21 was Mn=1.6×10$^4$, and Mw=4.7×10$^4$.

Example 38

Synthesis of Compound X

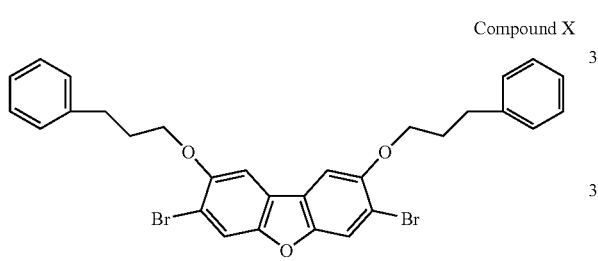

Compound X

In a three necked flask under an inert atmosphere, Compound V (2.5 g) was dissolved in N,N-dimethylformamide (54 ml). To this, 3-bromopropylbenzene (4.2 g) and potassium carbonate (4.8 g) were added, and then, the temperature was raised to 160° C., and stirred for 6 hours. Then, toluene was added to it, and washed with dilute hydrochloric acid and water. The organic layer was dried with sodium sulfate, and the solvent was distilled off. The resultant solid was purified by silica gel column chromatography using hexane/chloroform, and the desired product was obtained. (3.9 g).

$^1$H-NMR(300 MHz/CDCl$_3$): δ 2.18–2.27 (m, 4H), 2.93 (t, 4H) and 4.10 (t, 4H), 7.17 to 7.32 (m, 12H) and 7.70 (s, 2H)

Example 39

<Synthesis of Polymer Compound 22>

It was synthesized according to the procedure of Example 20, using Compound X 291 mg, N,N'-bis(4-bromophenyl)-N,N'-bis(4-n-butylphenyl)-1,4-phenylenediamine 143 mg. The yield of the resultant polymer was 120 mg. In the copolymer, the ratio of the repeating units of the dibenzofuran derivative and the amine derivative is 70:30 in the above described order of the corresponding bromo compounds.

This polymer is referred to as Polymer Compound 22. The polystyrene reduced average molecular weight of Polymer Compound 22 was Mn=3.5×10$^4$, and Mw=1.4×10$^5$.

Example 40

<Production of Polymer Compound 23>

2 mg of Polymer Compound 13, and 0.1 mg of Ir complex, Btp$_2$Ir(acac) were dissolved in 0.2 ml of toluene, and a film was formed in a thickness of about 200 nm by spin coating, and dried at a room temperature in a reduced pressure, overnight.

The fluorescence spectrum of the resultant thin film was measured, and phosphorescence emission from Ir complex was observed.

The polymer compound of the present invention having thiophene-condensed ring unit a new polymer compound which can be used as a light-emitting material, a charge transporting material, etc.

What is claimed is:

1. A polymer compound having a polystyrene reduced number average molecular weight of 10$^3$-10$^8$, and comprising a repeating unit selected from the below formulae (2-1) to (2-5),

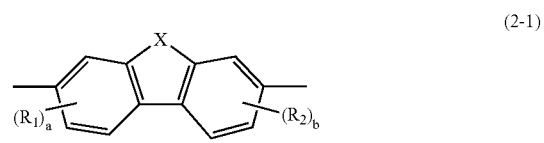

(2-1)

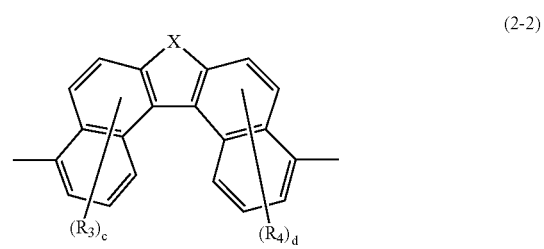

(2-2)

(2-3)

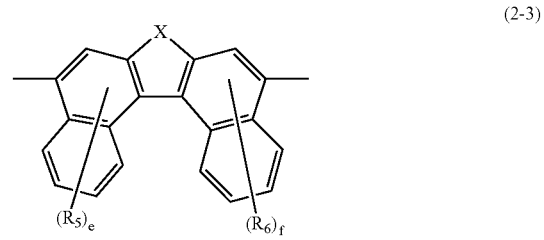

(2-4)

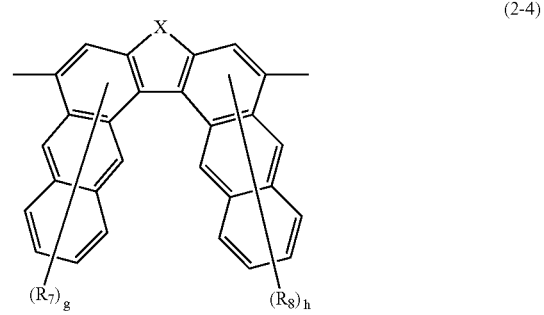

(2-5)

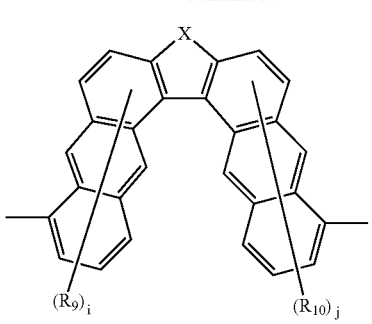

wherein, X represents S or O; $R_1$, $R_2$, $R_3$, $R_4$, $R_5$, $R_6$, $R_7$, $R_8$, $R_9$, and $R_{10}$, each independently represent an alkyl group, alkoxy group, aryl group, aryloxy group, arylalkyl group, arylalkoxy group, arylalkylthio group; a and b each independently represent an integer of 0–3; c, d, e, and f independently represent an integer of 0–5; g, h, i, and j each independently represent an integer of 0–7; and each of a+b, c+d, e+f, g+h, and i+j is one or more.

2. A polymer compound according to claim 1 wherein said polymer compound further comprises the repeating unit represented by the below formula (3), formula (4), formula (5), or formula (6), —$Ar_1$— (3)

—($Ar_2$—$X_1$)$_{ff}$—$Ar_3$— (4)

—$Ar_4$—$X_2$— (5)

—$X_3$— (6)

wherein, $Ar_1$, $Ar_2$, $Ar_3$, and $Ar_4$ each independently represent an arylene group, a divalent heterocyclic group, or a divalent group having metal-complex structure; $x_1$, $x_2$, and $X_3$ each independently represents —$CR_{11}$=$CR_{12}$—, —C≡C—, —N($R_{13}$)—, or —($SiR_{14}R_{15}$)$_k$—; $R_{11}$ and $R_{12}$ each independently represent a hydrogen atom, alkyl group, aryl group, monovalent heterocyclic group, carboxyl group, substituted carboxyl group, or cyano group; $R_{13}$, $R_{14}$, and $R_{15}$ each independently represent a hydrogen atom, alkyl group, aryl group, monovalent heterocyclic group, arylalkyl group, and substituted amino group; ff represents an integer of 0–2; k represents an integer of 1–12; when $R_{11}$, $R_{12}$, $R_{13}$, $R_{14}$, and $R_{15}$ exist in plural, respectively, a plurality of them may be the same or different.

3. A polymer compound according to claim 2, wherein the repeating unit represented by the above formula (3) is a repeating unit represented by the below formula (7), (8), (9), (10), (11), or (12), (7)

wherein, $R_{16}$ represents an alkyl group, alkoxy group, alkylthio group, aryl group, aryloxy group, arylthio group, arylalkyl group, arylalkoxy group, arylalkylthio group, aryl alkenyl group, arylalkynyl group, amino group, substituted amino group, silyl group, substituted silyl group, halogen atom, acyl group, acyloxy group, imino group, amide group, imide group, monovalent heterocyclic group, carboxyl group, substituted carboxyl group, or cyano group; l represents an integer of 0–4; when $R_{16}$ exists in plural, a plurality of them may be the same or different, (8)

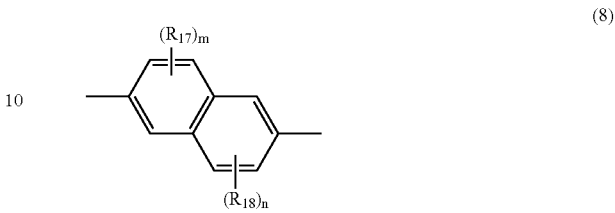

wherein, $R_{17}$ and $R_{18}$ represent each independently an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imino group, amide group, imide group, monovalent heterocyclic group, carboxyl group, substituted carboxyl group, or cyano group; m and n each independently represent an integer of 0–3; when $R_{17}$ and $R_{18}$ exist in plural, respectively, a plurality of them may be the same or different, (9)

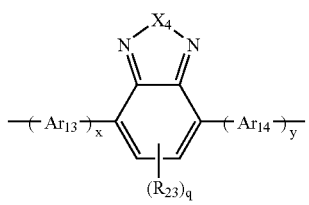

wherein, $R_{19}$ and $R_{22}$ each independently represent an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imino group, amide group, imide group, monovalent heterocyclic group, carboxyl group, substituted carboxyl group, or cyano group; o and p each independently represent an integer of 0–4; $R_{20}$ and $R_{21}$ each independently represent a hydrogen atom, alkyl group, aryl group, monovalent heterocyclic group, carboxyl group, substituted carboxyl group, or cyano group; when $R_{19}$ and $R_{22}$ exist, respectively, a plurality of them may be the same or different, (10)

wherein, $R_{23}$ represents an alkyl group, alkoxy group, alkylthio group, aryl group, aryloxy group, arylthio group, arylalkyl group, arylalkoxy group, arylalkylthio group, aryl alkenyl group, arylalkynyl group, amino group, substituted amino group, silyl group, substituted silyl group, halogen atom, acyl group, acyloxy group, imino group, amide group, imide group, monovalent heterocyclic group, carboxyl group, substituted carboxyl group, or cyano group; q represents an integer of 0–2; $Ar_{13}$ or $Ar_{14}$ each independently represent an arylene group, a divalent heterocyclic group, or a divalent group having metal-complex structure; x and y each independently represent 0 or 1;

$x_4$ represents O, S, SO, $SO_2$, Se, or Te; when $R_{23}$ exists in plural, a plurality of them may be the same or different,

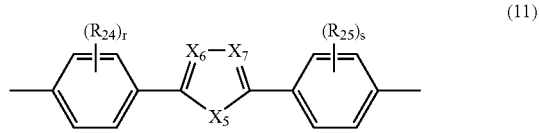

(11)

wherein, $R_{24}$ and $R_{25}$ each independently represent an alkyl group, alkoxy group, alkylthio group, aryl group, aryloxy group, arylthio group, arylalkyl group, arylalkoxy group, aryl alkylthio group, arylalkenyl group, arylalkynyl group, amino group, substituted amino group, silyl group, substituted silyl group, halogen atom, acyl group, acyloxy group, imino group, amide group, imide group, monovalent heterocyclic group, carboxyl group, substituted carboxyl group, or cyano group; r and s each independently represent an integer of 0–4; $X_5$ represents O, S, $SO_2$, Se, Te, N—$R_{26}$, or $SiR_{27}R_{28}$; $X_6$ and $X_7$ each independently represent N or C—$R_{29}$; $R_{26}$, $R_{27}$, $R_{28}$, and $R_{29}$ each independently represent a hydrogen atom, an alkyl group, an aryl group, arylalkyl group, or a monovalent heterocyclic group; when $R_{24}$, $R_{25}$, and $R_{29}$ exist in plural, respectively, a plurality of them may be the same or different,

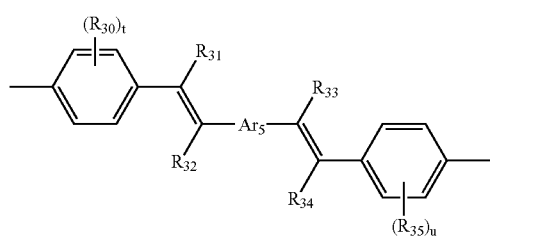

(12)

wherein, $R_{30}$ and $R_{35}$ each independently represent an alkyl group, alkoxy group, alkylthio group, aryl group, aryloxy group, arylthio group, arylalkyl group, arylalkoxy group, aryl alkylthio group, arylalkenyl group, arylalkynyl group, amino group, substituted amino group, silyl group, substituted silyl group, halogen atom, acyl group, acyloxy group, imino group, amide group, imide group, monovalent heterocyclic group, carboxyl group, substituted carboxyl group, or cyano group; t and u each independently represent an integer of 0–4; $R_{31}$, $R_{32}$, $R_{33}$, and $R_{34}$ each independently represent a hydrogen atom, alkyl group, aryl group, monovalent heterocyclic group, carboxyl group, substituted carboxyl group, or cyano group; $Ar_5$ represents an arylene group, a divalent heterocyclic group, or a divalent group having metal-complex structure; when $R_{30}$ and $R_{35}$ exist in plural, respectively, a plurality of them may be the same or different.

4. A polymer compound according to claim 2, wherein the repeating unit represented by the above formula (4) is a repeating unit represented by the below formula (13),

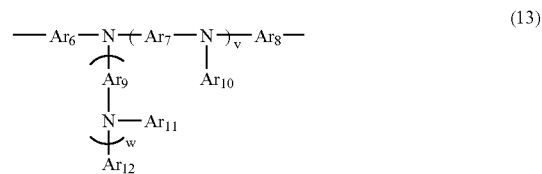

(13)

wherein, $Ar_6$, $Ar_7$, $Ar_8$, and $Ar_9$ each independently represent an arylene group or a divalent heterocyclic group; $Ar_{10}$, $Ar_{11}$, and $Ar_{12}$ each independently represent an aryl group or a monovalent heterocyclic group; $Ar_6$, $Ar_7$, $Ar_8$, $Ar_9$, and $Ar_{10}$ may have a substituent; v and w each independently represent an integer of 0 or 1, and $0<=v+w<=1$.

5. A process for producing the polymer compound according to claim 1, wherein the compound represented by the above formula (14) is a compound represented by the below formula (15-1), (15-2), (15-3), (15-4) or (155),

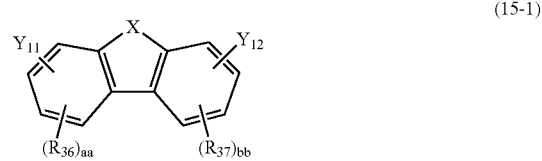

(15-1)

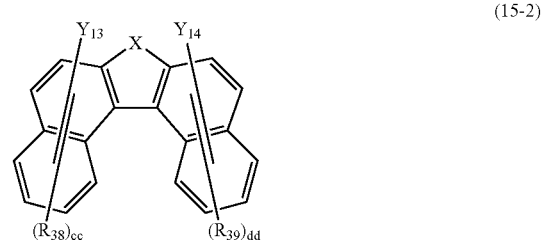

(15-2)

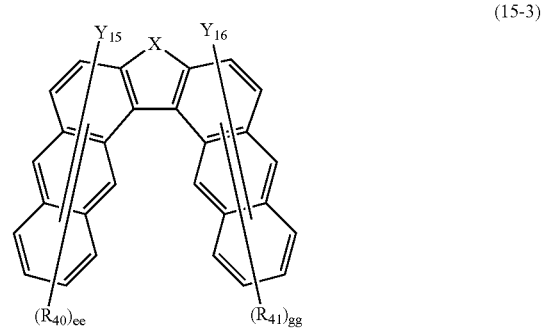

(15-3)

wherein, X represents S or O; $Y_{11}$, $Y_{12}$, $Y_{13}$, $Y_{14}$, $Y_{15}$, and $Y_{16}$ each independently represent a substituent capable of condensation polymerization; $R_{36}$, $R_{37}$, $R_{38}$, $R_{39}$, $R_{40}$, and $R_{41}$ each independently represent an alkyl group, alkoxy group, aryl group, aryloxy group, arylalkyl group, arylalkoxy group, arylalkylthio group; aa and bb each independently represent an integer of 0–3; cc and dd each independently represent an integer of 0–5; ee and gg each independently represent an integer of 0–7; each of aa+bb, cc+dd, and ee+gg is one or more; when $R_{36}$, $R_{37}$, $R_{38}$, $R_{39}$, $R_{40}$, and $R_{41}$ exist in plural, respectively, a plurality of them may be the same or different.

6. A process for producing the polymer compound according to claim 5, wherein condensation polymerization of a compound represented by one of the below formulae (16) to (19) in addition to the compound represented by the above formula (15-1), (15-2), (15-3), (15-4) or (15-5), is carried out,

 (16)

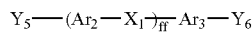 (17)

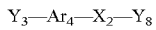 (18)

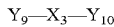 (19)

wherein, $Ar_1$, $Ar_2$, $Ar_3$, $Ar_4$, ff, $X_1$, $X_2$, and $X_3$ are the same as above; $Y_3$, $Y_4$, $Y_5$, $Y_6$, $Y_7$, $Y_8$, $Y_9$, $Y_{10}$, $Y_{11}$, $Y_{12}$, $Y_{13}$, $Y_{14}$, $Y_{15}$, $Y_{16}$, $Y_{17}$, $Y_{18}$, $Y_{19}$, and $Y_{20}$ each independently represent a substituent capable of condensation polymerization.

7. A process for producing the polymer compound according to claim 5, wherein $Y_1$, $Y_2$, $Y_3$, $Y_4$, $Y_5$, $Y_6$, $Y_7$, $Y_8$, $Y_9$, $Y_{10}$, $Y_{11}$, $Y_{12}$, $Y_{13}$, $Y_{14}$, $Y_{15}$, $Y_{16}$, $Y_{17}$, $Y_{18}$, $Y_{19}$, and $Y_{20}$ each independently represent a halogen atom, alkyl sulfonate group, aryl sulfonate group, or arylalkyl sulfonate group; and condensation polymerization is carried out under the existence of a nickel zero-valent complex.

8. A process for producing the polymer compound according claim 5, wherein $Y_1$, $Y_2$, $Y_3$, $Y_4$, $Y_5$, $Y_6$, $Y_7$, $Y_8$, $Y_9$, $Y_{10}$, $Y_{11}$, $Y_{12}$, $Y_{13}$, $Y_{14}$, $Y_{15}$, $Y_{16}$, $Y_{17}$, $Y_{18}$, $Y_{19}$, and $Y_{20}$ each independently represent a halogen atom, alkyl sulfonate group, aryl sulfonate group, arylalkyl sulfonate group, boric acid group or boric ester group;

the ratio of the total number of moles of the halogen atom, alkyl sulfonate group, aryl sulfonate group, and arylalkyl sulfonate group, to the total number of moles of boric acid group and boric ester group is substantially 1, and condensation polymerization is carried out using nickel or a palladium catalyst.

9. A polymer compound represented by the above formula (15-1), (15-2), (15-3), (15-4), or (15-5).

10. A process for producing the compound represented by the above formula (15-1), (15-2), (15-3), (15-4), or (15-5), wherein
a compound represented by the below formula (20-1), (20-2), (20-3), (20-4), OR (20-5) is reduced with using a reducing agent,

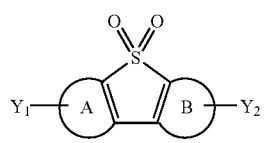 (20-1)

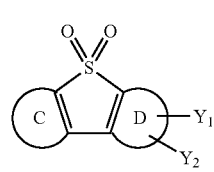 (20-2)

wherein, $Y_{11}$ to $Y_{20}$ are the same as those in formula (15-1) to (15-5).

11. A process for producing the compound represented by the above formula (15-1), (15-2), (15-3), (15-4), or (15-5), wherein
a compound represented by the below formula (21-1), (21-2), (21-3), (21-4) or (21-5) is reduced with using a reducing agent,

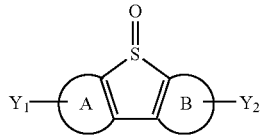 (21-1)

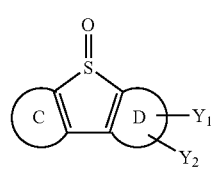 (21-2)

wherein, $Y_{11}$ to $Y_{20}$ are the same as those in formula (15-1) to (15-5).

12. A composition comprising one or more compounds selected from a hole transporting material, an electron transporting material, and light-emitting material, and one or more polymer compounds according to any one of claim 1.

13. An ink composition comprising at least one polymer compound according to any one of claim 1.

14. An ink composition according to claim 13, wherein said ink composition has a viscosity of 1 to 20 mPa·s at 25t.

15. A light emitting thin film comprising the polymer compound according to claim 1.

16. A conductive thin film comprising the polymer compound according to claim 1.

17. An organic semiconductor thin film comprising the polymer compound according to claim 1.

18. A polymer light emitting device, wherein said polymer light emitting device has an organic layer between electrodes consisting of an anode and a cathode, and said organic layer comprises the polymer compound according to claim 1.

19. A polymer light emitting device according to claim 18, wherein the organic layer is a light emitting layer.

20. A polymer light emitting device according to claim 19, wherein the light emitting layer further contains a hole transporting material, an electron transporting material, or a light-emitting material.

21. A flat light source comprising a polymer light emitting device according to claim 18.

22. A segment display apparatus comprising a polymer light emitting device according to claim 18.

23. A dot-matrix display apparatus comprising a polymer light emitting device according to claim 18.

24. A liquid crystal display comprising a light emitting device according to claim 18 as a back light.

25. A process for producing the polymer compound according to claim 2, wherein condensation polymerization is carried out using a compound represented by Formula (14) as one of the raw materials, $Y_1$—U—$Y_2$ (14)

wherein, U represents a repeating unit represented by the above formula (1-1) or (1-2); $Y_1$ and $Y_2$ each independently represent a substituent capable of condensation polymerization.

26. A process for producing the polymer compound according to claim 5, wherein condensation polymerization of a compound represented by one of the below formulae (16) to (19) in addition to the compound represented by the above formula (14), is carried out,

 (16)

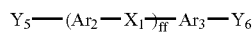 (17)

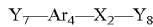 (18)

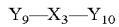 (19)

wherein, $Ar_1$, $Ar_2$, $Ar_3$, $Ar_4$, ff, $X_1$, $X_2$, and $X_3$ are the same as above; $Y_3$, $Y_4$, $Y_5$, $Y_6$, $Y_7$, $Y_8$, $Y_9$, and $Y_{10}$ each independently represent a substituent capable of condensation polymerization.

27. A process for producing the polymer compound according to claim 6, wherein $Y_1$, $Y_2$, $Y_3$, $Y_4$, $Y_5$, $Y_6$, $Y_7$, $Y_8$, $Y_9$, and $Y_{10}$ each independently represent a halogen atom, alkyl sulfonate group, aryl sulfonate group, or arylalkyl sulfonate group; and condensation polymerization is carried out under the existence of a nickel zero-valent complex.

28. A process for producing the polymer compound according to claim 6, wherein $Y_1$, $Y_2$, $Y_3$, $Y_4$, $Y_5$, $Y_6$, $Y_7$, $Y_8$, $Y_9$, and $Y_{10}$ each independently represent a halogen atom, alkyl sulfonate group, aryl sulfonate group, arylalkyl sulfonate group, boric acid group or boric ester group:

the ratio of the total number of motes of the halogen atom, alkyl sulfonate group, aryl sulfonate group, and arylalkyl sulfonate group, to the total number of moles of boric acid group and boric ester group is substantially 1, and condensation polymerization is carried out using nickel or a palladium catalyst.

29. An ink composition comprising at least one polymer compound according to claim 13.

30. An ink composition comprising at least one polymer compound according to claim 2.

31. An ink composition comprising at least one polymer compound according to claim 3.

32. An ink composition comprising at least one polymer compound according to claim 4.

33. A light emitting thin film comprising the polymer compound according to claim 2.

34. A light emitting thin film comprising the polymer compound according to claim 3.

35. A light emitting thin film comprising the polymer compound according to claim 4.

36. A conductive thin film comprising the polymer compound according to claim 2.

37. A conductive thin film comprising the polymer compound according to claim 3.

38. A conductive thin film comprising the polymer compound according to claim 4.

39. An organic semiconductor thin film comprising the polymer compound according to claim 2.

40. An organic semiconductor thin film comprising the polymer compound according to claim 3.

41. An organic semiconductor thin film comprising the polymer compound according to claim 4.

42. A polymer light emitting device, wherein said polymer light emitting device has an organic layer between electrodes consisting of an anode and a cathode, and said organic layer comprises the polymer compound according to claim 2.

43. A polymer light emitting device, wherein said polymer light emitting device has an organic layer between electrodes consisting of an anode and a cathode, and said organic layer comprises the polymer compound according to claim 3.

44. A polymer light emitting device, wherein said polymer light emitting device has an organic layer between electrodes consisting of an anode and a cathode, and said organic layer comprises the polymer compound according to claim 4.

45. A flat light source comprising a polymer light emitting device according to claim 19.

46. A segment display apparatus comprising a polymer light emitting device according to claim 19.

47. A dot-matrix display apparatus comprising a polymer light emitting device according to claim 19.

48. A liquid crystal display comprising a light emitting device according to claim 19 as a back light.

49. A process for producing the polymer compound according to claim 3, wherein condensation polymerization is carried out using a compound represented by Formula (14) as one of the raw materials,

 (14)

wherein, U represents a repeating unit represented by the above formula (1-1) or (1-2); $Y_1$ and $Y_2$ each independently represent a substituent capable of condensation polymerization.

50. A process for producing the polymer compound according to claim 4, wherein condensation polymerization is carried out using a compound represented by Formula (14) as one of the raw materials,

 (14)

wherein, U represents a repeating unit represented by the above formula (1-1) or (1-2); $Y_1$ and $Y_2$ each independently represent a substituent capable of condensation polymerization.

51. A composition comprising one or more compounds selected from a hole transporting material, an electron transporting material, and light-emitting material, and one or more polymer compounds according claim 2.

52. A composition comprising one or more compounds selected from a hole transporting material, an electron transporting material, and light-emitting material, and one or more polymer compounds according to claim 3.

53. A composition comprising one or more compounds selected from a hole transporting material, an electron transporting material, and light-emitting material, and one or more polymer compounds according to claim 4.

54. A flat light source comprising a polymer light emitting device according to claim 20.

55. A segment display apparatus comprising a polymer light emitting device according to claim 20.

56. A dot-matrix display apparatus comprising a polymer light emitting device according to claim 20.

57. A liquid crystal display comprising a light emitting device according to claim 20 as a back light.

* * * * *